(12) United States Patent
Yoda

(10) Patent No.: US 9,772,564 B2
(45) Date of Patent: Sep. 26, 2017

(54) EXPOSURE APPARATUS AND EXPOSURE METHOD, AND DEVICE MANUFACTURING METHOD

(71) Applicant: NIKON CORPORATION, Tokyo (JP)

(72) Inventor: Yasushi Yoda, Kumagaya (JP)

(73) Assignee: NIKON CORPORATION, Tokyo (JP)

(*) Notice: Subject to any disclaimer, the term of this patent is extended or adjusted under 35 U.S.C. 154(b) by 522 days.

(21) Appl. No.: 13/727,229

(22) Filed: Dec. 26, 2012

(65) Prior Publication Data

US 2014/0132940 A1   May 15, 2014

(30) Foreign Application Priority Data

Nov. 12, 2012 (JP) ................................. 2012-248374

(51) Int. Cl.
*G03B 27/42* (2006.01)
*G03B 27/58* (2006.01)
*G03F 7/20* (2006.01)

(52) U.S. Cl.
CPC ........ *G03F 7/70775* (2013.01); *G03F 7/7085* (2013.01); *G03F 7/70133* (2013.01); *G03F 7/70725* (2013.01); *G03F 7/70733* (2013.01)

(58) Field of Classification Search
CPC ............. G03F 7/70133; G03F 7/70733; G03F 7/7075; G03F 7/70758; G03F 7/70775;
(Continued)

(56) References Cited

U.S. PATENT DOCUMENTS 4,465,368 A   8/1984   Matsuura et al.
4,558,949 A   12/1985  Uehara et al.
(Continued)

FOREIGN PATENT DOCUMENTS

EP   1 079 223 A1   2/2001
JP   2003-224059 A  8/2003
(Continued)

OTHER PUBLICATIONS

International Search Report issued in International Application No. PCT/JP2012/084312 mailed Dec. 5, 2013.
(Continued)

*Primary Examiner* — Christina Riddle
(74) *Attorney, Agent, or Firm* — Oliff PLC

(57) ABSTRACT

An exposure apparatus is equipped with a first and second stage that are movable independently from each other within a predetermined plane and each have a table with a grating positioned under a surface where a wafer is mounted, and a third stage that is movable independently from the first and second stages within a predetermined plane and includes a light-receiving plane that receives an energy beam via an optical system. An optical member is provided that is at least a part of a measurement device, which performs a measurement related to exposure based on a light-receiving result of the energy beam received via the light-receiving plane. In an exposure station and measurement station, a first and second measurement system are respectively provided that measure the position of the tables by irradiating the grating of the first or second stage from below with a measurement beam.

20 Claims, 24 Drawing Sheets

(58) Field of Classification Search
CPC ............... G03F 7/70833; G03F 7/7085; G03F 7/70716; G03F 7/70725; G03F 9/7003; G03F 9/7073; G03F 9/7015
USPC .... 355/52, 53, 55, 72–77; 250/492.1, 492.2, 250/492.22, 493.1, 548; 356/399–401; 430/5, 8, 22, 30, 311, 312, 321
See application file for complete search history.

(56) References Cited

U.S. PATENT DOCUMENTS

| | | | |
|---|---|---|---|
| 4,780,617 A | 10/1988 | Umatate et al. | |
| 5,196,745 A | 3/1993 | Trumper | |
| 5,448,332 A | 9/1995 | Sakakibara et al. | |
| 5,610,715 A | 3/1997 | Yoshii et al. | |
| 5,666,038 A * | 9/1997 | Ohishi | 318/625 |
| 6,509,957 B1 * | 1/2003 | Tanaka | 355/72 |
| 6,611,316 B2 | 8/2003 | Sewell | |
| 6,778,257 B2 | 8/2004 | Bleeker et al. | |
| 6,897,963 B1 * | 5/2005 | Taniguchi | G03F 7/70716 356/500 |
| 7,023,610 B2 | 4/2006 | Ohtsuki et al. | |
| 7,561,280 B2 | 7/2009 | Schluchter et al. | |
| 7,839,485 B2 | 11/2010 | Shibazaki | |
| 2002/0041377 A1 | 4/2002 | Hagiwara et al. | |
| 2002/0061469 A1 | 5/2002 | Tanaka | |
| 2003/0025890 A1 | 2/2003 | Nishinaga | |
| 2003/0142321 A1 | 7/2003 | Hattori | |
| 2005/0219486 A1 * | 10/2005 | Korenaga et al. | 355/53 |
| 2006/0101928 A1 | 5/2006 | Binnard et al. | |
| 2006/0114445 A1 | 6/2006 | Ebihara | |
| 2006/0227309 A1 | 10/2006 | Loopstra et al. | |
| 2007/0127006 A1 * | 6/2007 | Shibazaki | 355/72 |
| 2007/0288121 A1 | 12/2007 | Shibazaki | |
| 2008/0088843 A1 | 4/2008 | Shibazaki | |
| 2008/0094594 A1 | 4/2008 | Shibazaki | |
| 2009/0079951 A1 | 3/2009 | Modderman | |
| 2009/0115982 A1 * | 5/2009 | Kanaya | 355/53 |
| 2009/0233234 A1 | 9/2009 | Shibazaki | |
| 2009/0268178 A1 * | 10/2009 | Shibazaki | 355/53 |
| 2010/0073652 A1 | 3/2010 | Shibazaki | |
| 2010/0073653 A1 | 3/2010 | Shibazaki | |
| 2010/0081095 A1 | 4/2010 | Shibazaki | |
| 2010/0157274 A1 | 6/2010 | Shibazaki | |
| 2010/0157275 A1 | 6/2010 | Shibazaki | |
| 2010/0157276 A1 * | 6/2010 | Shibazaki | 355/72 |
| 2010/0159403 A1 | 6/2010 | Shibazaki | |
| 2010/0296070 A1 | 11/2010 | Shibazaki | |
| 2010/0296071 A1 | 11/2010 | Shibazaki | |
| 2010/0297562 A1 | 11/2010 | Shibazaki | |
| 2011/0051108 A1 | 3/2011 | Shibazaki | |
| 2011/0096318 A1 * | 4/2011 | Yoshimoto | 355/72 |
| 2011/0164238 A1 * | 7/2011 | Yoshimoto | 355/72 |
| 2011/0177461 A1 | 7/2011 | Shibazaki et al. | |

FOREIGN PATENT DOCUMENTS

| | | |
|---|---|---|
| JP | 2005-259738 A | 9/2005 |
| JP | 2011-199317 A | 10/2011 |
| JP | 2012-216870 A | 11/2012 |
| WO | WO 99/60361 A1 | 11/1999 |
| WO | WO 01/35168 A1 | 5/2001 |
| WO | WO 03/065428 A1 | 8/2003 |
| WO | WO 2004/090577 A2 | 10/2004 |
| WO | WO 2006/038952 A2 | 4/2006 |
| WO | WO 2011/024983 A1 | 3/2011 |
| WO | WO 2011/037276 A1 | 3/2011 |
| WO | WO 2011/068254 A1 | 6/2011 |
| WO | WO 2011/081215 A1 | 7/2011 |

OTHER PUBLICATIONS

Written Opinion of the International Searching Authority issued in International Application No. PCT/JP2012/084312 mailed Dec. 5, 2013.
May 6, 2016 Extended European Search Report issued in European Patent Application No. 16150167.1.
Jun. 21, 2016 Office Action issued in Japanese Patent Application No. 2015-541306.
Mar. 28, 2017 Office Action issued in Japanese Patent Application No. 2015-541306.
Dec. 9, 2016 Office Action issued in Taiwanese Patent Application No. 101150753.

* cited by examiner

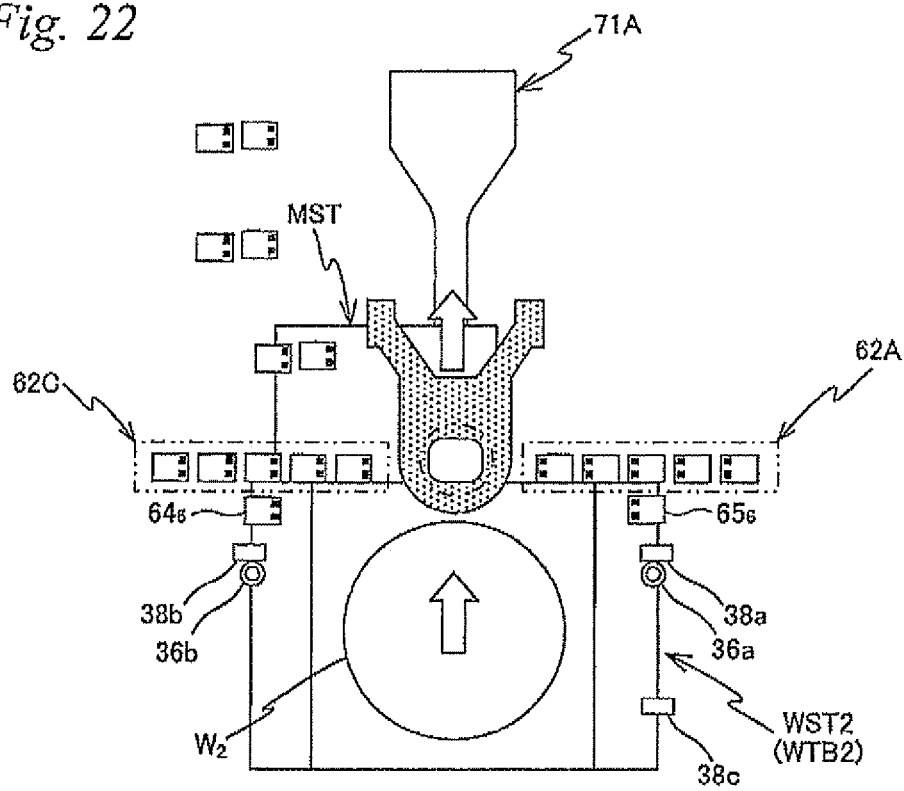
Fig. 22
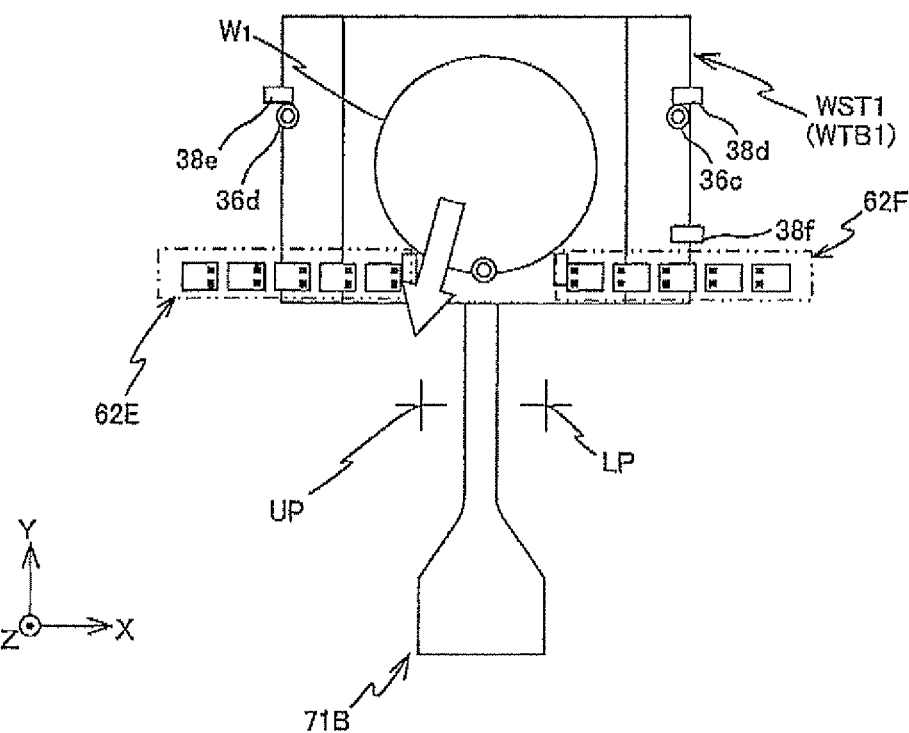

EXPOSURE APPARATUS AND EXPOSURE METHOD, AND DEVICE MANUFACTURING METHOD

BACKGROUND OF THE INVENTION

1. Field of the Invention

The present invention relates to exposure apparatuses, exposure methods and device manufacturing methods, and more particularly to an exposure apparatus and an exposure method used in a lithography process to manufacture electron devices (microdevices), and a device manufacturing method using the exposure apparatus or the exposure method.

2. Description of the Background Art

Conventionally, in a lithography process to manufacture electron devices (microdevices) such as a semiconductor device (an integrated circuit and the like), a liquid crystal display device and the like, a projection exposure apparatus employing a step-and-repeat method (a so-called stepper), or a projection exposure apparatus employing a step-and-scan method (so-called scanning stepper (also called a scanner)) is mainly used.

In this type of exposure apparatus, in general, a position of a wafer stage which moves two-dimensionally while holding a substrate such as a wafer or a glass plate or the like (hereinafter collectively called a wafer) on which a pattern is transferred (or formed) was measured, using a laser interferometer. However, due to finer patterns accompanying higher integration of semiconductor devices in recent years, requirements for position control performance of a wafer stage with higher accuracy have increased, and as a consequence, it has become difficult to ignore short-term variation of measurement values caused by air fluctuation which occurs due to the influence of temperature change and/or temperature gradient of the atmosphere on the beam path of a laser interferometer.

To improve such inconveniences, various proposals have been made of inventions related to exposure apparatuses that employ an encoder having a measurement resolution of the same level as or a higher level than a laser interferometer, as a position measurement device of a wafer stage (for example, refer to U.S. Patent Application Publication No. 2008/0088843). However, in the liquid immersion exposure apparatus disclosed in U.S. Patent Application Publication No. 2008/0088843 and the like, for example, the wafer stage (gratings provided on the upper surface of the wafer stage) may be deformed influenced by heat of vaporization and the like due to the liquid evaporating, and there still was room for improvement.

As an exposure apparatus to improve such inconveniences, an exposure apparatus has been known in which an exposure station where exposure of a wafer is performed and a measurement station where measurement operations such as wafer alignment are performed are each equipped with an encoder system which irradiates a measurement beam on a grating provided on a rear surface of a table that holds a wafer, from a head section provided at the tip of a measurement arm made up of a cantilever for example, refer to U.S. Patent Application Publication No. 2010/0296070).

However, in the exposure apparatus disclosed in U.S. Patent Application Publication No. 2010/0296070, a structure is employed in which, for example, a fine movement stage (wafer table) that holds a wafer is exchanged between two coarse movement stages via an intermediate member (for example, a center table, a relay stage, or the like). Therefore, there is a risk that such wafer exchange causes decrease in throughput of the apparatus. The wafer size is gradually increasing, and in the impending era of a 450 mm-wafer with a diameter of 450 mm, it is expected that further improvement in throughput is required, and accordingly it becomes difficult to cope with such requirement with the table exchange method as described above.

SUMMARY OF THE INVENTION

According to a first aspect of the present invention, there is provided a first exposure apparatus that exposes an object by an energy beam via an optical system, the apparatus comprising: a first moving member and a second moving member that each hold the object and are movable independently from each other in an area within a predetermined plane, and each have a first grating provided at a position under a surface where the object is mounted, the area including an exposure station where exposure of the object by the energy beam is performed and a measurement station which is placed away from the exposure station in a first direction parallel to the predetermined plane and where a predetermined measurement on the object is performed; a first measurement system that is provided at the exposure station, has a first measurement member with the first direction serving as a longitudinal direction, and by irradiating from below a first measurement beam from the first measurement member onto the first grating of a moving member located at the exposure station, of the first and the second moving members, measures first position information of the moving member located at the exposure station; a second measurement system that is provided at the measurement station, has a second measurement member with the first direction serving as a longitudinal direction, and by irradiating from below a second measurement beam from the second measurement member onto the first grating of a moving member located at the measurement station, of the first and the second moving members, measures second position information of the moving member located at the measurement station; a third moving member which is movable independently from the first and the second moving members within the predetermined plane and includes a light-receiving plane that receives the energy beam via the optical system, and at which an optical member that is at least a part of a measurement device that performs a measurement related to exposure based on a light-receiving result of the energy beam received via the light-receiving plane is provided; and a drive system that individually drives the first, the second and the third moving members.

According to this apparatus, the drive system individually drives the first, the second and the third moving members, and for example, when one of the first moving member and the second moving member that holds the object that has undergone exposure is moved apart from the exposure station and the other of the first moving member and the second moving member that holds an object on which a predetermined measurement has been performed in the measurement station is located between the measurement station and the exposure station, the third moving member is moved to under the optical system. Accordingly, during a period after the exposure of the object held by the one of the moving members has been completed until exposure of the object held by the other moving member is started, measurement related to exposure can be performed in the exposure station by the measurement device based on the light-receiving result of the energy beam received via the light-receiving plane. This allows necessary measurement related to exposure to be performed using the movement time (and/or waiting time) of the first and the second moving members in between exposures. Therefore, the necessary measurement related to exposure can be performed without reducing the throughput.

According to a second aspect of the present invention, there is provided a device manufacturing method, comprising: exposing an object using the first exposure apparatus described above; and developing the object that has been exposed.

According to a third aspect of the present invention, there is provided a second exposure apparatus that exposes a substrate via an optical system, the apparatus comprising: a first stage and a second stage, each of which has a holding member that has a mounting area of the substrate provided on an upper surface side and a first grating member provided on a lower surface side, and a main section that supports the holding member so that a space is formed under the first grating member; a third stage different from the first and the second stages, that is placed at an exposure station where exposure of the substrate is performed via the optical system; a detection system placed at a measurement station different from the exposure station, that detects position information of the substrate by irradiating the substrate with a detection beam; a drive system that moves the first, the second and the third stages, and also moves each of the first and the second stages from one of the exposure station and the measurement station to the other; a first measurement system that has a first head section provided at the exposure station and a second head section provided at the measurement station, and that irradiates the first grating member with a first measurement beam from below via the first head section that is placed in the space by one of the first and the second stages placed at the exposure station being positioned facing the optical system and measures position information of the one of the stages, and also irradiates the first grating member with a first measurement beam from below via the second head section that is placed in the space by the other of the first and the second stages placed at the measurement station being positioned facing the detection system and measures position information of the other of the stages; and a controller that controls drive of the first and the second stages by the drive system, based on the position information measured by the first measurement system, in order to move each of the first and the second stages in the exposure station and in the measurement station, wherein the controller moves each of the first and the second stages from one of the exposure station and the measurement station to the other using the drive system so that instead of one of the first and the second head sections placed in the space, the other of the first and the second head sections is placed in the space.

According to this apparatus, the controller moves each of the first and the second stages by the drive system from one of the exposure station and the measurement station to the other so that in replacement of one of the first and the second heads placed in the space, the other of the first and the second heads is placed.

According to a fourth aspect of the present invention, there is provided a device manufacturing method, comprising: exposing a substrate using the second exposure apparatus described above; and developing the substrate that has been exposed.

According to a fifth aspect of the present invention, there is provided an exposure method of exposing a substrate via an optical system, the method comprising: positioning one of a first stage and a second stage to face the optical system in an exposure station, each of the first stage and the second stage having a holding member that has a mounting area of the substrate provided on an upper surface side and a first grating member provided on a lower surface side, and a main section that supports the holding member so that a space is formed under the first grating member, and in the exposure station a third stage different from the first and the second stages being placed and exposure of the substrate being performed via the optical system; measuring position information of the one of the stages by a first measurement system that irradiates the first grating member with a first measurement beam from below via a first head section placed in the space of the one of the stages positioned facing the optical system, in order to move the one of the stages in the exposure station; measuring position information of the other of the stages by the first measurement system that irradiates the first grating member with a first measurement beam from below via a second had section placed in the space of the other of the stages positioned facing a detection system that detects position information of the substrate by irradiating the substrate with a detection beam, in order to move the other of the stages in a measurement station which is different from the exposure station and where the detection system is placed; and moving the other of the stages to cause the first head section to proceed inside the space, following movement of the one of the stages to withdraw the first head section from inside the space, so that instead of the one of the stages, the other of the stages that is moved from the measurement station to the exposure station is positioned facing the optical system.

According to a sixth aspect of the present invention, there is provided a device manufacturing method, comprising: exposing a substrate using the exposure method described above; and developing the substrate that has been exposed.

BRIEF DESCRIPTION OF DRAWINGS

In the accompanying drawings;

FIG. 22 is a view (No; 2) used to describe a concurrent processing operation using wafer stages WST1 and WST2 and measurement stage MST performed in the exposure apparatus related to the modified example;

DESCRIPTION OF EMBODIMENTS

Hereinafter, an embodiment will be described, based on FIGS. 1 to 20.

Figure 1:
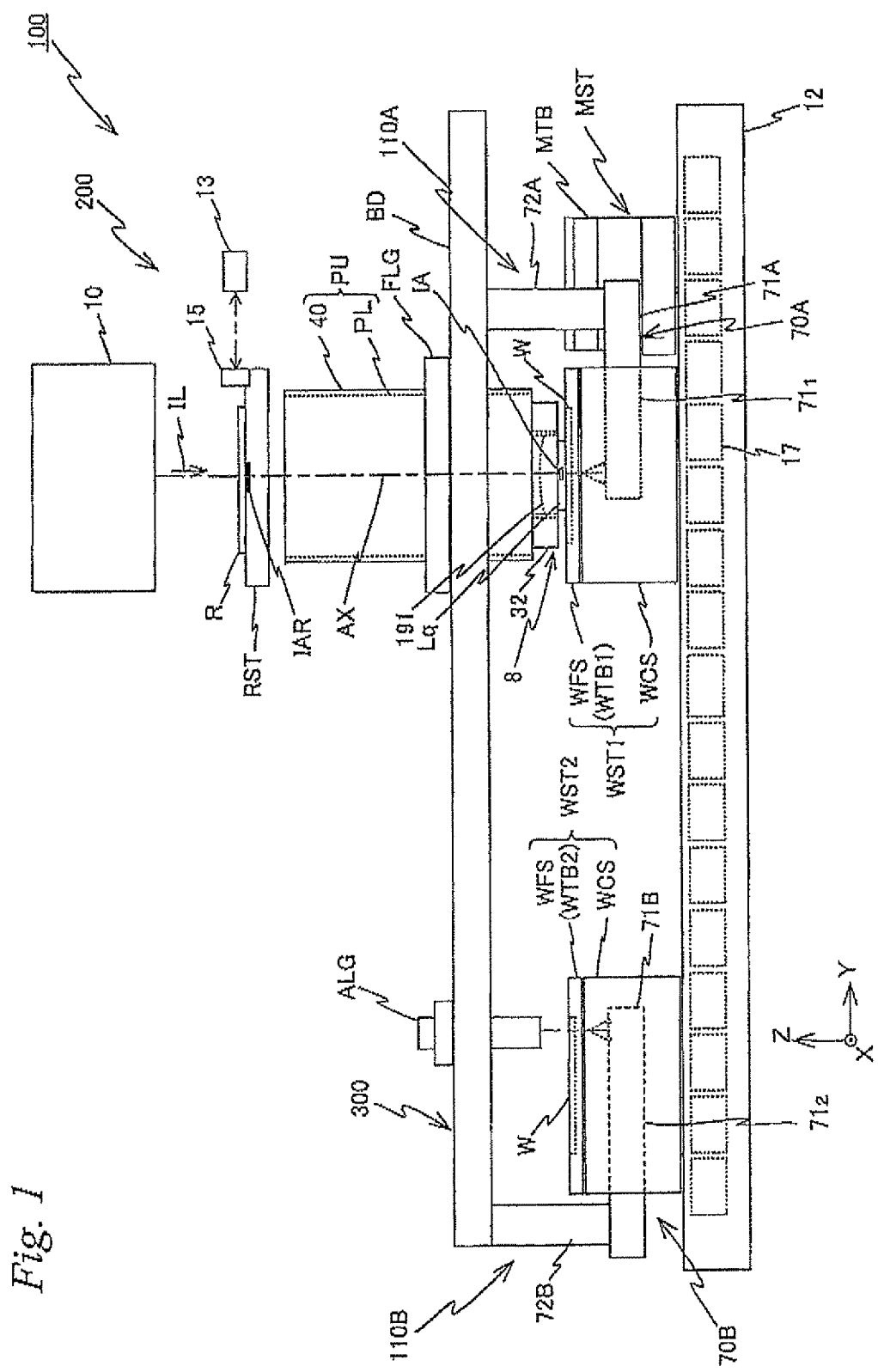
FIG. 1 is a view schematically showing a structure of an exposure apparatus related to an embodiment.
Figure 2:
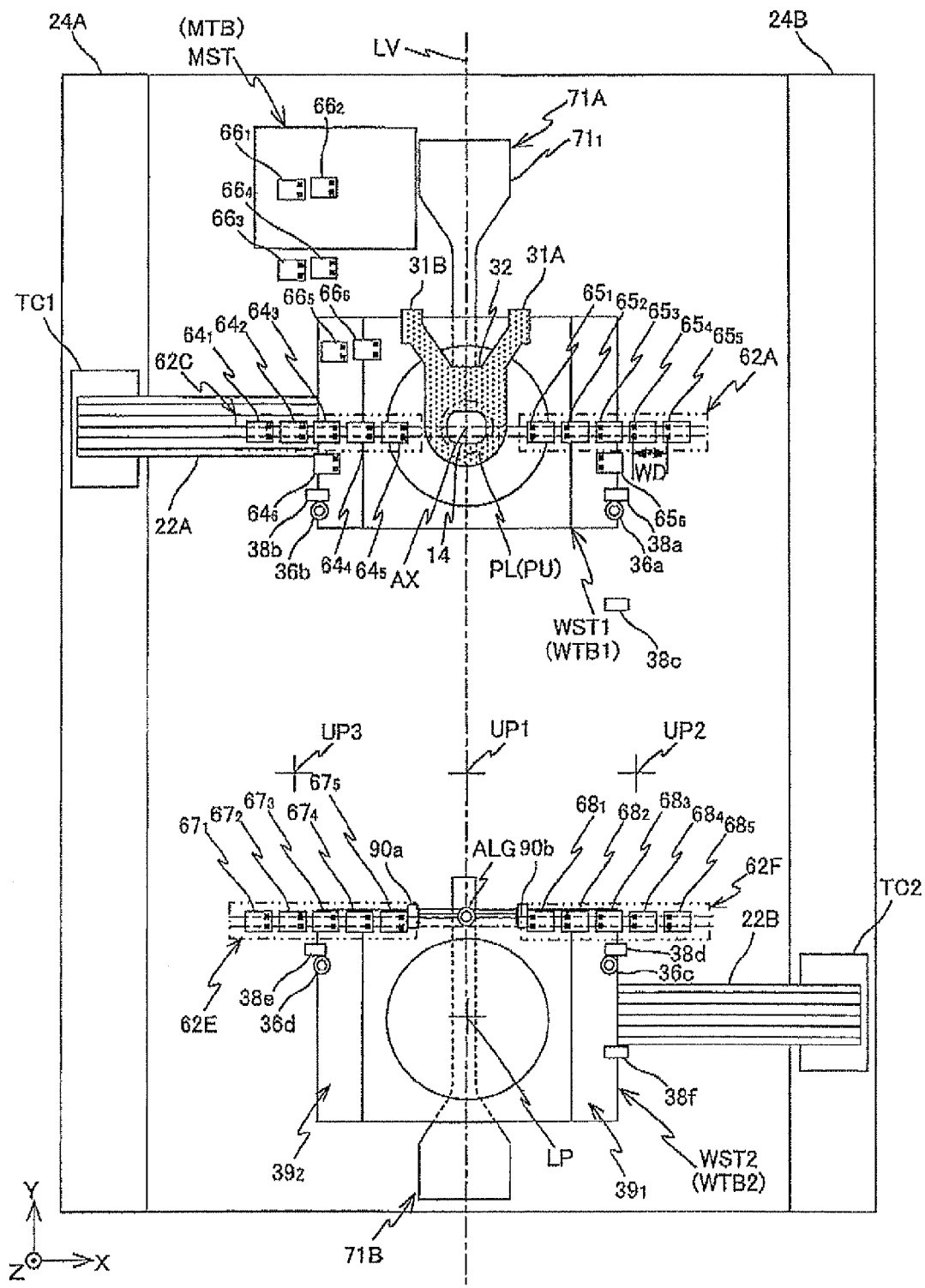
FIG. 2 is a schematic plan view of the exposure apparatus in FIG. 1.

FIG. 1 schematically shows a structure of an exposure apparatus 100 related to the embodiment. FIG. 2 shows a schematic plan view of exposure apparatus 100. Exposure apparatus 100 is a projection exposure apparatus employing a step-and-scan method, which is a so-called scanner. As it will be described later on, in the present embodiment, a projection optical system PL is provided, and hereinafter, the description will be made with a direction parallel to an optical axis AX of this projection optical system PL referred to as a Z-axis direction (Z direction), a direction in which a reticle and a wafer are relatively scanned within a plane orthogonal to the Z-axis direction referred to as a Y-axis direction (Y direction), and a direction orthogonal to the Z-axis and the Y-axis referred to as an X-axis direction (X direction), and rotation (tilt) directions around the X-axis, the Y-axis, and the Z-axis referred to as θx, θy, and θz directions, respectively.

Exposure apparatus 100, as shown in FIG. 1, is equipped with an exposure section 200 placed near the edge on the +Y side on a base board 12, a measurement section 300 placed near the edge on the −Y side on base board 12, two wafer stages WST1 and WST2 and a measurement stage MST which move two-dimensionally within an XY-plane independently from one another on base board 12, a control system for these sections, and the like.

In the description below, for the sake of convenience, as the terms to indicate each place of exposure section 200 and measurement section 300, the places will be called exposure station 200 and measurement station 300, using the same reference signs.

Base board 12 is supported in a substantially horizontal manner (parallel to the XY-plane) on a floor surface by a vibration-proof mechanism (omitted in the drawings). Base board 12 is made up of a member having a flat plate outer shape. Incidentally, in FIG. 1, wafer stage WST1 is positioned at exposure station 200 and wafer stage WST2 is positioned at measurement station 300, and a wafer W is held on each of wafer stages WST1 and WST2 (to be more specific, on a wafer table to be described later on). Further, measurement stage MST is positioned in exposure station 200 or in the vicinity of exposure station 200. Measurement stage MST is positioned at a predetermined position (withdrawal position or standby position) that is set apart from a position below projection optical system PL so that measurement stage MST does not come into contact with wafer stages WST2 and WST2 that are moved below projection optical system PL during an exposure operation of wafer W in which wafer stages WST1 and WST2 are each used. Further, prior to completion of the exposure operation of wafer W, measurement stage MST is moved relative to one of wafer stages WST1 and WST2 that is moved below projection optical system PL to approach the one of wafer stages WST1 and WST2, and at the time of the completion of the exposure operation at the latest, the one of the wafer stages and measurement state MST are positioned in proximity to (or contact with) each other. Moreover, the one of the stages and measurement stages MST in proximity to each other are moved with respect to projection optical system PL, and measurement stage MST is placed facing projection optical system PL instead of the one of the wafer stages. Incidentally, it is also possible that at least a part of the relative movement to position the one of the wafer stages and measurement stage MST in proximity is performed after the exposure operation of wafer W.

Exposure section 200 is equipped with an illumination system 10, a reticle stage RST, a projection unit PU, a local liquid immersion device 8 and the like.

Illumination system 10, as disclosed in, for example, U.S. Patent Application Publication No. 2003/0025890 and the like, includes a light source; and an illumination optical system which has an illuminance equalizing optical system including an optical integrator and the like, and a reticle blind and the like (none of which are shown). Illumination system 10 illuminates a slit-shaped illumination area IAR on a reticle R set (limited) by a reticle blind (also called a masking system) with illumination light (exposure light) IL at a substantially equal illuminance. Here, as illumination light IL, as an example, an ArF excimer laser beam (wavelength 193 nm) is used.

On reticle stage RST, reticle R that has a circuit pattern and the like formed on its pattern surface (the lower surface in FIG. 1) is fixed, for example, by vacuum chucking. Reticle stage RST is finely drivable within the XY-plane and is also drivable in a scanning direction (the Y-axis direction, which is the lateral direction of the page surface of FIG. 1) at a predetermined scanning velocity, by a reticle stage driving system 11 (not shown in FIG. 1, refer to FIG. 6) including, for example, a linear motor and the like.

Position information within the XY-plane (including rotational information in the θz direction) of reticle stage RST is constantly detected, using a reticle laser interferometer (hereinafter referred to as a "reticle interferometer") 13 via a movable mirror 15 (a Y movable mirror (or a retroreflector) having a reflection surface orthogonal to the Y-axis direction and an X movable mirror having a reflection surface orthogonal to the X-axis direction are actually provided) fixed to reticle stage RST, at a resolution of, for example, around 0.25 nm. Measurement values of reticle interferometer 13 are sent to a main controller 20 (not shown in FIG. 1, refer to FIG. 6). Incidentally, the position information of reticule stage RST can be measured using an encoder system disclosed in, for example, U.S. Pat. No. 7,839,485 and the like, instead of reticle interferometer 13. In this case, one of a grating member (a scale plate, or a grid plate) where a grating is formed and an encoder head can be provided on a lower surface side of reticle stage RST and the other can be placed under reticle stage RST, or one of the grating member and the encoder head can be provided on an upper surface side of reticle stage RST and the other can be placed above reticle stage RST. Further, reticle stage RST can employ a coarse-fine movement structure similar to wafer stage WST to be described later on.

Projection unit PU is placed below reticle stage RST in FIG. 1. Projection unit PU is supported by a main frame (metrology frame) BD, which is supported horizontally by a support member not shown, via a flange section FLG provided on the outer circumference portion of the projection unit. Main frame BD structures a part of a main body frame of exposure apparatus 100 where at least a part of the illumination optical system and reticle stage RST are mounted, and in the present embodiment, main frame BD is supported by a plurality of (for example, three or four) support members (not shown) placed on a installation surface (for example, a floor surface or the like) each via a vibration-proof mechanism. Incidentally, on the installation surface, based board 12 to be described late on and the like are also placed. Further, the vibration-proof mechanism can be placed between each support member and main framed BD. Furthermore, as disclosed in, for example, PCT International Publication No. 2006/038952, projection unit PU can be supported in a suspended manner with respect to a part of the main body frame placed above projection unit PU.

Projection unit PU includes a barrel 40, and projection optical system PL held within barrel 40. As projection optical system PL, for example, a dioptric system is used that is made up of a plurality of optical elements (lens elements) disposed along optical axis AX parallel to the Z-axis. Projection optical system PL, for example, is telecentric on both sides, and has a predetermined projection magnification (e.g., ¼, ⅕, or ⅛ or the like). Therefore, when illumination area IAR on reticle R is illuminated by illumination light IL from illumination system 10, by illumination light IL which passes through reticle R placed so that a first plane (object plane) of projection optical system PL and the pattern surface are substantially coincident, a reduced image of a circuit pattern (a reduced image of part of a circuit pattern) within illumination area TAR of reticle R is formed via projection optical system PL (projection unit PU), in an area (hereinafter also referred to as an exposure area) IA, conjugate to illumination area IAR, on wafer W which is placed on a second plane (image plane) side of projection optical system PL and whose surface is coated with a resist (sensitive agent). And, by synchronously driving reticle stage RST and wafer stage WST1 or WST2 (to be more accurate, a fine movement stage WFS to be described later holding wafer W), reticle R is relatively moved in the scanning direction (Y-axis direction) with respect to illumination area IAR (illumination light IL), while wafer W is relatively moved in the scanning direction (Y-axis direction) with respect to exposure area IA (illumination light IL), and thereby scanning exposure of a shot area (divided area) on wafer W is performed and the pattern of reticle R is transferred onto the shot area. That is, in the present embodiment, the pattern of reticle R is generated on wafer W using illumination system 10 and projection optical system PL, and the pattern is formed on wafer W by exposing a sensitive layer (resist layer) on wafer W with illumination light IL.

Local liquid immersion device 8 is provided, corresponding to exposure apparatus 100 performing exposure based on a liquid immersion method. Local liquid immersion device 8 includes a liquid supply device 5, a liquid recovery device 6 (none of which are shown in FIG. 1, refer to FIG. 6), a nozzle unit 32 and the like. Nozzle unit 32, as shown in FIG. 1, is supported in a suspended manner by main frame BD supporting projection unit PU and the like, via a support member not shown, and surrounds the periphery of the lower end section of barrel 40 holding an optical element which structures projection optical system PL closest to the image plane side (wafer W side), in this case, a lens (also referred to as a "tip lens" or "final lens") 191. Nozzle unit 32 is equipped with a supply port and a recovery port of a liquid Lq, a lower surface where wafer W faces and in which a recovery port is provided, a liquid supply pipe 31A and a liquid recovery pipe 31B (none of which are shown in FIG. 1, refer to FIG. 2) and a supply passage and a recovery passage connected to the pipes, respectively. Liquid supply pipe 31A is connected to one end of a supply pipe which is not shown whose other end is connected to liquid supply device 5 (not shown in FIG. 1, refer to FIG. 6), and liquid recovery pipe 31B is connected to one end of a recovery pipe which is not shown whose other end is connected to liquid recovery device 6 (not shown in FIG. 1, refer to FIG. 6). Further, nozzle unit 32 has the supply passage and the recovery passage inside, and liquid supply pipe 31A and liquid recovery pipe 31B are connected to the supply port and the recovery port via the supply passage and the recovery passage, respectively. Further, nozzle unit 32 has an opening section, through which illumination light IL emitted from projection optical system PL passes, in its lower surface, and the recovery port is placed in the periphery of the opening section. While, in the present embodiment, the supply port is provided on an inner side surface of nozzle unit 32 that surrounds the tip lens, another supply port can be provided separately from the supply port, on an inner side than the recovery port with respect to the opening section on a lower surface side of nozzle unit 32.

In the present embodiment, main controller 20 controls liquid supply device 5 (refer to FIG. 6) and supplies liquid to between tip lens 191 and wafer W via liquid supply pipe 31A and nozzle unit 32, and also controls liquid recovery device 6 (refer to FIG. 6) and recovers liquid from between tip lens 191 and wafer W via nozzle unit 32 and liquid recovery pipe 31B. On this operation, main controller 20 controls liquid supply device 5 and liquid recovery device 6 so that the amount of the liquid supplied and the amount of the liquid recovered are constantly equal. Accordingly, a fixed quantity of liquid Lq (refer to FIG. 1) is constantly replaced and held between tip lens 191 and wafer W. Local liquid immersion device 8 forms a liquid immersion area under projection optical system PL by liquid Lq that local liquid immersion device 8 supplies via nozzle unit 32, and also can hold liquid Lq only at a part of wafer W by recovering the liquid from the liquid immersion area via nozzle unit 32, that is, can form the liquid immersion area by confining liquid Lq within a local area that is smaller than the upper surface of wafer stage WST1 or WST2 (fine movement stage WFS) placed facing projection optical system PL, and therefore, smaller than the surface of wafer W. Therefore, nozzle unit 32 can also be called a liquid immersion member, a liquid immersion space forming member, a liquid confinement member, or a liquid containment member, or the like. In the present embodiment, as the liquid above, pure water which transmits the ArF excimer laser beam (light having a wavelength of 193 nm) is used. Incidentally, refractive index n of the pure water to the ArF excimer laser beam is about 1.44, and in the pure water, the wavelength of illumination light IL is shortened to 193 nm×1/n=around 134 nm.

While, in the present embodiment, nozzle unit 32 is supported in a suspended manner by main frame BD, nozzle unit 32 can be provided at a frame member different from main frame BD, for example, a frame member that is placed on the installation surface described previously, separately from main frame BD. With this arrangement, vibration transmitted from nozzle unit 32 to projection optical system PL can be suppressed or prevented. Further, it is also possible that a part of nozzle unit 32 that comes into contact with liquid Lq (an interface of the liquid immersion area) on the lower surface side of nozzle unit 32 is made to be movable, and the part of nozzle unit 32 is moved so that the relative velocity between wafer stage WST1 or WST2 and nozzle unit 32 is reduced during movement of wafer stage WST1 or WST2. This can suppress or prevent a part of liquid Lq from being separated from the liquid immersion area and remaining on the upper surface of wafer stage WST1 or WST2, or on the surface of wafer W, especially during an exposure operation of wafer W. In this case, during movement of wafer stage WST1 or WST2, the part of nozzle unit 32 may constantly be moved, or only during a part of the exposure operation, for example, only during a stepping operation of wafer stage WST1 or WST2, the part of nozzle unit 32 may be moved. Further, the part of nozzle unit 32 can be, for example, a movable unit having the recovery port and at least a part of the lower surface, or a plate that is relatively movable with respect to nozzle unit 32 and has a lower surface in contact with the liquid.

Besides this, exposure section 200 is equipped with a first fine movement stage position measurement system 110A that includes a first back side encoder system 70A having a measurement arm 71A which is supported substantially in a cantilevered state (supported near an edge) via a support member 72A from main frame BD, and a first top side encoder system 80A (not shown in FIG. 1, refer to FIG. 6 and the like) to be described later on. However, the first fine movement stage position measurement system 110A will be described, after the description of the fine movement stage which will be described later on for the sake of convenience.

Measurement section 300 is equipped with an alignment detection system ALG provided at main frame BD, a focal point position detection system (hereinafter, shortly referred to as an AF system) (90a, 90b) (not shown in FIG. 1, refer to FIG. 6 and the like) provided at main frame BD, and a second fine movement stage position measurement system 110B that includes a second back side encoder system 70B having a measurement arm 71B which is supported substantially in a cantilevered state (supported near an edge) via a support member 72B from main frame BD, and a second top side encoder system 80B (not shown in FIG. 1, refer to FIG. 6 and the like) to be described later on. Incidentally, the second fine movement stage position measurement system 110B will be described after the description of the fine movement stage which will be described later on, for the sake of convenience. Further, alignment detection system ALG is also called a mark detection system, an alignment device or the like.

Figure 5:
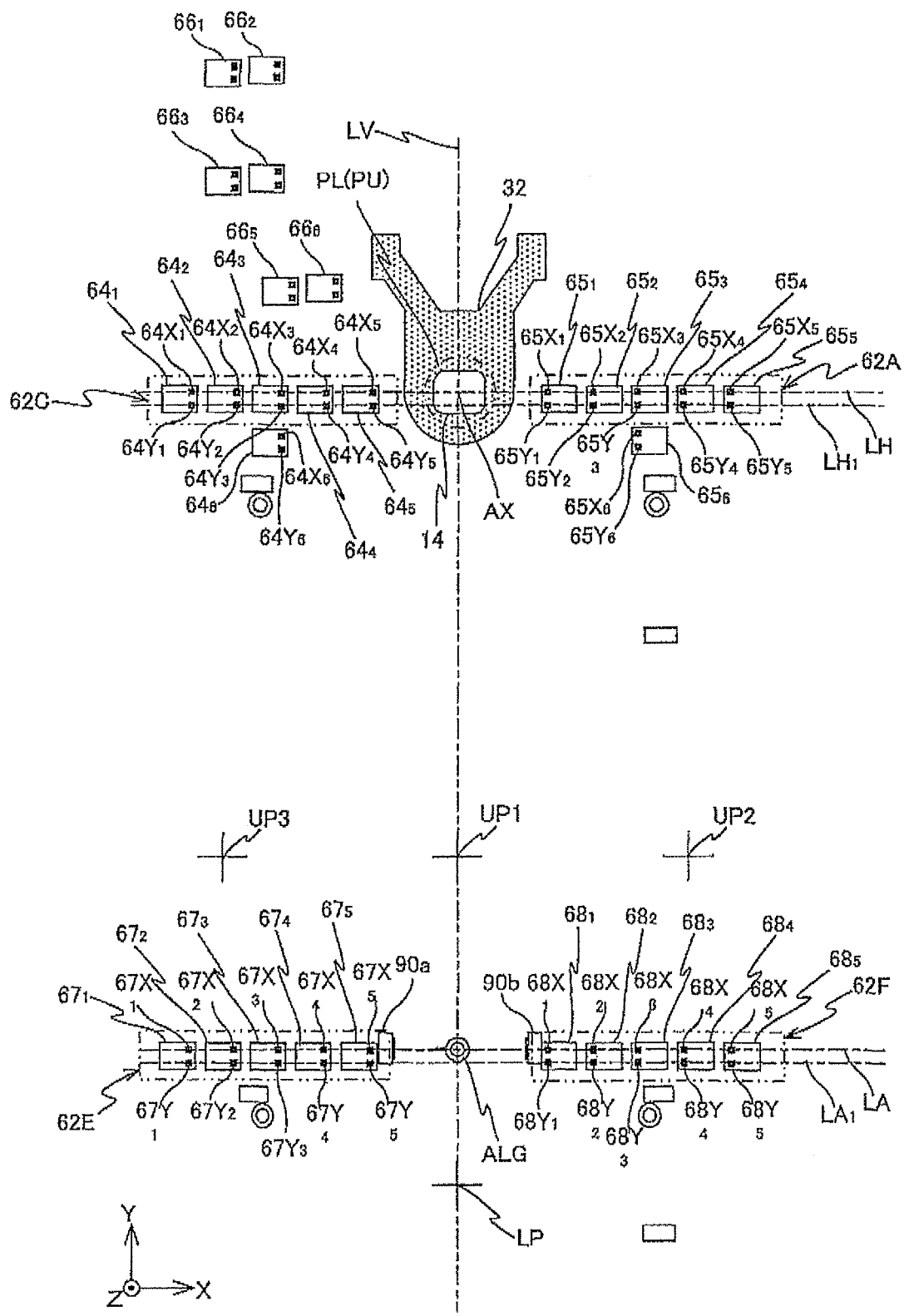
FIG. 5 is a view showing a placement of a first to a third top side encoder systems, an alignment detection system, an AF system and the like that the exposure apparatus in FIG. 1 is equipped with, with a projection optical system serving as a reference.

As shown in FIGS. 2, 5 and the like, alignment detection system ALG is placed in a state where its detection center is located at a position a predetermined distance away to the −Y side from optical axis AX, on a straight line (hereinafter referred to as a reference axis) LV which passes through the center of projection unit PU (optical axis AX of projection optical system PL, also coinciding with the center of exposure area IA previously described in the present embodiment) and is also parallel to the Y-axis. As alignment detection system ALG, for example, an FIA (Field Image Alignment) system is used that employs an image processing method of irradiating a broadband detection beam which does not expose the resist on the wafer onto an object mark, imaging an image of the object mark formed on a light-receiving plane by the reflection light from the object mark and an image of an index (an index pattern on an index plate provided within alignment detection system ALG) not shown using an imaging device (such as a CUD), and outputting the imaging signals. Imaging signals from alignment detection system ALG are supplied to main controller 20 (refer to FIG. 6). Incidentally, as disclosed in, for example, US Patent Application Publication No. 2009/0233234, a plurality of mark detection systems whose detection areas are set at different positions in the X direction can be used as alignment detection system ALG. Further, the method of alignment detection system ALG is not limited to the imaging method, and for example, a method of irradiating a coherent measurement light on an alignment mark (diffraction grating) and detecting a diffraction light generated from the mark can also be employed.

As the AF system, as shown in FIGS. 2 and 5, a focal point position detection system employing an oblique-incidence method and made up of a light-transmitting system 90a and a light-receiving system 90b is used. A structure of a focal point position detection system (focal point position detection mechanism) similar to the AF system (90a, 90b) is disclosed in, for example, the third embodiment of U.S. Pat. No. 4,558,949. This AF system (90a, 90b) obtains a position of a surface subject to detection in a direction of optical axis AX of projection optical system PL (that is, a defocus amount from the best image-forming plane). In the present embodiment, as an example, light-transmitting system 90a and light-receiving system 90b are placed symmetric with respect to reference axis LV, on a straight line (reference axis) LA that passes through the detection center of alignment detection system ALG and is parallel to the X-axis. The interval in the X-axis direction between light-transmitting system 90a and light-receiving system 90b is set smaller than a diameter of wafer W.

An irradiation point of a detection beam from the AF system (90a, 90b), that is, a detection point of the AF system (90a, 90b) coincides with an irradiation point of a detection beam from alignment detections system ALG, that is, the detection center of alignment detection system ALG. Therefore, in the present embodiment, the detection operations by the AF system (90a, 90b) and alignment detection system ALG can be concurrently performed. Incidentally, instead of the AF system (90a, 90b), a multi-point focal point position detection system disclosed in, for example, U.S. Pat. No. 5,448,332 and the like may be used. In the case of using the multi-point focal point position detection system, a plurality of detection points of the system are placed, for example, at a predetermined interval within the same range as the size of a shot area in the X-axis direction on the surface subject to detection. In the present embodiment, of the plurality of detection points, a detection point placed in the center in the X-axis direction is placed at substantially the same position as the detection center of alignment detection system ALG.

Figure 3A:
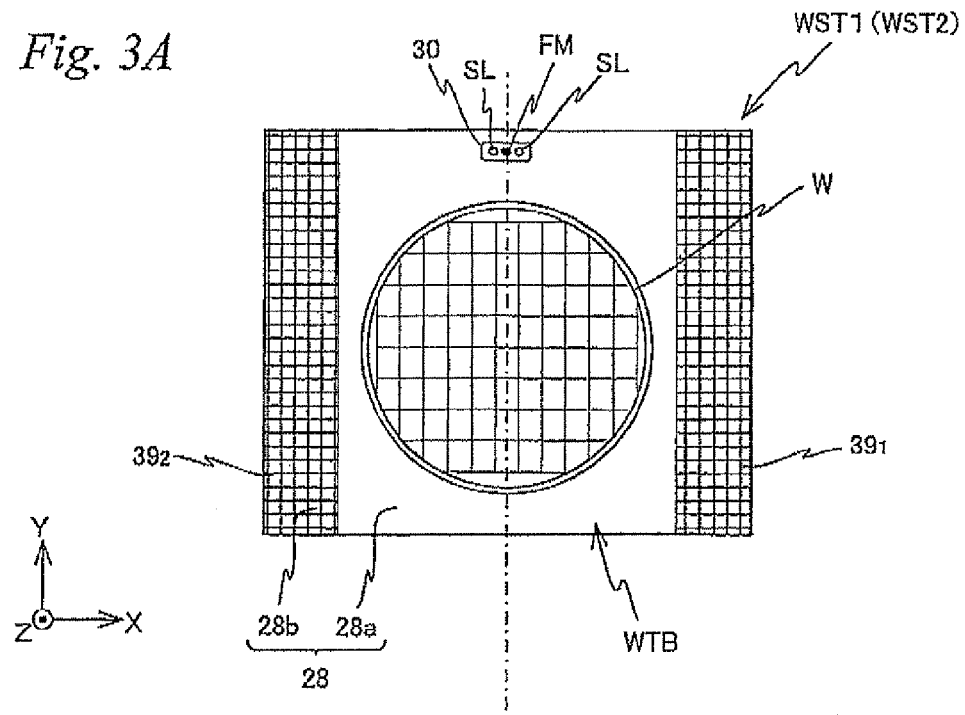
FIG. 3A is a plan view showing a wafer stage in FIG. 1.
Figure 3B:
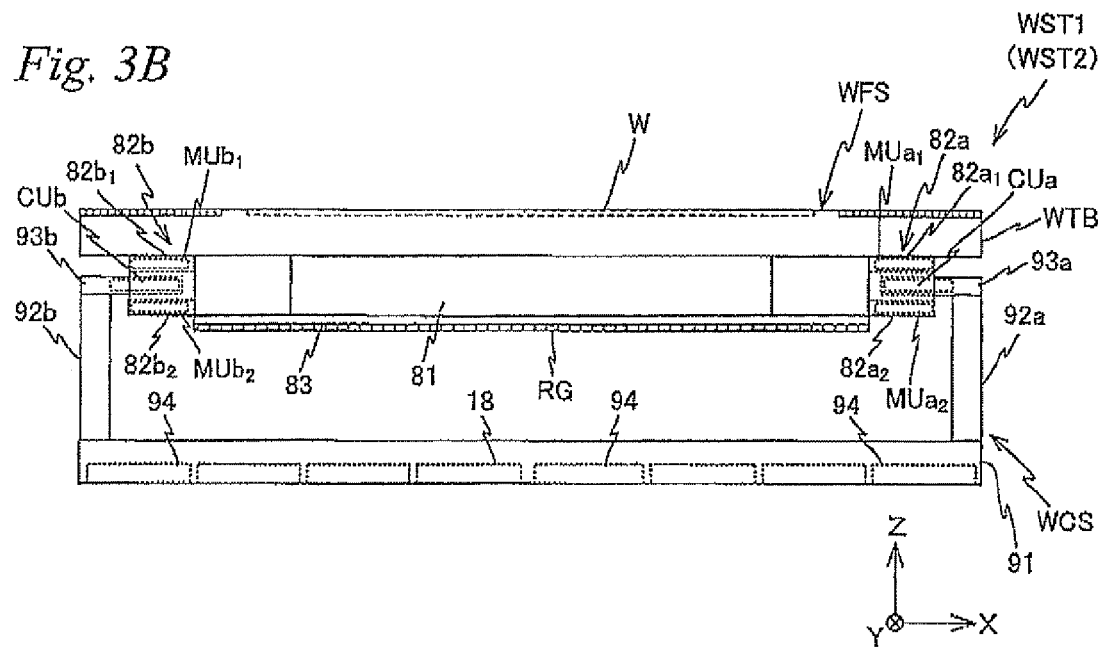
FIG. 3B is a view (front view) of the wafer stage when viewed from a −Y direction.

As it can be seen from FIGS. 1, 3B and the like, each of wafer stages WST1 and WST2 has a coarse movement stage WCS, and fine movement stage WFS which is supported in a non-contact state by coarse movement stage WCS via an actuator (for example, including at least one of a voice coil motor and an EI core) and can relatively move with respect to coarse movement stage WCS. Here, wafer stages WST1 and WST2 (coarse movement stages WCS) are respectively driven with predetermined strokes in the X-axis and the Y-axis directions, and also finely driven in the θz direction by coarse movement stage driving systems 51A and 51B (refer to FIG. 6) each including a planar motor to be described later on. Further, fine movement stages WFS, which wafer stages WST1 and WST2 are respectively equipped with, are respectively driven in directions of six degrees of freedom (in each of the X-axis, the Y-axis, the Z-axis, the θx, the θy, and the θz directions) by fine movement stage driving systems 52A and 52B (refer to FIG. 6) each including the actuator described previously, with respect to coarse movement stages WCS. Incidentally, coarse movement stage WCS may be driven in the directions of six degrees of freedom by a planar motor to be described later on.

Figure 6:
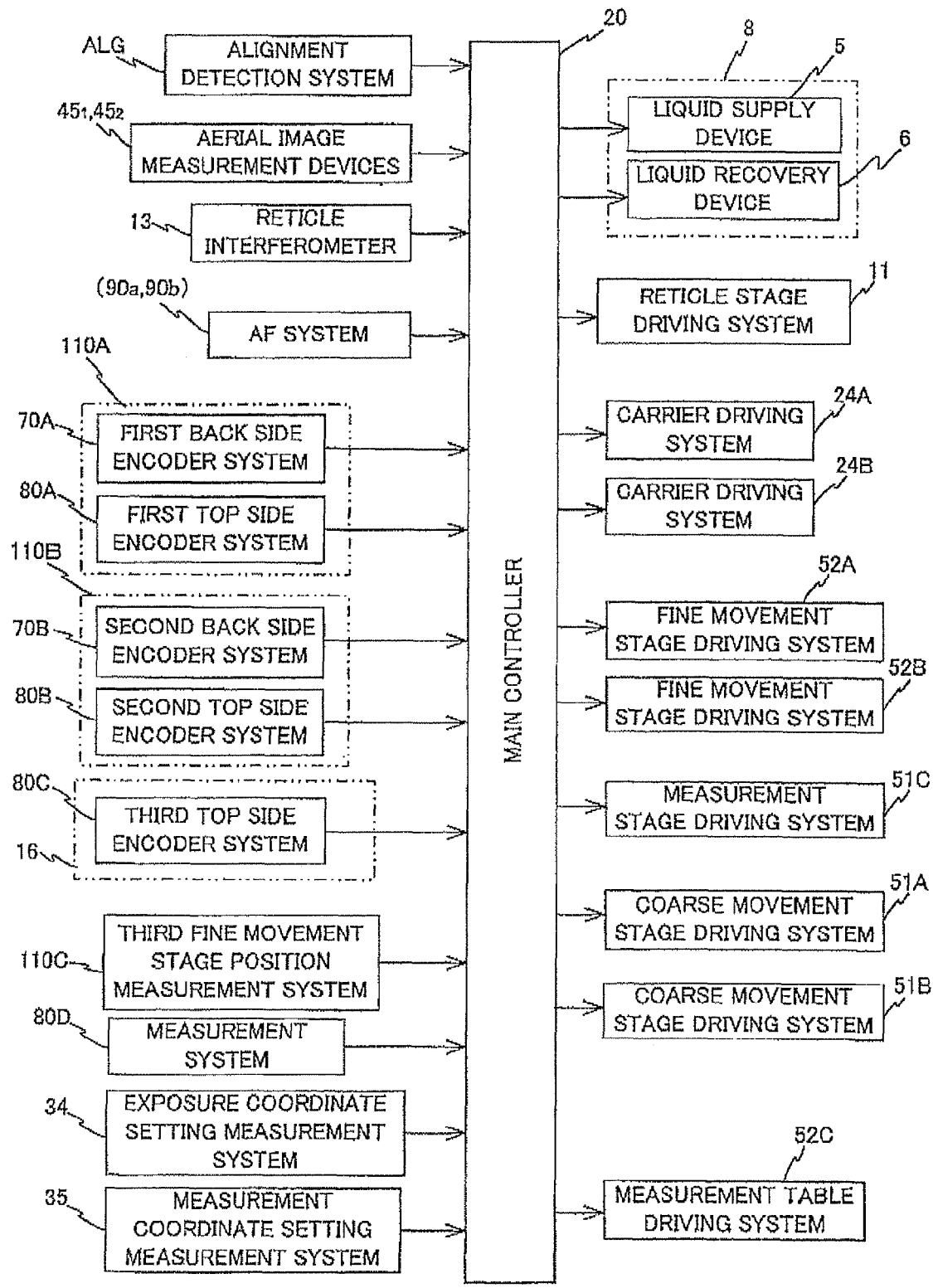
FIG. 6 is a block diagram showing an input/output relation of a main controller mainly structuring a control system of the exposure apparatus related to the embodiment.

Position information in the directions of six degrees of freedom of fine movement stage WFS supported by coarse movement stage WCS equipped in wafer stage WST1 or WST2 located in exposure station 200 is measured by the first fine movement stage position measurement system 110A (refer to FIGS. 1 and 6).

Further, position information in the directions of six degrees of freedom of fine movement stage WFS supported by coarse movement stage WCS equipped in wafer stage WST2 or WST1 located in measurement station 300 is measured by the second fine movement stage position measurement system 110B (refer to FIGS. 1 and 6).

Furthermore, position information of wafer stage WST1 or WST2 between exposure station 200 and measurement station 300, that is, between the measurement range of the first fine movement stage position measurement system 110A and the measurement range of the second fine movement stage position measurement system 110B, is measured by a measurement system 80D (refer to FIG. 6) to be described later on.

Further, position information of measurement stage MST within the XY-plane is measured by a measurement table position measurement system 16 (refer to FIG. 6) to be described later on.

Measurement values (position information) of the first fine movement stage position measurement system 110A, the second fine movement stage position measurement system 110B and measurement system 80D are supplied to main controller 20 (refer to FIG. 6), each for position control of wafer stages WST1 and WST2. Especially, the measurement values of the first fine movement stage position measurement system 110A and the second fine movement stage position measurement system 110B are used in position control of fine movement stage WFS of each of wafer stages WST1 and WST2. Further, measurement values of measurement table position measurement system 16 are supplied to main controller 20, for position control of measurement table MTB (refer to FIG. 6).

Now, details of the structure and the like of the stage systems will be described. First of all, wafer stages WST1 and WST2 will be described. As can be seen from FIGS. 1 and 2, wafer stages WST1 and WST2 are similarly structured though they are bilaterally symmetric, and therefore, wafer stage WST1 is representatively focused on and described here.

Coarse movement stage WCS equipped in wafer stage WST1, as shown in FIG. 3B, is equipped with a coarse movement slider section 91, a pair of side wall sections 92a and 92b, and a pair of stator sections 93a and 93b. Coarse movement slider section 91 is made up of a member having a rectangular plate shape whose length in the X-axis direction in a planar view (when viewing from the +Z direction) is slightly longer than the length in the Y-axis direction. The pair of side wall sections 92a and 92b are each made up of a rectangular plate shaped member whose longitudinal direction is in the Y-axis direction, and are fixed to the upper surfaces on one end and the other end, respectively, in the longitudinal direction of coarse movement slider section 91 in a state parallel to a YZ-plane. The pair of stator sections 93a and 93b are fixed facing inward in the center along the Y-axis direction on the upper surfaces of side wall sections 92a and 92b, respectively. Coarse movement stage WCS, as a whole, has a short rectangular parallelepiped shape with an opening in the center of the X-axis direction on the upper surface and in both side surfaces in the Y-axis direction. That is, in coarse movement stage WCS, a space is formed inside penetrated in the Y-axis direction. Measurement arms 71A and 71B are inserted into this space, at the time of exposure, the time of alignment and the like which will be described later on. Incidentally, the length in the Y-axis direction of side wall sections 92a and 92b can be substantially the same as that of stator sections 93a and 93b. That is, side wall sections 92a and 92b can be provided only in the center along the Y-axis direction on the upper surface of one end and the other end in the longitudinal direction of coarse movement slider section 91. Further, coarse movement stage WCS should be movable supporting fine movement stage WFS, and can be called a main section, or movable body, a moving body or the like of wafer stage WST1.

Inside base board 12, as shown in FIG. 1, a coil unit is housed that includes a plurality of coils 17 which are placed in the shape of a matrix with the XY two-dimensional directions serving as a row direction and a column direction. Incidentally, base board 12 is placed below projection optical system PL so that the surface of based board 12 is substantially parallel to the XY plane.

Corresponding to the coil unit, on the bottom surface of coarse movement stage WCS, or in other words, on the bottom surface of coarse movement slider section 91, as shown in FIG. 3B, a magnet unit is provided, made up of a plurality of permanent magnets 18 placed in the shape of a matrix with the XY two-dimensional directions serving as a row direction and a column direction. The magnet units, along with the coil units of base board 12, structure coarse movement stage driving system 51A (refer to FIG. 6) made up of an electromagnetically (Lorentz force) driven planar motor like the ones disclosed in, for example, U.S. Pat. No. 5,196,745 and the like. The magnitude and the direction of current supplied to each coil 17 structuring the coil unit are controlled by main controller 20.

On the bottom surface of coarse movement slider section 91 in the periphery of the magnet unit described above, a plurality of air bearings 94 are fixed. Coarse movement stage WCS is supported by levitation above base board 12 by the plurality of air bearings 94 via a predetermined clearance gap (clearance, gap), for example, a clearance gap of around several μm, and is driven by coarse movement stage driving system 51A in the X-axis direction, the Y-axis direction, and the θz direction.

Incidentally, coarse movement stage driving system 51A is not limited to the electromagnetically (Lorentz force) driven planar motor, and for example, a planar motor which employs a variable reluctance drive method can also be used. Besides this, it is also possible that coarse movement stage driving system 51A is structured using a magnetically levitated type planar motor, and with the planar motor, coarse movement stage WCS can be driven in the directions of six degrees of freedom. In this case, air bearings do not have to be provided on the bottom surface of coarse movement slider section 91.

The pair of stator sections 93a and 93b are each made of a member whose external shape is a plate, and coil units CUa and CUb made up of a plurality of coils used to drive fine movement stage WFS are housed inside, respectively. The magnitude and the direction of current supplied to each coil structuring coil units CUa and CUb are controlled by main controller 20.

Fine movement stage WFS, as shown in FIG. 3B, is equipped with a main section 81, a pair of mover sections 82a and 82b fixed to one edge and the other edge in the longitudinal direction of main section 81, respectively, and wafer table WTB made up of a plate-shaped member having a rectangular shape in a planar view integrally fixed to the upper surface of main section 81.

Main section 81 is made up of an octagonal plate-shaped member whose longitudinal direction is in the X-axis direction in a planar view. On the lower surface of main section 81, a scale plate 83 made up of a plate-shaped member of a predetermined thickness and a predetermined shape, such as for example, a rectangular shape or an octagonal shape slightly larger than main section 81 in a planar view, is placed and fixed horizontally (parallel to the wafer W surface). In an area at least slightly larger than wafer W, on the lower surface of scale plate 83, a two-dimensional grating (hereinafter, simply referred to as a grating) RG is provided. Grating RG includes a reflection type diffraction grating (X diffraction grating) whose period direction is in the X-axis direction and a reflection type diffraction grating (Y diffraction grating) whose period direction is in the Y-axis direction. The pitch of the grid lines of the X diffraction grating and the Y diffraction grating is set, for example, to 1 μm.

Main section 81 and scale plate 83 are preferably formed of, for example, a material having a thermal expansion coefficient which is the same or about the same, and the material preferably has a low thermal expansion coefficient. Further, the surface of grating RG can be protected, being covered by a protective member, such as, for example, a cover glass which is made of a transparent material having transmittance to light and a low thermal expansion coefficient. Incidentally, grating RG can employ any structure and the like as long as the grating is arrayed periodically in two different directions, and the period directions do not necessarily have to coincide with the X and the Y directions, and for example, can be rotated by an angle of 45 degrees with respect to the X and the Y directions.

While, in the present embodiment, fine movement stage WFS has main section 81 and wafer table WTB, wafer table WTB can be, for example, driven by the actuator described previously without providing main section 81. Further, fine movement stage WFS should have a mounting area for wafer W at a part of its upper surface, and can be called a holding section, or a table, a movable section or the like of wafer stage WST1.

The pair of mover sections 82a and 82b have housings whose YZ sections are rectangular frame shaped fixed to one end surface and the other end surface in the X-axis direction of main section 81, respectively. Hereinafter, for the sake of convenience, these housings will be expressed as housings 82a and 82b, using the same reference signs as mover sections 82a and 82b.

Housing 82a has a space (opening section) having a rectangular YZ sectional shape elongated in the Y-axis direction and whose size (length) in the Y-axis direction and size (height) in the Z-axis direction are both slightly larger than those of stator section 93a. Into the space of housing 82a, the edge on the −X side of stator section 93a of coarse movement stage WCS is inserted in a non-contact manner. Inside an upper wall section $82a_1$ and a bottom wall section $82a_2$ of housing 82a, magnet units $MUa_1$ and $MUa_2$ are provided.

Mover section 82b is similarly structured to mover section 82a, while being bilaterally symmetric. Into the space of housing (mover section) 82b, the edge on the +X side of stator section 93b of coarse movement stage WCS is inserted in a non-contact manner. Inside an upper wall section $82b_1$ and a bottom wall section $82b_2$ of housing 82b, magnet units $MUb_1$ and $MUb_2$ which are structured similar to magnet units $MUa_1$ and $MUa_2$ are provided.

Coil units CUa and CUb described above are housed inside stator sections 93a and 93b, respectively, corresponding to magnet units $MUa_1$ and $MUa_2$, and $MUb_1$ and $MUb_2$, respectively.

The structures of magnet units $MUa_1$ and $MUa_2$, and $MUb_1$ and $MUb_2$, and coil units CUa and CUb are disclosed in detail in, for example, U.S. Patent Application Publication No. 2010/0073652, U.S. Patent Application Publication No. 2010/0073653 and the like.

In the present embodiment, similarly to the U.S. Patent Application Publication No. 2010/0073652 and U.S. Patent Application Publication No. 2010/0073653 described above, fine movement stage driving system 52A (refer to FIG. 6), which supports fine movement stage WFS by levitation with respect to coarse movement stage WCS in a non-contact state and also drives fine movement stage WFS in the directions of six degrees of freedom in a non-contact manner, is structured including the pair of magnet units $MUa_1$ and $MUa_2$ which mover section 82a has and coil unit CUa which stator section 93a has, and the pair of magnet units $MUb_1$, and $MUb_2$ which mover section 82b has and coil unit CUb which stator section 93b has that are previously described.

Incidentally, in the case of using a magnetic levitation type planar motor as coarse movement stage driving system 51A (refer to FIG. 6), because fine movement stage WFS can be finely driven in each of the Z-axis, the θx, and the θy directions integrally with coarse movement stage WCS by the planar motor, fine movement stage driving system 52A can employ a structure where fine movement stage WFS is drivable in each of the X-axis, the Y-axis, and the θz directions, that is, in directions of three degrees of freedom within the XY-plane. Besides this, for example, to each of the pair of side well sections 92*a* and 92*b* of coarse movement stage WCS, a pair of electromagnets can be provided, each facing the oblique side section of the octagonal shape of fine movement stage WFS, and at fine movement stage WFS, a magnetic body member can be provided facing each electromagnet. Because this allows fine movement stage WFS to be driven within the XY-plane by the magnetic force of the electromagnets, mover sections 82*a* and 82*b* and stator sections 93*a* and 93*b* can structure a pair of Y-axis linear motors.

In the center of the upper surface of wafer table WTB, a wafer holder (not shown) is provided which holds wafer W by vacuum chucking and the like. The wafer holder can be integrally formed with wafer table WTB, or can be fixed to wafer table WTB, for example, via an electrostatic chuck mechanism, a clamp mechanism or the like, or by adhesion and the like. Here, although omitted in the drawings, in main section 81, a vertical movement pin which can move vertically is provided via a hole provided in the wafer holder. This vertical movement pin can move vertically between a first position where its upper surface is positioned above the upper surface of the wafer holder and a second position where its upper surface is positioned below the upper surface of the wafer holder.

Outside the wafer holder (mounting area of the wafer) on the upper surface of wafer table WTB, as shown in FIG. 3A, a circular opening slightly larger than the wafer holder is formed in the center, and a plate (liquid repellent plate) 28 is provided that has a rectangular outer shape (outline). Plate 28 is made of a material with a low thermal expansion coefficient, such as, for example, glass or ceramics (e.g., Zerodur (product name) of Schott A G, $Al_2O_3$ or TiC or the like), and on its surface, a liquid repellent processing to liquid Lq is applied. To be specific, a liquid repellent film is formed of, for example, a fluorine-based resin material such as a fluororesin material or polytetrafluoroethylene (Teflon (registered trademark)), an acrylic-based resin material, a silicon-based resin material or the like. Incidentally, plate 28 is fixed to the upper surface of wafer table WTB so that its entire surface (or a part of the surface) is substantially flush with the surface of wafer W.

Plate 28 is positioned in the center in the X-axis direction of wafer table WTB, and has a first liquid repellent area 28*a* having a rectangular outer shape (outline) and a circular opening formed in the center, and a pair of second liquid repellent areas 28*b* having a rectangular shape and being positioned on the +X side edge and the −X side edge of wafer table WTB, with the first liquid repellent area 28*a* in between in the X-axis direction. Incidentally, in the present embodiment, because water is used as liquid Lq as is previously described, hereinafter, the first liquid repellent area 28*a* and the second liquid repellent area 28*b* will also be referred to as a first water repellent plate 28*a* and a second water repellent plate 28*b*, respectively.

In the vicinity of the edge on the +Y side of the first water repellent plate 28*a*, a measurement plate 30 is provided. In this measurement plate 30, a fiducial mark FM is provided in the center, and a pair of aerial image measurement slit patterns (slit shaped measurement patterns) SL are provided, with fiducial mark FM in between. And, corresponding to each aerial image measurement slit pattern SL, a light-transmitting system (not shown) is provided which guides illumination light IL passing through the slit patterns to the outside of wafer stage WST (a light-receiving system provided at measurement stage MST to be described later on). Further, on the upper surface of measurement plate 30, a reflection surface to reflect the detection beam from the AF system (90*a*, 90B) described previously is formed at least in the center area (or the entire area). Measurement plate 30 is, for example, placed in an opening of plate 28, which is different from the opening where the wafer holder is placed, and a gap between measurement plate 30 and plate 28 is covered by a seal member or the like so as to prevent the liquid from flowing into wafer table WTB. Further, measurement plate 30 is provided at wafer table WTB so that the surface of measurement plate 30 is substantially flush with the surface of plate 28. Incidentally, it is also possible that at least one opening section (light-transmitting section) different from slit patterns SL is formed at measurement plate 30, and illumination light IL transmitted through the opening section via projection optical system PL and the liquid is detected by a sensor, and thereby, for example, optical characteristics (including wavefront aberration and the like) of projection optical system PL and/or characteristics of illumination light IL (including a light quantity, and illuminance distribution within exposure area IA described previously, and the like), and the like are measurable.

On the pair of the second water repellent plates 28*b*, scales $39_1$ and $39_2$ are respectively formed, for the first and the second top side encoder systems 80A and 80B. To describe this in detail, scales $39_1$ and $39_2$ are each structured by a reflection type two-dimensional diffraction grating which is a combination of, for example, a diffraction grating whose period direction is in the Y-axis direction and a diffraction grating whose period direction is in the X-axis direction. The pitch of the grid lines of the two-dimensional diffraction grating is set to, for example, 1 μm for both the Y-axis direction and the X-axis direction. Further, because the pair of the second water repellent plates 28*b* respectively have scales (two-dimensional gratings) $39_1$ and $39_2$, the pair of the second water repellent plates 28*b* are each called a grating member, a scale plate, or a grid plate or the like, and in the present embodiment, for example, a two-dimensional grating is formed on a glass plate surface having a low thermal expansion coefficient and a liquid-repellent film is formed so as to cover the two-dimensional grating. Incidentally, in FIG. 3A, for the sake of convenience in the drawings, the pitch of the grating is illustrated larger than the actual pitch. Further, the two-dimensional grating can employ any structure and the like as long as the two-dimensional grating is arrayed periodically in two different directions, and the period directions do not necessarily have to coincide with the X and the Y directions, and for example, can be rotated by an angle of 45 degrees with respect to the X and the Y directions.

Further, at predetermined positions on edge portions of scales $39_1$ and $39_2$, marks are respectively formed, though not shown, which are subject to imaging of a pair of imaging sensors of an exposure coordinate return position measurement system to be described later on, when wafer table WTB1 is positioned at a predetermined position (scrum starting position to be described later on).

Incidentally, to protect the diffraction gratings of the pair of the second water repellent plates 28*b* and the like, it is also effective to cover the diffraction gratings with a low thermal expansion coefficient glass plate that has water repellency. Here, as the glass plate, a plate whose thickness is around the same as the wafer, such as for example, a plate having a 1 mm thickness, can be used, and, as an example, the plate is installed on the upper surface of wafer table WTB so that the surface of the glass plate is at substantially the same height as (flush with) the wafer surface. Further, in, the case when the pair of the second water repellent plates 28b are placed at such a distance away from wafer W that the second water repellent plates 28b do not come into contact with the liquid of the liquid immersion area described previously at least during the exposure operation of wafer W, the surfaces of the pair of the second water repellent plates 28b do not necessarily have to be liquid-repellent. In other words, the pair of the second water repellent plates 28b can each be a simple grating member where a scale (two-dimensional grating) is formed.

While, in the present embodiment, plate 28 is provided at wafer table WTB, plate 28 needs not be provided. In this case, on the upper surface of wafer table WTB, a recessed section where the wafer holder is placed is provided, and for example, a pair of the grating members whose surfaces are not liquid-repellent described previously can be placed with the recessed section in between in the X direction on wafer table WTB. As previously described, this pair of grating members should be placed such a distance away from the recessed section that the grating members do not come into contact with the liquid of the liquid immersion area. Further, the recessed section can be formed so that the surface of wafer W held by the wafer holder in the recessed section is substantially flush with the upper surface of wafer table WTB. Incidentally, the entire area or a partial area (including at least a periphery area surrounding the recessed section) of the surface of the upper surface of wafer table WTB can be liquid-repellent. Further, in the case when the pair of grating members where scales (two-dimensional gratings) $39_1$ and $39_2$ are formed are placed in proximity to the recessed section, the pair of the second water repellent plates 28b described previously can be used instead of the pair of the grating members whose surfaces are not liquid-repellent.

Incidentally, near the edge of the scale of each of the second water repellent plates 28b, positioning patterns not shown are each provided, which are used to decide a relative position between an encoder head to be described later on and the scale. This positioning pattern is structured, for example, of grid lines with different reflectivity, and when the encoder head scans this positioning pattern, the intensity of the output signal of the encoder changes. Therefore, a threshold value is decided in advance, and the position where the intensity of the output signal exceeds the threshold value is detected. The relative position between the encoder head and the scale is set with the detected position serving as a reference.

To coarse movement stage WCS of wafer stage WST1, as shown in FIG. 2, one end of a tube 22A with which piping and wiring are integrated is connected, and the other end of tube 22A is connected to a tube carrier TC1. Tube carrier TC1 is used to supply power usage such as electric power (electric current), cooling medium, compressed air, vacuum and the like to wafer stage WST1 (coarse movement stage WCS) via tube 22A. Further, a part of the power usage supplied to coarse movement stage WCS (for example, vacuum and the like) is supplied to fine movement stage WFS. Tube carrier TC1 is driven in the Y-axis direction by a carrier driving system 24A (refer to FIG. 6) composed of, for example, a linear motor. In this case, a stator of carrier driving system 24A may be arranged integrally with a part of the −X edge of base board 12 as shown in FIG. 2, or may be installed on the −X side of base board 12 separately from base board 12 with the Y-axis direction serving as a longitudinal direction so as to reduce the influence of a reaction force generated by the drive of tube carrier TC1 put on wafer stage WST1. Further, the tube carrier can be placed on base board 12, and in this case, the tube carrier can be driven by a planar motor, which will be described later on, that drives coarse movement stage WCS. Incidentally, the tube carrier can also be called a cable carrier or a follower. Further, wafer stage WST1 does not necessarily have to employ a coarse-fine movement structure.

Although tube carrier TC1 is driven in the Y-axis direction following wafer stage WST1 via carrier driving system 24A by main controller 20, drive of tube carrier TC1 in the Y-axis direction does not necessarily have to strictly follow the drive of wafer stage WST1 in the Y-axis direction, and only has to follow the drive within a certain permissible range.

Wafer stage WST2 is similarly structured, though wafer stage WST2 is bilaterally symmetric with wafer stage WST1 described above. Accordingly, wafer stage WST2 (coarse movement stage WCS) is driven in the X-axis direction, the Y-axis direction and the θz direction by coarse movement stage driving system 51B (refer to FIG. 6) composed of a planar motor that is structured similar to coarse movement stage driving system 51A. Further, fine movement stage WFS is supported in a non-contact state by coarse movement stage WCS that wafer stage WST2 is equipped with, and is also driven in the directions of six degrees of freedom in a non-contact manner by fine movement stage driving system 52B (refer to FIG. 6) that is structured similar to fine movement stage driving system 52A. Further, as shown in FIG. 2, to wafer stage WST2, a tube carrier TC2 is connected via a tube 22B, and tube carrier TC2 is driven in the Y-axis direction following wafer stage WST2 by main controller 20 via a carrier driving system 24B (refer to FIG. 6) composed of a linear motor.

Further, as described above, in the present embodiment, because fine movement stage WFS that constitutes each of wafer stages WST1 and WST2 is equipped with wafer table WTB, hereinafter, for the sake of convenience, fine movement stage WFS including wafer table WTB that constitutes wafer stage WST1 will also be expressed as a wafer table WTB1, and fine movement stage WFS including wafer table WTB that constitutes wafer stage WST2 will also be expressed as a wafer table WTB2 (refer to, for example, FIGS. 1, 2 and the like). Further, wafer tables WTB1 and WTB2 are also collectively referred to as wafer table WTB when appropriate.

Figure 4A:
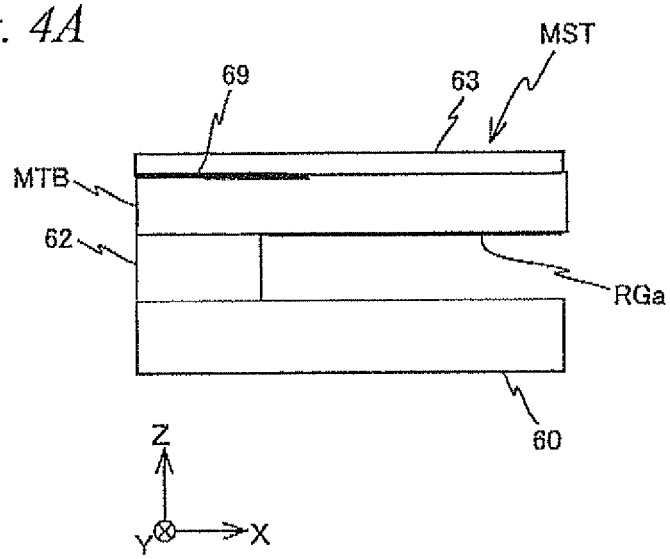
FIG. 4A is a view (front view) of a measurement stage in FIG. 1 when viewed from the −Y direction.
Figure 4B:
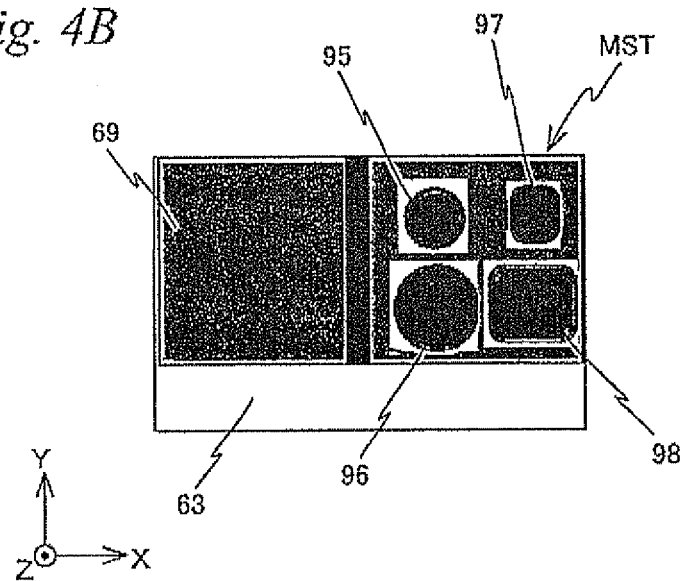
FIG. 4B is a plan view showing measurement stage MST.

Next, measurement stage MST will be described. FIGS. 4A and 4B show a front view (a view when viewed from the −Y direction), and a plan view (a view when viewed from +Z direction) of measurement stage MST, respectively. As shown in these FIGS. 4A and 4B, measurement stage MST is equipped with a slider section 60, a support section 62 and a measurement table MTB. Slider section 60 is composed of a member having a rectangular shape with the X-axis direction serving as longitudinal direction in a planar view (when viewed from the +Z direction). Support section 62 is composed of a rectangular parallelepiped member and is fixed to the end on the −X side of the upper surface of slider section 60. Measurement table MTB is composed of a member having a rectangular plate shape and is supported in a cantilevered manner on support section 62, and is finely driven, for example, in the directions of six degrees of freedom (or directions of three degrees of freedom within the XY-plane), via a measurement table driving system 52C (refer to FIG. 6).

On the bottom surface of slider section 60, although not shown, a magnet unit made up of a plurality of permanent magnets is provided that structures, along with a coil unit (coils 17) of base board 12, a measurement stage driving system 51*c* (refer to FIG. 6) made up of an electromagnetically (Lorentz force) driven planar motor. On the bottom surface of slider section 60, in the periphery of the magnet unit described above, a plurality of air bearings (not shown) are fixed. Measurement stage MST is supported by levitation above base board 12 by the air bearings previously described via a predetermined clearance gap (gap, clearance), such as for example, a clearance gap of around several μm, and is driven in the X-axis direction and the Y-axis direction by measurement stage driving system 51*c*. Incidentally, while measurement stage MST employs an air levitation method, measurement stage MST can employ, for example, a magnetic levitation method by a planar motor.

At measurement table MTB, various measurement members are provided at the −X side half of a portion that excludes a band-shaped section of the edge on the −Y side (hereinafter, which is also referred to as a delivery section as needed). As such measurement members, for example, as shown in FIG. 4B, an illuminance irregularity sensor 95 which has a pin-hole shaped light-receiving section that receives illumination light IL on an image plane of projection optical system PL, an aerial image measuring device 96 which measures an aerial image (projection image) of a pattern projected by projection optical system PL, a wavefront aberration measuring device 97 which employs a Shack-Hartmann method which is disclosed in, for example, PCT International Publication No. 03/065428 and the like, an illuminance monitor 98 which has a light-receiving section of a predetermined area that receives illumination light IL on an image plane of projection optical system PL, and the like are provided.

As illuminance irregularity sensor 95, a sensor having a structure similar to the one disclosed in, for example, U.S. Pat. No. 4,465,368 and the like can be used. Further, as aerial image measuring device 96, a device having a structure similar to the one disclosed in, for example, U.S. Patent Application Publication No. 2002/0041377 and the like can be used. As wavefront aberration measuring device 97, the one disclosed in, for example, PCT International Publication No. 99/60361 (corresponding European Patent No. 1079223) can be used. As illuminance monitor 98, a monitor having a structure similar to the one disclosed in, for example, U.S. Patent Application Publication No. 2002/0061469 and the like can be used.

Further, at measurement table MTB, a pair of light-receiving systems (not shown) are provided at the delivery section in a placement that can face the pair of light-transmitting systems (not shown) previously described. In the present embodiment, aerial image measurement devices 45$_1$ and 45$_2$ (refer to FIG. 6) are structured in which each light-transmitting system (not shown) guides illumination light IL having passed through each aerial image measurement slit pattern SL of measurement plate 30 on wafer stage WST1 or WST2, and a photodetection element of each light-receiving system (not shown) within measurement stage MST receives the light, in a state where wafer stage WST1 or WST2 and measurement stage MST are close to each other within a predetermined distance in the Y-axis direction (including a state in contact).

Incidentally, while, in the present embodiment, the four measurement members (95, 96, 97 and 98) are provided on measurement table MTB, the type and/or the number of the measurement members are/is not limited to those described above. As the measurement members, for example, a transmittance measuring device that measures the transmittance of projection optical system PL, and/or a measuring device which observes local liquid immersion device 8 previously described, such as for example, nozzle unit 32 (or tip lens 191) and the like, can also be used. Furthermore, a member different from the measurement members, such as, for example, a cleaning member that cleans nozzle unit 32, tip lens 191 and the like can also be installed at measurement stage MST.

Incidentally, in the present embodiment, corresponding to performing the liquid immersion exposure of wafer W by exposure light (illumination light) IL via projection optical system PL and liquid (water) Lq, illumination light IL is to be received via projection optical system PL and the water, in illuminance irregularity sensor 95, aerial image measuring device 96, wavefront aberration measuring device 97 and illuminance monitor 98 described above used in measurement using illumination light IL. Further, out of each sensor, only a part of the sensor, such as for example, a light-receiving plane (light-receiving section) which receives illumination light IL via an optical system and water and a part of the optical system can be placed at measurement table MTB, or the whole sensor can be placed at measurement table MTB.

At the −X side half of a portion excluding the delivery section of measurement table MTB, a two-dimensional grating 69 having period directions in the X-axis direction and the Y-axis direction is provided. On the upper surface of measurement table MTB, a plate 63 is fixed, made up of a transparent member whose surface is covered with a liquid repellent film (water repellent film), in a state covering two-dimensional grating 69 and various measurement members. Plate 63 is made of a material similar to plate 28 previously described. On the lower surface (surface on the −Z side) of measurement table MTB, a grating RGa similar to grating RG previously described is provided.

Incidentally, in the case when measurement stage driving system 51C is structured using a magnetic levitation type planar motor, the measurement stage can be, for example, a stand-alone stage which is movable in the directions of six degrees of freedom. Further, plate 63 does not necessarily have to be provided at measurement table MTB. In this case, on the upper surface of measurement table MTB, a plurality of openings where the light-receiving planes (light-transmitting sections) of the plurality of sensors described previously are respectively placed are formed, and for example, at least a part of the sensor including the light-receiving plane should be provided at measurement table MTB so that the light-receiving plane in the opening is substantially flush with the upper surface of measurement table MTB.

Measurement stage MST is engageable with measurement arm 71A from the −X side, and in the engaged state, measurement table MTB is positioned right above measurement arm 71A. At this point in time, position information of measurement table MTB in the directions of six degrees of freedom is measured by a plurality of encoder heads to be described later that irradiate a measurement beam on grating RGa that measurement arm 71A has.

Further, measurement table MTB can be as close as a distance of, for example, around 300 μm or less, or be in contact from the +Y side to/with fine movement stage WFS (wafer table WTB1 or WTB2) supported by coarse movement stage WCS, and in such a proximity or contact state, forms a surface (for example, refer to FIG. 10) that appears to be completely flat, along with the upper surface of wafer table WTB1 or WTB2. Measurement table MTB (measurement stage MST) is driven by main controller 20 via measurement stage driving system 51C, and receives/delivers a liquid immersion area (liquid Lq) from/to measurement table MTB and wafer table WTB1 or WTB2. That is, a part of a boundary that defines the liquid area formed under projection optical system PL is replaced from one of the upper surface of the wafer table (WTB1 or WTB2) and the upper surface of measurement table MTB to the other. Incidentally, the delivery of the liquid immersion area (liquid Lq) between measurement table MTB and wafer table WTB1 or WTB2 will be further described later on.

Next, the structure of the first fine movement stage position measurement system 110A (refer to FIG. 6), which is used to measure position information of fine movement stage WFS (wafer table WTB1 or WTB2) held movable by coarse movement stage WCS that is equipped in wafer stage WST1 or WST2 located at exposure station 200, will be described. Here, the first fine movement stage position measurement system 110A will be described, by describing, as an example, the case of measuring position information of wafer table WTB1 that wafer stage WST1 is equipped with.

The first back side encoder system 70A of the first fine movement stage position measurement system 110A, as shown in FIG. 1, is equipped with measurement arm 71A which is inserted into a space provided inside coarse movement stage WCS in a state where wafer stage WST1 is placed below projection optical system PL.

Measurement arm 71A, as is shown in FIG. 1, has an arm member $71_1$ supported by main frame BD in a cantilevered state via support member 72A, and an encoder head (at least a part of the optical system) to be described later on placed inside arm member $71_1$. That is, in order to place a head section (including at least a part of the optical system) of the first back side encoder system 70A at a position lower than grating RG of wafer table WTB1, the head section is supported by a measurement member (which is also called a support member or a metrology arm) including arm member $71_1$ of measurement arm 71A and support member 72A. With this placement, a measurement beam of the first back side encoder system 70A is irradiated on grating RG from below. Arm member $71_1$ is made up of a hollow columnar member having a rectangular cross section whose longitudinal direction is in the Y-axis direction. The size in the width direction (the X-axis direction) of arm member $71_1$ is, for example as shown in FIG. 2, widest near the base end, and the width narrows gradually from the base end toward the tip end side to a position being slightly near to the base end from the center in the longitudinal direction, and the width is substantially constant from the position slightly near to the base end from the center in the longitudinal direction to the tip end. While, in the present embodiment, the head section of the first back side encoder system 70A is placed between grating RG of wafer table WTB1 and the surface of base board 12, the head section can be placed, for example, below base board 12.

Arm member $71_1$ is made of a material having a low thermal expansion coefficient, preferably a material of zero expansion (for example, Zerodur (product name) of Schott A G and the like). Arm member $71_1$ has high rigidity because of being hollow and having a wide base end, and because the shape in a planar view is set in the manner described above, in a state where wafer stage WST1 is placed below projection optical system PL, wafer stage WST1 moves in a state where the tip of arm member $71_1$ is inserted into the space of coarse movement stage WCS, and on this movement, this structure can keep arm member $71_1$ from interfering the movement of wafer stage WST1. Further, an optical fiber of a light-transmitting side (light source side) and a light-receiving side (detector side) and the like, which are used for transmitting light (measurement beam) to/from an encoder head to be described later on, run through inside the hollow section of, arm member $71_1$. Incidentally, arm member $71_1$ can be formed of, for example, a member having a portion where only the optical fiber and the like run through is hollow, and other portions being solid. Incidentally, in order to reduce the vibration of a particular frequency of arm member $71_1$, a mass damper (also called a dynamic mass damper) having a specific frequency as a particular resonance frequency may provided at the tip of arm member $71_1$. Incidentally, the vibration of arm member $71_1$ can also be suppressed or prevented by other vibration suppressing members than the mass damper. Further, this vibration suppressing member is one of compensation devices that compensate for measurement errors of the first back side encoder system 70A that occur due to the vibration of arm member $71_1$, and the first top side encoder system 80A to be described later on is also one of the compensation devices.

Figure 7:
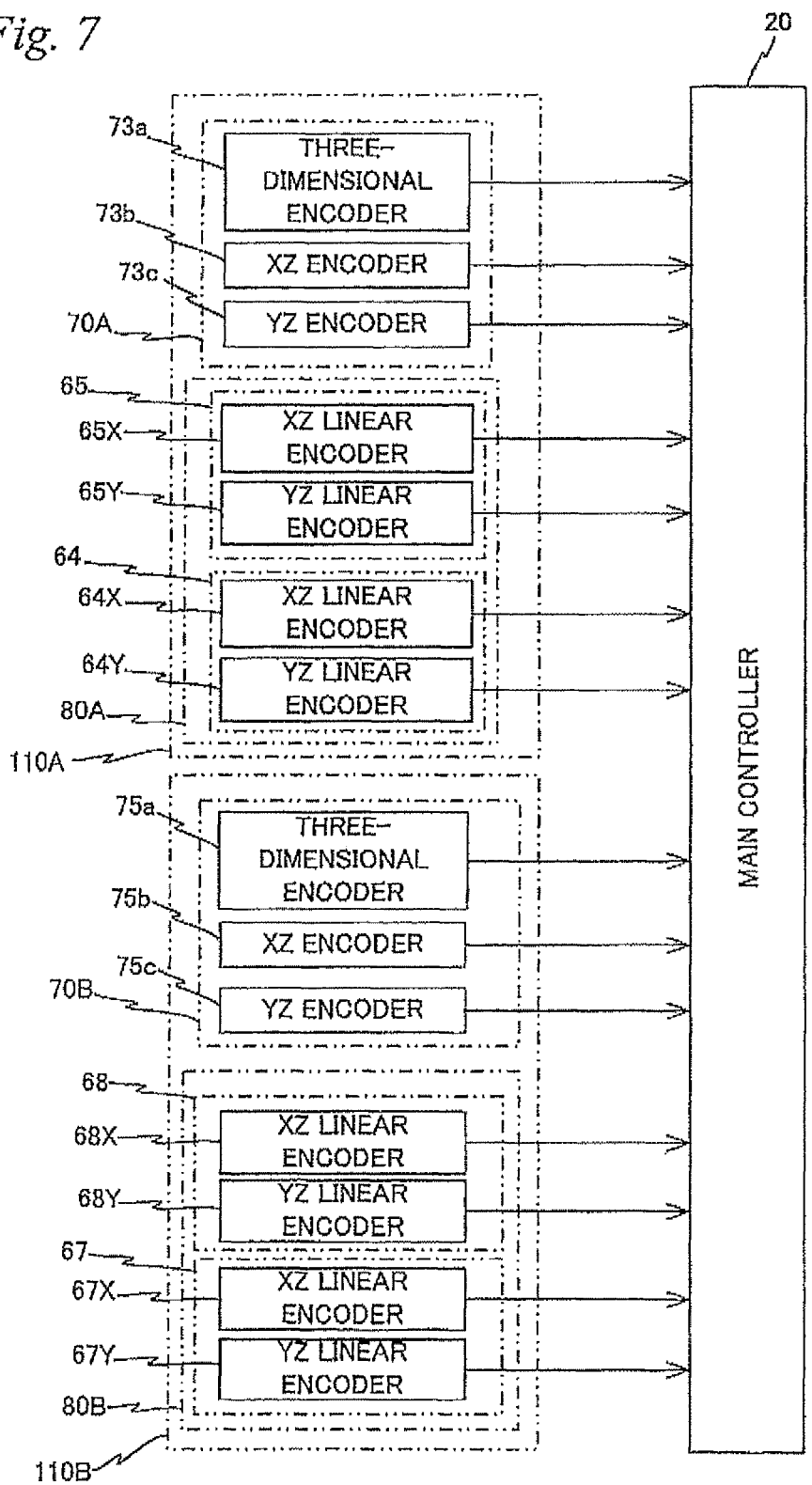
FIG. 7 is a view showing an example of a concrete structure of a first and a second fine movement stage position measurement systems in FIG. 6.

In a state where wafer stage WST1 is placed below projection optical system PL, the tip of arm member $71_1$ of measurement arm 71A is inserted into the space within coarse movement stage WCS, and as shown in FIG. 1, its upper surface faces grating RG (not shown in FIG. 1, refer to FIG. 3B and the like) provided on the lower surface of fine movement stage WFS (to be more precise, the lower surface of main section 81). The upper surface of arm member $71_1$ is placed substantially parallel to the lower surface of fine movement stage WFS, in a state where a predetermined clearance gap (gap, clearance), for example, a clearance gap of around several mm, is formed between the upper surface of arm member $71_1$ and the lower surface of fine movement stage WFS. Incidentally, a clearance gap between the upper surface of arm member $71_1$ and the lower surface of fine movement stage WFS may be several mm or more or less. The first back side encoder system 70A, as shown in FIG. 7, includes a three-dimensional encoder 73a which measures a position, in the X-axis, the Y-axis and the Z-axis directions, of fine movement stage WFS located at exposure station 200, an XZ encoder 73b which measures a position of fine movement stage WFS in the X-axis and the Z-axis directions, and a YZ encoder 73c which measures a position of fine movement stage WFS in the Y-axis and the Z-axis directions.

XZ encoder 73b and YZ encoder 73c are respectively equipped with a two-dimensional head whose measurement direction is in the X-axis and the Z-axis directions and a two-dimensional head whose measurement direction is in the Y-axis and the Z-axis directions, each housed inside arm member $71_1$ of measurement arm 71A. Hereinafter, for the sake of convenience, the two-dimensional heads that XZ encoder 73b and YZ encoder 73d are respectively equipped with will be expressed as an XZ head 73b and a YZ head 73c, using the same reference signs as the respective encoders. As each of such XZ head 73b and YZ head 73c, an encoder head (hereinafter, shortly referred to as a head as needed) having a structure similar to the displacement measurement sensor head disclosed in, for example, U.S. Pat. No. 7,561,280, can be used. Further, three-dimensional encoder 73a is equipped with a three-dimensional head whose measurement direction is in the X-axis, the Y-axis, and the Z-axis directions, housed inside arm member $71_1$ of measurement arm 71A. Hereinafter, for the sake of convenience, the three-dimensional head that three-dimensional encoder 73a is equipped with will be expressed as a three-dimensional head 73a, using the same reference sign of the encoder. As three-dimensional head 73a, for example, a three-dimensional head which is structured combining XZ head 73b and YZ head 73c so that the measurement points (detection points) of both the heads are at the same point and measurement in the X-axis direction, the Y-axis direction and the Z-axis direction is also possible, can be used.

Figure 8A:
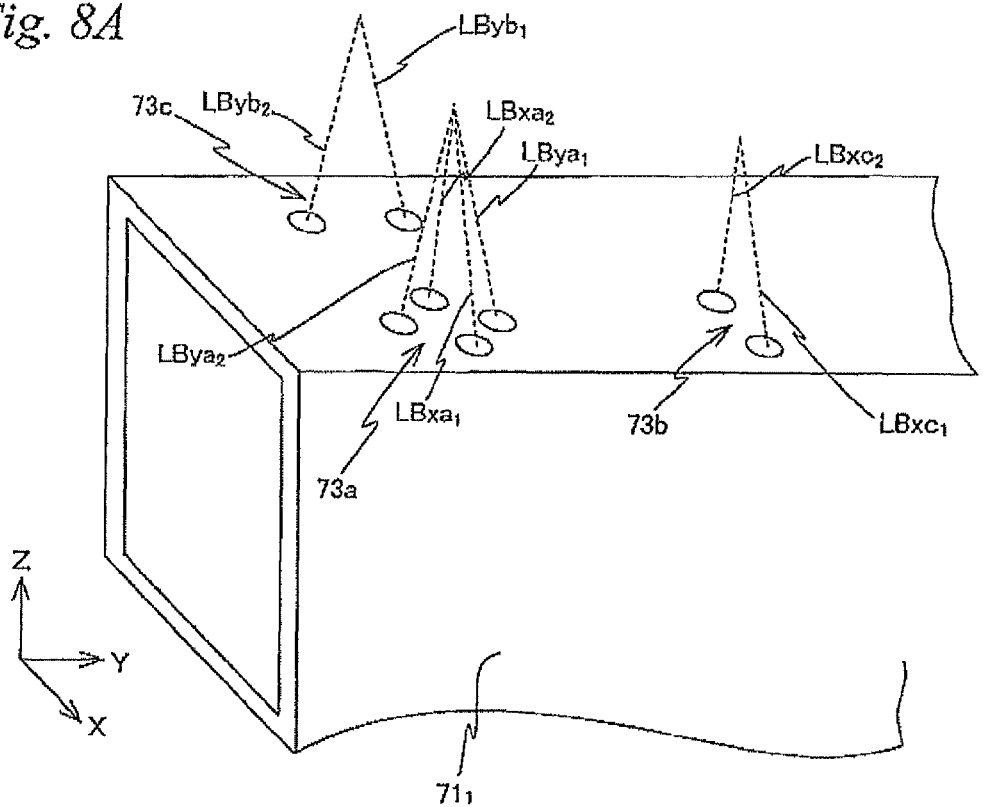
FIG. 8A is a perspective view showing the tip of a measurement arm of a first back side encoder system.
Figure 8B:
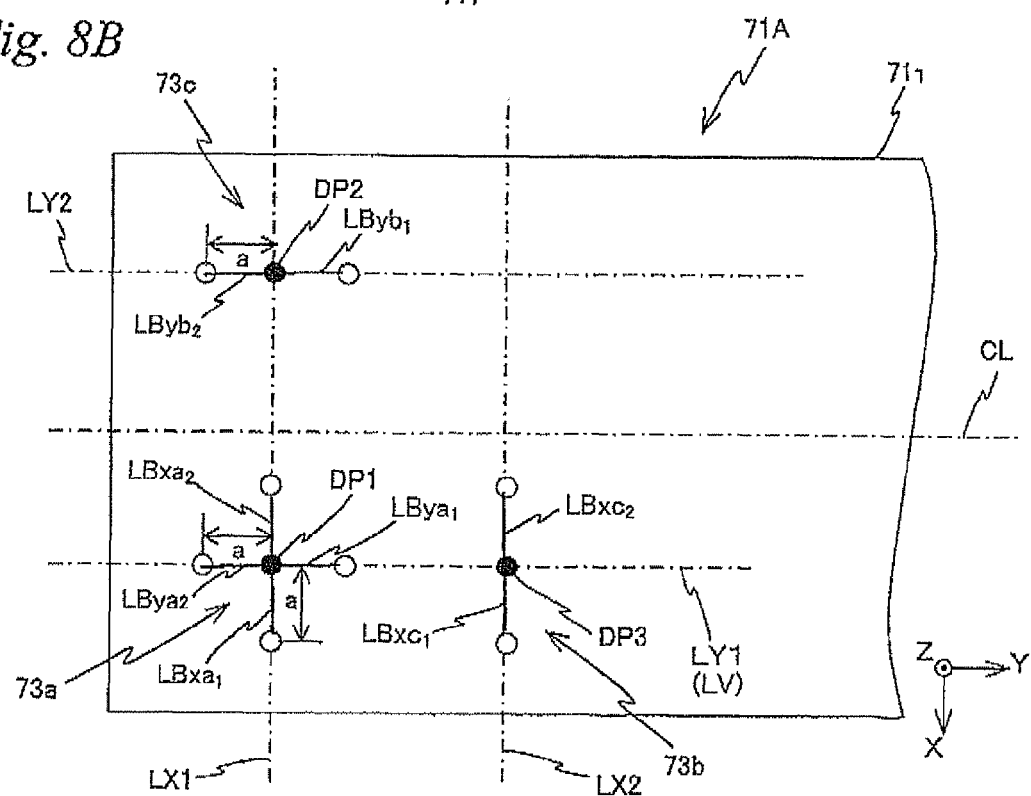
FIG. 8B is a plan view showing the tip of the measurement arm in FIG. 8A.

FIG. 8A shows the tip of arm member $71_1$ in a perspective view, and FIG. 8B shows a plan view of the upper surface of the tip of arm member $71_1$ when viewed from the +Z direction. As shown in FIGS. 8A and 8B, three-dimensional head 73a irradiates measurement beams $LBxa_1$ and $LBxa_2$ (refer to FIG. 8A) on grating RG from two points (refer to the white circles in FIG. 8B) which are on a straight line LX1 parallel to the X-axis, at positions of an equal distance (referred to as a distance "a") from a straight line LY1 parallel to the Y-axis that is a predetermined distance away from center line CL. Further, three-dimensional head 73a irradiates measurement beams $LBya_1$ and $LBya_2$ on grating RG from two points that are at positions on straight line LY1 and of distance "a" from straight line LX1. Measurement beams $LBxa_1$ and $LBxa_2$ are irradiated on the same irradiation point on grating RG, and further, measurement beams $LBya_1$ and $LBya_2$ are also irradiated on that irradiation point. In the present embodiment, the irradiation point of measurement beams $LBxa_1$ and $LBxa_2$ and measurement beams $LBya_1$ and $LBya_2$, or in other words, the detection point (refer to reference sign DP1 in FIG. 8B) of three-dimensional head 73a is located directly under the exposure position which is the center of irradiation area (exposure area) IA of illumination light IL irradiated on wafer W (refer to FIG. 1). Here, straight line LY1 coincides with reference axis LV previously described.

XZ head 73b is placed at a position a predetermined distance away to the −Y side of three-dimensional head 73a. XZ head 73b, as shown in FIG. 8B, irradiates measurement beams $LBxc_1$ and $LBxc_2$ each shown in a broken line in FIG. 8A on a common irradiation point on grating RG from two points (refer to the white circles in FIG. 8B) which are on a straight line LX2 that is parallel to the X-axis and is positioned a predetermined distance to the +Y side of straight line LX1, at positions that are each away from straight line LY1 by distance "a". The irradiation point of measurement beams $LBxc_1$ and $LBxc_2$, that is to say, the detection point of XZ head 73b is shown by reference sign DP3 in FIG. 8B.

YZ head 73c is placed at a position a predetermined distance away to the −X side of three-dimensional head 73a. YZ head 73c irradiates measurement beams $LByb_1$ and $LByb_2$ on grating RG from two points (refer to the white circles in FIG. 8B) which are placed on straight line LY2 which is symmetric to straight line LY1 with respect to center line CL, at positions that are away from straight line LX1 by distance "a". Measurement beams $LByb_1$ and $LByb_2$ are irradiated on the same irradiation point on grating RG. The irradiation point of measurement beams $LByb_1$ and $LByb_2$, that is to say, the detection point of YZ head 73c (refer to reference sign DP2 in FIG. 8B) is a point a predetermined distance away to the −X side from a point directly under the exposure position.

In the first back side encoder system 70A, the three-dimensional encoder is structured by three-dimensional head 73a which measures the position of fine movement stage WFS in the X-axis, the Y-axis, and the Z-axis directions using the X diffraction grating and the Y diffraction grating of grating RG, the XZ encoder is structured by XZ head 73b which measures the position of fine movement stage WFS in the X-axis and the Z-axis directions using the X diffraction grating of grating RG, and the YZ encoder is structured by YZ head 73c which measures the position of fine movement stage WFS in the Y-axis and the Z-axis directions using the Y diffraction grating of grating RG.

Hereinafter, for the sake of convenience, the above-described encoders are respectively expressed as a three-dimensional encoder 73a (encoder 73a), an XZ encoder 73b (encoder 73b) and a YZ encoder 73c (encoder 73c), using the same reference signs as the respective heads.

The output of encoders 73a, 73b and 73c of the first back side encoder system 70A is supplied to main controller 20 (refer to FIG. 7).

Main controller 20 computes the position of fine movement stage WFS in the X-axis, the Y-axis and the Z-axis directions using the measurement values of three axes directions (X, Y, Z) of encoder 73a, computes the position of fine movement stage WFS in the θz direction using the measurement values of the Y-axis direction of encoders 73a and 73c, computes the position of fine movement stage WFS in the θy direction using the measurement value of the Z-axis direction of encoders 73a and 73c, and computes the position of fine movement stage WFS in the θx direction using the measurement values of the Z-axis direction of encoders 73a and 73b. Incidentally, the position of fine movement stage WFS in the θz direction can also be computed using the measurement values of the X-axis direction of encoders 73a and 73b.

Here, in the present embodiment, detection point DP1 of three-dimensional head 73a coincides with the exposure position in a planar view, and the position in the X-axis, the Y-axis and the Z-axis directions of fine movement stage WFS is measured at such detection point DP1.

With heads 73a to 73c described above, because the optical paths of the measurement beams in the air are extremely short and are substantially equal, the influence of air fluctuation can be practically ignored. Accordingly, position information of fine movement stage WFS in the directions of six degrees of freedom can be measured with high precision by the first back side encoder system 70A. Further, because the substantial detection points on the grating in the X-axis, the Y-axis, and the Z-axis directions according to the first back side encoder system 70A are each positioned right under the center (exposure position) of exposure area IA (coincide with the center of exposure area IA in a planar view), generation of the so-called Abbe error can be suppressed to a level that can be practically ignored. Accordingly, by using the first back side encoder system 70A, main controller 20 can measure the position of fine movement stage WFS in the X-axis direction, the Y-axis direction and the Z-axis direction with high precision, without any Abbe errors. Incidentally, while it is also possible that the first back side encoder system 70A measures only the position information of wafer table WTB1 (or wafer stage WST1) in the directions of six degrees of freedom, it is preferable that the first back side encoder system 70A can measure the position information of wafer table WTB1 (or wafer stage WST1) using at least one measurement beam that is different from the plurality of measurement beams necessary for measurement of the position information in the directions of six degrees of freedom, as in the present embodiment. In such a case, main controller 20 uses the position information of wafer table WTB1 (or wafer stage WST1) measured by the first back side encoder system 70A using at least one measurement beam different from the plurality of measurement beams necessary for the measurement of the position information in the directions of six degrees of freedom, and thereby, for example, can update information used to compensate for the measurement errors of the first back side encoder system 70A that occurs due to grating RG.

Next, a structure and the like of the first top side encoder system 80A structuring a part of the first fine movement stage position measurement system 110A will be described. The first top side encoder system 80A can measure position information of wafer table WTB1 (fine movement stage WFS) in the directions of six degrees of freedom concurrently with the first back side encoder system 70A.

In exposure apparatus 100, for example as shown in FIG. 2, a pair of head sections 62A and 62C are placed on the +X side and the −X side of projection unit PU (nozzle unit 32), respectively. Head sections 62A and 62C, as will be described later on, each include a plurality of heads, and these heads are fixed to main frame BD (not shown in FIG. 2, refer to FIG. 1 and the like) in a suspended state via a support member.

Head sections 62A and 62C, as shown in FIG. 5, are respectively equipped with five four-spindle heads $65_1$ to $65_5$ and five four-spindle heads $64_1$ to $64_5$. Inside the respective housings of four-spindle heads $65_1$ to $65_5$, XZ heads $65X_1$ to $65X_5$ whose measurement directions are in the X-axis and the Z-axis directions, and YZ heads $65Y_1$ to $65Y_5$ whose measurement directions are in the Y-axis and the Z-axis directions are housed. Similarly, inside the respective housings of four-spindle heads $64_1$ to $64_5$, XZ heads $64X_1$ to $64X_5$ and YZ heads $64Y_1$ to $64Y_5$ are housed. As each of the XZ heads $65X_1$ to $65X_5$ and $64X_1$ to $64X_5$, and YZ heads $65Y_1$ to $65Y_5$ and $64Y_1$ to $64Y_5$, an encoder head having a structure similar to the displacement measurement sensor head disclosed in, for example, U.S. Pat. No. 7,561,280, can be used.

XZ heads $65X_1$ to $65X_5$ and $64X_1$ to $64X_5$ (to be more precise, irradiation points on scales $39_1$ and $39_2$ of the measurement beams generated by XZ heads $65X_1$ to $65X_5$ and $64X_1$ to $64X_5$) are placed on a straight line (hereinafter called a reference axis) LH which passes through optical axis AX (in the present embodiment, also coinciding with the center of exposure area IA previously described) of projection optical system PL and is also parallel to the X-axis, at a predetermined interval WD (refer to FIG. 2). Further, YZ heads $65Y_1$ to $65Y_5$ and $64Y_1$ to $64Y_5$ (to be more precise, irradiation points on scales $39_1$ and $39_2$ of the measurement beams generated by YZ heads $65Y_1$ to $65Y_5$ and $64Y_1$ to $64Y_5$) are placed on a straight line $LH_1$ which is parallel to reference axis LH and is also a predetermined distance away from reference axis LH to the −Y side, at the same X positions as the corresponding XZ heads $65X_1$ to $65X_5$ and $64X_1$ to $64X_5$. Hereinafter, XZ heads $65X_1$ to $65X_5$ and $64X_1$, to $64X_5$, and YZ heads $65Y_1$ to $65Y_5$ and $64Y_1$ to $64Y_5$ will also be expressed as XZ heads 65X and 64X, and YZ heads 65Y and 64Y, respectively, as necessary. Incidentally, reference axis LH coincides with straight line LX1 previously described.

Using scales $39_1$ and $39_2$ respectively, head sections 62A and 62C structure a multiple-lens (five-lens in this case) XZ linear encoder which measures the position in the X-axis direction (X position) and the position in the Z-axis direction (Z position) of wafer table WTB1, and structure a multiple-lens (five-lens in this case) YZ linear encoder which measures the position in the Y-axis direction (Y position) and the Z position. Hereinafter, for the sake of convenience, these encoders will be expressed as XZ linear encoders 65X and 64X, and YZ linear encoders 65Y and 64Y (refer to FIG. 7), using the same reference signs as XZ heads 65X and 64X, and YZ heads 65Y and 64Y, respectively.

In the present embodiment, XZ linear encoders 65x and YZ linear encoders 65Y structure (refer to FIG. 7) a multiple-lens (five-lens in this case) four-spindle encoder 65 which measures position information related to each of the X-axis, the Y-axis, the Z-axis and the θx directions of wafer table WTB1. Similarly, XZ linear encoders 64X and YZ linear encoders 64Y structure (refer to FIG. 7) a multiple-lens (five-lens in this case) four-spindle encoder 64 which measures position information related to each of the X-axis, the Y-axis, the Z-axis, and the θx directions of wafer table WTB1.

Here, interval WD in the X-axis direction of the five XZ heads 65X and 64X (to be more precise, irradiation points on scales $39_1$ and $39_2$ of the measurement beams generated by XZ heads 65X and 64X) and the five YZ heads 65Y and 64Y (to be more precise, irradiation points on the scales of the measurement beams generated by YZ heads 65Y and 64Y) that head sections 62A and 62C are equipped with, respectively, is set narrower than the width of scales $39_1$ and $39_2$ in the X-axis direction. Accordingly, on exposure and the like, at least one head each of the five XZ heads 65X, the five XZ heads 64X, the five YZ heads 65Y and the five YZ heads 64Y constantly faces (irradiates the measurement beam on) the corresponding scales $39_1$ and $39_2$. Here, the width of the scale refers to the width of the diffraction grating (or of an area where the diffraction grating is formed), or to be more precise, a range where position measurement using the head is possible.

Accordingly, four-spindle encoder 65 and four-spindle encoder 64 structure the first top side encoder system 80A which measures position information in the directions of six degrees of freedom of wafer table WTB1 (fine movement stage WFS) supported by coarse movement stage WCS, in the case when wafer stage WST1 is at exposure station 200. In this case, the position of wafer table WTB1 (fine movement stage WFS) in the θy direction is obtained using the difference between the positions in the Z-axis direction measured, respectively, by four-spindle encoders 65 and four-spindle encoders 64, and the position of wafer table WTB1 (fine movement stage WFS) in the θz direction is obtained using the difference between the positions in the Y-axis direction measured, respectively, by four-spindle encoders 65 and four-spindle encoders 64.

In the present embodiment, furthermore, a pair of four-spindle heads $65_6$ and $64_6$, which are structured similar to four-spindle heads $65_1$ to $65_5$ and $64_1$ to $64_5$, are placed symmetrically with respect to reference axis LV, on the −Y side of head sections 62A and 62C, respectively. XZ head $65X_6$ and YZ head $65Y_6$ structuring a four-spindle head $65_6$ are placed at the same X-position as the XZ head $65X_3$. XZ head $64X_6$ and YZ head $64Y_6$ structuring a four-spindle head $64_6$ are placed at the same X-position as the XZ head $64X$.

A pair of four-spindle heads $65_6$ and $64_6$ constitute a pair of encoders that measure position information of wafer table WTB1 or WTB2 in the directions of six degrees of freedom, using a pair of scales $39_1$ and $39_2$, during a period from a time when a proximity or contact state (scrum) of measurement table MTB and wafer table WTB1 or WTB2 to be described later on is started until the position measurement of wafer table WTB1 or WTB2 by the first fine movement stage position measurement system 110A is started, and this pair of encoders constitute a third fine movement stage position measurement system 110C (refer to FIG. 6).

Measurement values of each encoder structuring the first top side encoder system 80A and the third fine movement stage position measurement system 110C are supplied to main controller 20 (refer to FIGS. 6, 7 and the like).

Further, although it is omitted in the drawings, when main controller 20 drives wafer stage WST1 in the X-axis direction, main controller 20 sequentially switches XZ heads 65X and 64X and YZ heads 65Y and 64Y which measure position information of wafer table WTB1 to adjacent XZ heads 65X and 64X and YZ heads 65Y and 64Y. That is, in order to smoothly perform this switching (joint) of such XZ heads and YZ heads, as previously described, interval WD of adjacent XZ heads and YZ heads included in head sections 62A and 62C is set smaller than the width of scales $39_1$ and $39_2$ in the X-axis direction.

As can be seen from the description so far, in the present embodiment, in the case when wafer stage WST1 is located at exposure station 200, position information in the directions of six degrees of freedom of wafer table WTB1 (fine movement stage WFS) supported by coarse movement stage WCS can be measured concurrently by the first back side encoder system 70A and the first top side encoder system 80A.

In the case when wafer stage WST2 is at exposure station 200, the first back side encoder system 70A that measures position information in the directions of six degrees of freedom of wafer table WTB2 is structured, similarly to the above-described manner, by three-dimensional head 73a, XZ head 73b and YZ head 73c that each irradiate a measurement beam on grating RG on the rear surface of wafer table WTB2, and in this case, the first top side encoder system 80A that measures position information in the directions of six degrees of freedom of wafer table WTB2 (fine movement stage WFS) supported by coarse movement stage WCS is structured, similarly to the above-described manner, by five-lens four-spindle encoders 65 and five-lens four-spindle encoders 64 each structured by the five four-spindle heads that head sections 62A and 62C respectively have, which irradiate measurement beams on the pair of scales $39_1$ and $39_2$, respectively, on the upper surface of wafer table WTB2.

That is, in the present embodiment, regardless of which of wafer stage WST1 or WST2 is at exposure station 200, the first back side encoder system 70A which measures position information in the directions of six degrees of freedom of fine movement stage WFS is structured by heads 73a to 73c incorporated in arm member $71_1$ facing grating RG equipped on fine movement stage WFS supported by coarse movement stage WCS located in exposure station 200, and the first top side encoder system 80A which measures position information in the directions of six degrees of freedom of fine movement stage WFS is structured by head sections 62A and 62C facing the pair of scales $39_1$ and $39_2$, respectively, equipped on fine movement stage WFS supported by coarse movement stage WCS located in exposure station 200.

The first top side encoder system 80A and the first back side encoder system 70A each have the following merits.

For the reasons such as, for example, that the first top side encoder system 80A has the interval between the detection points of the plurality of heads used for position measurement in the θx, the θy and the θz directions is wide, compared with the first back side encoder system 70A, at least regarding the position measurement in the θx, the θy and the θz directions, the coordinate system of the first top side encoder system 80A is more reliable than the coordinate system of the first back side encoder system 70A.

Meanwhile, the first back side encoder system 70A has merits, for example, of having little long-term variation such as deformation of grating RG and drift and the like of heads 73a to 73c, and high reliability in a static component of the measurement signal.

Therefore, in the present embodiment, when wafer stage WST1 or WST2 is positioned at exposure station 200 including the time of exposure to be described later on, main controller 20 performs measurement of position information of fine movement stage WFS (wafer table WTB1 or WTB2) concurrently by the first back side encoder system 70A and the first top side encoder system 80A, and performs position control of wafer table WTB1 or WTB2 based on the position information having higher reliability. In the description below, as an example, the position control of wafer table WTB1 or WTB2 is to be performed, based on the position information measured by the first back side encoder system 70A for the X-axis, the Y-axis and the Z-axis directions, and based on the position information measured by the first top side encoder system 80A for the θx, the θy and the θz directions.

Next, a structure of the second fine movement stage position measurement system 110B (refer to FIG. 6) used for measurement of position information of fine movement stage WFS, which is movably held by coarse movement stage WCS located at measurement station 300, will be described. Here, the second fine movement stage position measurement system 110B will be described, by describing, as an example, the case of measuring position information of wafer table WTB2 that wafer stage WST2 is equipped with.

The second back side encoder system 70B of the second fine movement stage position measurement system 110B is equipped with measurement arm 71B (refer to FIG. 1) which is inserted within a space provided inside coarse movement stage WCS, in a state where wafer stage WST2 is placed below alignment detection system ALG.

Measurement arm 71B, as shown in FIG. 1, has an arm member $71_2$ which is supported by main frame BD via support member 72B in a cantilevered state, and an encoder head (optical system) which will be described later on housed inside arm member $71_2$. While the length of arm member $71_2$ is longer than arm member $71_1$ previously described, measurement arm 71B is structured substantially similar to measurement arm 71A previously described, as a whole.

As previously described, in the state where wafer stage WST2 is placed below alignment detection system ALG, as shown in FIG. 1, the tip of arm member $71_2$ of measurement arm 71B is inserted into the space of coarse movement stage WCS, and its upper surface faces grating RG (not shown in FIG. 1, refer to FIG. 3B and the like) provided on the lower surface of fine movement stage WFS (wafer table WTB) (to be more precise, the lower surface of main section 81). The upper surface of arm member $71_2$ is placed almost parallel to the fine movement stage WFS lower surface, in a state where a predetermined clearance gap (gap, clearance), such as for example, a gap of around several mm, is formed between the upper surface of arm member $71_2$ and the lower surface of fine movement stage WFS.

The second back side encoder system 70B, as shown in FIG. 7, includes a three-dimensional encoder 75a which measures the position of fine movement stage WFS in each of the X-axis, the Y-axis and the Z-axis directions, an XZ encoder 75b which measures a position of fine movement stage WFS in the X-axis and the Z-axis directions, and a YZ encoder 75c which measures a position of fine movement stage WFS in the Y-axis and the Z-axis directions, similarly to the first back side encoder system 70A previously described.

XZ encoder 75b and YZ encoder 75c are equipped, respectively, with a two-dimensional head whose measurement direction is in the X-axis and the Z-axis directions, and a two-dimensional head whose measurement direction is in the Y-axis and the Z-axis directions, each housed inside of arm member $71_2$. Hereinafter, for the sake of convenience, the two-dimensional heads that XZ encoder 75b and YZ encoder 75c respectively equipped with will be expressed as an XZ head 75b and a YZ head 75c, using the same reference signs as the respective encoders. Three-dimensional encoder 75a is equipped with a three-dimensional head whose measurement direction is in the X-axis, the Y-axis and the Z-axis directions. Hereinafter, for the sake of convenience, the three-dimensional head that three-dimensional encoder 75a is equipped with will be expressed as a three-dimensional head 75a, using the same reference sign of the encoder. As two-dimensional heads 75b and 75c and three-dimensional head 75a, heads having structures similar to two-dimensional heads 73b and 73c and three-dimensional head 73a previously described can be used.

Three-dimensional head 75a and two-dimensional heads 75b and 75c are placed in a symmetrical, but similar positional relation to three-dimensional head 73a and two-dimensional heads 73b and 73c previously described, inside of arm member $71_2$. The detection center of three-dimensional head 75a is located right under the alignment position, that is, coincides with the detection center of alignment detection system ALG in a planar view.

The output of the encoders 75a and 75b and 75c of the second back side encoder system 70B is supplied to main controller 20 (refer to FIGS. 6, 7 and the like).

Main controller 20 performs position measurement of wafer table WTB2 in the directions of six degrees of freedom similar to the previously-described one, when wafer stage WST2 is positioned at measurement station 300, such as for example, at the time of wafer alignment which will be described later on, based on measurement values of heads 75a to 75c of the second back side encoder system 70B. The preceding description can be applied without any changes to the position measurement in this case, if the exposure position previously described is replaced to the alignment position.

Incidentally, in the present embodiment, the detection point of three-dimensional head 75a is located right under the alignment position, and the position of fine movement stage WFS in the X-axis, the Y-axis and the Z-axis directions is measured at that detection point Further, because the substantial detection points on grating RG in the X-axis, the Y-axis and the Z-axis directions by the second back side encoder system 70B each coincide with the detection center (alignment position) of alignment detection system ALG in a planar view, generation of the so-called Abbe error is suppressed to a level which can be substantially ignored. Accordingly, by using the second back side encoder system 70B, main controller 20 can measure the position of fine movement stage WFS in the X-axis direction, the Y-axis direction and the Z-axis direction with high precision, without the Abbe error.

Next, a structure and the like of the second top side encoder system 80B structuring a part of the second fine movement stage position measurement system 110B will be described. The second top-side encoder system 80B can measure position information of wafer table WTB2 (fine movement stage WFS) in the directions of six degrees of freedom concurrently with the second back side encoder system 70B.

In exposure apparatus 100, for example as shown in FIG. 2, on the −Y side of each of head sections 62C and 62A and at almost the same Y position as alignment detection system ALG, head sections 62E and 62F are placed, respectively. Head sections 62E and 62F, as described later on, each include a plurality of heads, and these heads are fixed to main frame BD in a suspended state via a support member.

Head sections 62F and 62E, as shown in FIG. 5, are equipped with five four-spindle heads $68_1$ to $68_5$, and five $67_1$ to $67_5$, respectively. Inside the respective housings of four-spindle heads $68_1$ to $68_5$, similar to four-spindle heads $65_1$ to $65_4$ and the like previously described, XZ heads $68X_1$ to $68X_5$ and YZ heads $68Y_1$ to $68Y_5$ are housed. Similarly, inside the respective housings of four-spindle heads $67_1$ to $67_5$, XZ heads $67X_1$ to $67X_5$ and YZ heads $67Y_1$ to $67Y_5$ are housed. As each of the XZ heads $68X_1$ to $68X_5$ and $67X_1$ to $67X_5$, and YZ heads $68Y_1$ to $68Y_5$ and $67Y_1$ to $67Y_5$, an encoder head having a structure similar to the displacement measurement sensor head disclosed in, for example, U.S. Pat. No. 7,561,280 can be used.

XZ heads $67X_1$ to $67X_5$ and $68X_1$ to $68X_5$ (to be more precise, irradiation points on scales $39_1$ and $39_2$ of the measurement beams generated by XZ heads $67X_1$ to $67X_5$ and $68X_1$ to $68X_5$) are placed along reference axis LA previously described, at almost the same X positions as XZ heads $64X_1$ to $64X_5$ and $65X_1$ to $65X_5$, respectively.

YZ heads $67Y_1$ to $67Y_5$ and $68Y_1$ to $68Y_5$ (to be more precise, irradiation points on scales $39_1$ and $39_2$ of the measurement beams generated by YZ heads $67Y_1$ to $67Y_5$ and $68Y_1$ to $68Y_5$) are placed on a straight line $LA_1$ which is parallel to reference axis LA and is distanced to the −Y side from reference axis LA, at almost the same X position as the corresponding XZ heads $67X_1$ to $67X_5$ and $68X_1$ to $68X_5$. Hereinafter, as necessary, XZ heads $68X_1$ to $68X_5$ and $67X_1$ to $67X_5$, and YZ heads $68Y_1$ to $68Y_5$ and $67Y_1$ to $67Y_5$ will be expressed also as XZ heads 68x and 67X, and YZ heads 68Y and 67Y, respectively.

Using scales $39_1$ and $39_2$ respectively, head sections 62F and 62M structure a multiple-lens (five-lens in this case) XZ linear encoder which measures the X position and the Z position of wafer table WTB2, and a multiple-lens (five-lens in this case) YZ linear encoder which measures the Y position and the Z position. Hereinafter, for the sake of convenience, these encoders will be expressed as XZ linear encoders 68X and 67X and YZ linear encoders 68Y and 67Y (refer to FIG. 7), using the same reference signs as XZ heads 68X and 67X, and YZ heads 68Y and 67Y, respectively.

In the present embodiment, XZ linear encoders 68X and YZ linear encoders 68Y structure (refer to FIG. 7) a multiple-lens (five-lens in this case) four-spindle encoder 68 which measures position information of wafer table WTB2 related to each of the X-axis, the Y-axis, the Z-axis and the θx directions. Similarly, XZ linear encoders 67X and YZ linear encoders 67Y structure (refer to FIG. 7) a multiple-lens (five-lens in this case) four-spindle encoder 67 which measures position information of wafer table WTB2 related to each of the X-axis, the Y-axis, the Z-axis and the θx directions.

Here, for the similar reason to the previously-described reason, on alignment measurement and the like, at least one head each of the five XZ heads 68X, the five XZ heads 67X, the five YZ heads 68Y and the five YZ heads 67Y constantly faces (irradiates a measurement beam on) the corresponding scales $39_1$ and $39_2$. Accordingly, four-spindle encoder 68 and four-spindle encoder 67 structure the second top side encoder system 80B which measures position information in the directions of six degrees of freedom of wafer table WTB2 (fine movement stage WFS) supported by coarse movement stage WCS, in the case when wafer stage WST2 is at measurement station 300.

Measurement values of each encoder structuring the second top side encoder system 80B are supplied to main controller 20 (refer to FIGS. 6, 7 and the like).

As is obvious from the description so far, in the present embodiment, in the case when wafer stage WST2 is at measurement station 300, position information in the directions of six degrees of freedom of wafer table WTB2 (fine movement stage WFS) supported by coarse movement stage WCS can be measured concurrently by the second back side encoder system 70B and the second to side encoder system 80B.

In the case when wafer stage WST1 is at measurement stage 300, the second back side encoder system 70B that measures position information of wafer table WTB1 in the directions of six degrees of freedom is structured, similarly to the above-described manner, by three-dimensional head 75a, XZ head 75b and YZ head 75c that each irradiate a measurement beam on grating AG on the rear surface of wafer table WTB1. Further, in this case, the second top side encoder system 80B that measures position information of wafer table WTB1 (fine movement stage WFS) supported by coarse movement stage WCS in the directions of six degrees of freedom is structured, similarly to the above-described manner, by five-lens four-spindle encoder 68 and five-lens four-spindle encoder 67 each structured by the five four-spindle heads that head sections 62F and 62E respectively have, which irradiate measurement beams on the pair of scales $39_1$ and $39_2$, respectively, on the upper surface of wafer table WTB1.

That is, in the present embodiment, regardless of which of wafer stage WST1 or WST2 is at measurement station 300, the second back side encoder system 70B which measures position information in the directions of six degrees of freedom of fine movement stage WFS is structured by heads 75a to 75c incorporated in arm member $71_2$ facing grating RG equipped on fine movement stage WFS supported by coarse movement stage WCS located in measurement station 300, and the second top side encoder system 80B which measures position information in the directions of six degrees of freedom of fine movement stage WFS is structured by head sections 62A and 62C facing the pair of scale $39_2$ and $39_2$, respectively, equipped on fine movement stage WFS supported by coarse movement stage WCS located in measurement station 300.

However, the second top side encoder system 80B and the second back side encoder system 70B have the merits and demerits similar to those of the first top side encoder system 80A and the first back side encoder system 70A described previously.

Therefore, in the present embodiment, when wafer stage WST1 or WST2 is positioned at measurement station 300 including the time of alignment to be described later on, main controller 20 performs measurement of position information of fine movement stage WFS (wafer table WTB1 or WTB2) concurrently by the second back side encoder system 70B and the second top side encoder system 80B, and performs position control of wafer table WTB1 or WTB2 based on the position information having higher reliability. In the description below, as an example, the position control of wafer table WTB1 or WTB2 is to be performed, based on the position information measured by the second back side encoder system 70B for the X-axis, the Y-axis and the Z-axis directions, and based on the position information measured by the second top side encoder system 80B for the θx, the θy and the θz directions.

Incidentally, regarding the second back side encoder system 70B and the second top side encoder system 80B of the second fine movement stage position measurement system 110B, besides the details described so far, the preceding description about the first back side encoder system 70A and the first top side encoder system 80A can be applied without any changes.

In the present embodiment, a third top side encoder system 80C is also provided (refer to FIG. 6) that measures position information of measurement table MTB in the directions of six degrees of freedom of when measurement table MTB (measurement stage MST) moves from a standby position shown in FIG. 2 to a scrum position to be described later on, or reversely, when measurement table MTB returns from the scrum position to the standby position. The third top side encoder system 80C, as shown in FIG. 2, includes a pair of four-spindle heads $66_1$ and $66_2$ placed adjacent to each other in the X-axis direction at a position capable of facing two-dimensional grating 69 (refer to FIG. 4B) provided at measurement table MTB of measurement stage MST located at the standby position, a pair of four-spindle heads $66_3$ and $66_4$ placed a predetermined distance away to the −Y direction from the pair of four-spindle heads $66_1$ and $66_2$, and a pair of four-spindle heads $66_5$ and $66_6$ placed adjacent to each other in the X-axis direction at a position halfway between the pair of four-spindle heads $66_3$ and $66_4$ and the two four-spindle heads $64_4$ and $64_5$ of head section 62C described previously.

The pair of four-spindle heads $66_1$ and $66_2$, the pair of four-spindle heads $66_3$ and $66_4$ and the pair of four-spindle heads $66_5$ and $66_6$ are each fixed to main frame BD in a suspended state via a support member.

Each of four-spindle heads $66_1$, $66_2$, $66_3$, $66_4$, $66_5$ and $66_6$ includes one XZ head and one YZ head having detection points placed along the Y-axis direction, similarly to four-spindle heads 64, 65, 67 and 68 described previously. The pair of four-spindle heads $66_1$ and $66_2$, the pair of four-spindle heads $66_3$ and $66_4$ and the pair of four-spindle heads $66_5$ and $66_6$ each structure a pair of four-spindle encoders that measure position information of measurement table MTB in the directions of six degrees of freedom using two-dimensional grating 69 provided at measurement table MTB. These three pairs of four-spindle encoders structure the third top side encoder system 80C. The measurement values of each of the encoders that structure the third top side encoder system 80C are supplied to main controller 20 (refer to FIG. 6 and the like).

The third top side encoder system 80C and a plurality of encoder systems structured by heads 73a to 73c described previously, that measurement arm 71A has, which irradiate measurement beams on grating RGa on the rear surface of measurement table MTB, structure a measurement table position measurement system 16 (refer to FIG. 6). Incidentally, measurement table position measurement system 16 does not necessarily have to have heads 73a to 73c described previously, and for example, can have only the third top side encoder system 80C. In this case, it is also possible that the placement (position) of the heads shown in FIG. 2 is changed or at least one head is added, thereby allowing position information of measurement stage MST to be measured by the third top side encoder system 80C during the scrum operation described previously as well.

In the present embodiment, further, measurement system 80D is provided (refer to FIG. 6) that is used to measure a position within the XY plane of wafer stage WST1 or WST2 that is moving, when wafer stage WST1 or WST2 moves between measurement station 300 and exposure station 200. This measurement system 80D has a plurality of Hall elements placed at a predetermined interval within an area between reference axis LH and reference axis LA inside base board 12. Measurement system 80D measures the approximate position within the KY plane of wafer stage WST1 or WST2, using a change in magnetic field occurring by magnets provided on the bottom surfaces of each coarse movement stage WCS when wafer stage WST1 or WST2 moves within the XY plane. Measurement information of this measurement system 80D is supplied to main controller 20 (refer to FIG. 6). Incidentally, a measurement device that measures position information of wafer stage WST1 or WST2 in a range where measurement of the position information of wafer stage WST1 or WST2 by the first and the second fine movement stage position measurement systems 110A and 110B cannot be performed, that is, a range outside the measurement ranges described previously is not limited to measurement system 80D, and for example, an interferometer system or an encoder system that employs a same detection method and/or a same structure as or a different detection method and/or a different structure from the first and the second top side encoder systems described previously can be used.

Besides this, in exposure apparatus 100, an exposure coordinate setting measurement system 34 (refer to FIG. 6) is placed at a position in the vicinity of exposure station 200, and measures an absolute coordinate of wafer table WTB1 or WTB2 for origin return of the third fine movement stage position measurement system 110C at the point when wafer stage WST1 or WST2 moves from a measurement station 300 side to an exposure station 200 side and wafer table WTB1 or WTB2 comes in proximity to or contact with measurement table MTB, as it will be described later on. As it will be described later on, origin return of the first back side encoder system 70A and the first top side encoder system 80A of the first fine movement stage position measurement system 110A is performed, using measurement values of the third fine movement stage position measurement system 110C on which origin return (reset) has been performed.

Exposure coordinate setting measurement system 34, as shown in FIG. 2, includes a pair of imaging sensors 36a and 36b, which are placed at positions a predetermined distance away to the −Y side (for example, a distance of around one third of the Y-axis direction length of wafer table WTB1) of head sections 62A and 62C, set apart on the +X side and the −X side of reference axis LV by a same distance from reference axis LV which is slightly shorter than half the length in the X-axis direction of wafer table WTB1, a pair of Z sensors 38a and 38b which are placed adjacent on the +Y side of the pair of imaging sensors 36a and 36b, respectively, and a Z sensor 38c which is placed set apart to the −Y side of Z sensor 38a, for example, by a distance of around half the length in the Y-axis direction of wafer table WTB1. These imaging sensors 36a and 36b, and Z sensors 38a to 38c are each fixed in a suspended state to main frame BD via a support member.

The pair of imaging sensors 36a and 36b image marks previously described which are each provided on the edge on both sides in the X-axis direction of wafer table WTB1 (or WTB2) when wafer table WTB1 (or WTB2) is at a predetermined position, in this case, a position where a proximity or contact state to be described later with respect to measurement table MTB (scrum) begins (scrum starting position), and measures the X and the Y positions of the marks subject to imaging, with the detection center serving as a reference. Z sensors 38a to 38c, for example, are made up of heads of optical displacement sensors similar to optical pick-ups used in CD driving devices and the like and each measure the Z position of the upper surface of wafer table WTB1 (or WTB2). Measurement values of such imaging sensors 36a and 36b and Z sensors 38a to 38c are supplied to main controller 20.

Accordingly, main controller 20 performs origin return of the third fine movement stage position measurement system 110C, by measuring the position in the directions of six degrees of freedom of wafer table WTB1 or WTB2 simultaneously with exposure coordinate setting measurement system 34 and the third fine movement stage position measurement system 110C, and re-setting the measurement values of a pair of encoders made up of the pair of four-spindle heads $65_6$ and $64_6$ that structure the third fine movement stage position measurement system 110C, using the measurement values (absolute positions) of imaging sensors 36a and 36b and Z sensors 38a to 38c. Then, after such operation, by making the origin return of the first back side encoder system 70A and the first top side encoder system 80A of the first fine movement stage position measurement system 110A which measures the position, in the directions of six degrees of freedom, of wafer table WTB1 (or WTB2) located at exposure station 200, with the measurement values of the third fine movement stage position measurement system 110C after the origin return serving as a reference, a coordinate system which controls the position of wafer table WTB1 (or WTB2) at the time of exposure (exposure-time coordinate system) can be returned.

In exposure apparatus 100, further, a measurement coordinate setting measurement system 35 (refer to FIG. 6) is provided that is placed at a position in the vicinity of measurement station 300, and measures an absolute coordinate of wafer table WTB2 or WTB1 when wafer stage WST2 or WST1 moves to a loading position to be described later on, for origin return of the second back side encoder system 70B and the second top side encoder system 70B of the second fine movement stage position measurement system 110B.

Measurement coordinate setting measurement system 35, as shown in FIG. 2, includes a pair of imaging sensors 36c and 36d which are placed at positions a predetermined distance away to the −Y side of head sections 62F and 62E, set apart from reference axis LV by a same distance which is slightly shorter than half the length in the X-axis direction of wafer table WTB2, a pair of Z sensors 38d and 38e which are placed adjacent on the +Y side of the pair of imaging sensors 36c and 36d, respectively, close to the −Y side of head sections 62F and 62E, and a Z sensor 38f which is placed set apart to the −Y side of Z sensor 38d, for example, by a distance of around half the length in the Y-axis direction of wafer table WTB2. These imaging sensors 36c and 36d and Z sensors 38d to 38f are each fixed in a suspended state to main frame BD via a support member.

The pair of imaging sensors 36c and 36d image the marks previously described each provided on the edge on both sides in the X-axis direction of wafer table WTB2 (or WTB1), and measures the X and the Y positions of the marks subject to imaging, with the detection center serving as a reference. Z sensors 38d to 38f, for example, are made up of heads of optical displacement sensors similar to Z sensors 38a to 38c previously described, and each measure the Z position of the upper surface of wafer table WTB2 (or WTB1). Measurement values of such imaging sensors 36c and 36d and Z sensors 38d to 38f are supplied to main controller 20.

Accordingly, by main controller 20 simultaneously measuring the position of wafer table WTB2 or WTB1 using measurement coordinate setting measurement system 35 and the second fine movement stage position measurement system 110B when wafer stage WST2 or WST1 moves to a loading position to be described later on, and making the origin of the second back side encoder system 70B and the second top side encoder system 80B of the second fine movement stage position measurement system 110B return using the measurement values (absolute positions) of imaging sensors 36c and 36d and Z sensors 38d to 38f, return of a coordinate system, which controls a position of wafer table WTB2 (or WTB1) located at measurement station 300 at the time when a series of measurements to be described later including alignment measurement and the like are performed (measurement-time coordinate system), becomes possible.

In exposure apparatus 100 of the present embodiment, as shown in FIG. 5, an unloading position UP1 is set at a predetermined position between the exposure position and the alignment position on reference axis LV, as an example, at a position away from alignment detection system ALG by a predetermined distance on reference axis LV, for example, a distance of around two thirds of the Y-axis direction length of wafer table WTB2 to the +Y direction, and waiting positions UP2 and UP3 are set at positions the same predetermined distance away to the side and the −X side from unloading position UP1, respectively.

At unloading position UP1, a first unloading slider (not shown) is provided made up of an arm member which approaches from above wafer W that has been exposed and is supported above the wafer holder by the vertical movement pin previously described, grasps the side surface of the wafer at a plurality of places, and lifts the wafer upward. The first unloading slider can hold the wafer in a non-contact state with the surface of the wafer. The first unloading slider is attached to main frame BD via a vibration isolation member which is not shown.

At wafer waiting position UP2, a second unloading slider (not shown) is provided that receives from below wafer W held by the first unloading slider and holds the wafer, and is vertically movable and can carry the wafer to a delivery position of the wafer to an external device through a path at the edge on the +X side above base board 12. Similarly, at wafer waiting position UP3, a third unloading slider (not shown) is provided which receives from below wafer W held by the first unloading slider and holds the wafer, and is vertically movable and can carry the wafer to a delivery position of the wafer to an external device through a path at the edge on the −X side above base board 12. The second and the third unloading sliders are supported by another frame which is vibrationally separated from main frame BD.

Incidentally, a device used to unload the wafer is not limited to the structure described above, and any device that can move holding wafer W may be employed. Further, the unloading position of wafer W is not limited to being set between projection optical system PL and alignment detections system ALG, and for example, the unloading can be performed on a side opposite to projection optical system PL with respect to alignment detection system ALG as in a modified example to be described later on.

Further, in the present embodiment, as shown in FIG. 2, loading position LP is set at a position where fiducial mark FM on measurement plate 30 is positioned in the field (detection area) of alignment detection system ALG (that is, a position where the first half processing of the baseline measurement (BCHK) of alignment detection system ALG is performed).

FIG. 6 shows a block diagram showing an input/output relation of main controller 20 which mainly structures a control system of exposure apparatus 100 and has overall control over each structuring parts. Main controller 20 includes a workstation (or a microcomputer) and the like, and has overall control over each of the parts that structure exposure apparatus 100. FIG. 7 shows an example of a concrete structure of the first and the second fine movement stage position measurement systems 110A and 110B in FIG. 6.

Next, a concurrent processing operation using wafer stages WST1 and WST2 and measurement stage MST in exposure apparatus 100 related to the present embodiment will be described, based on FIGS. 9 to 20. Incidentally, in the following operation, main controller 20 performs control of liquid supply device 5 and liquid recovery device 6 of local liquid immersion device 8 as is previously described, and water is constantly filled in an area right under tip lens 191 of projection optical system PL. However, in the description below, for a straightforward description, description related to the control of liquid supply device 5 and liquid recovery device 6 will be omitted. Further, in FIGS. 9 to 20, the illustration of base board 12, tube carriers TC1 and TC2 and the like is omitted. Further, while a number of drawings will be used in the description on the operation hereinafter, the same member may or may not have a reference sign applied in each of the drawings. That is, although the reference sign written for each of the drawings may be different, these drawings show the same structure, regardless of the availability of reference signs. The same is said for each of the drawings used in the description so far. Further, in FIG. 9 and the subsequent drawings, measurement stage MST is shown simplified.

Further, when each head of the first and the second back side encoder systems 70A and 703 and the first to the third top side encoder systems 80A to 80C, the AF system, the alignment detection system and the like are used, or a little before their usage, their state is set from an OFF state to an ON state, but the description regarding this point will be omitted when describing the operation hereinafter.

Figure 9:
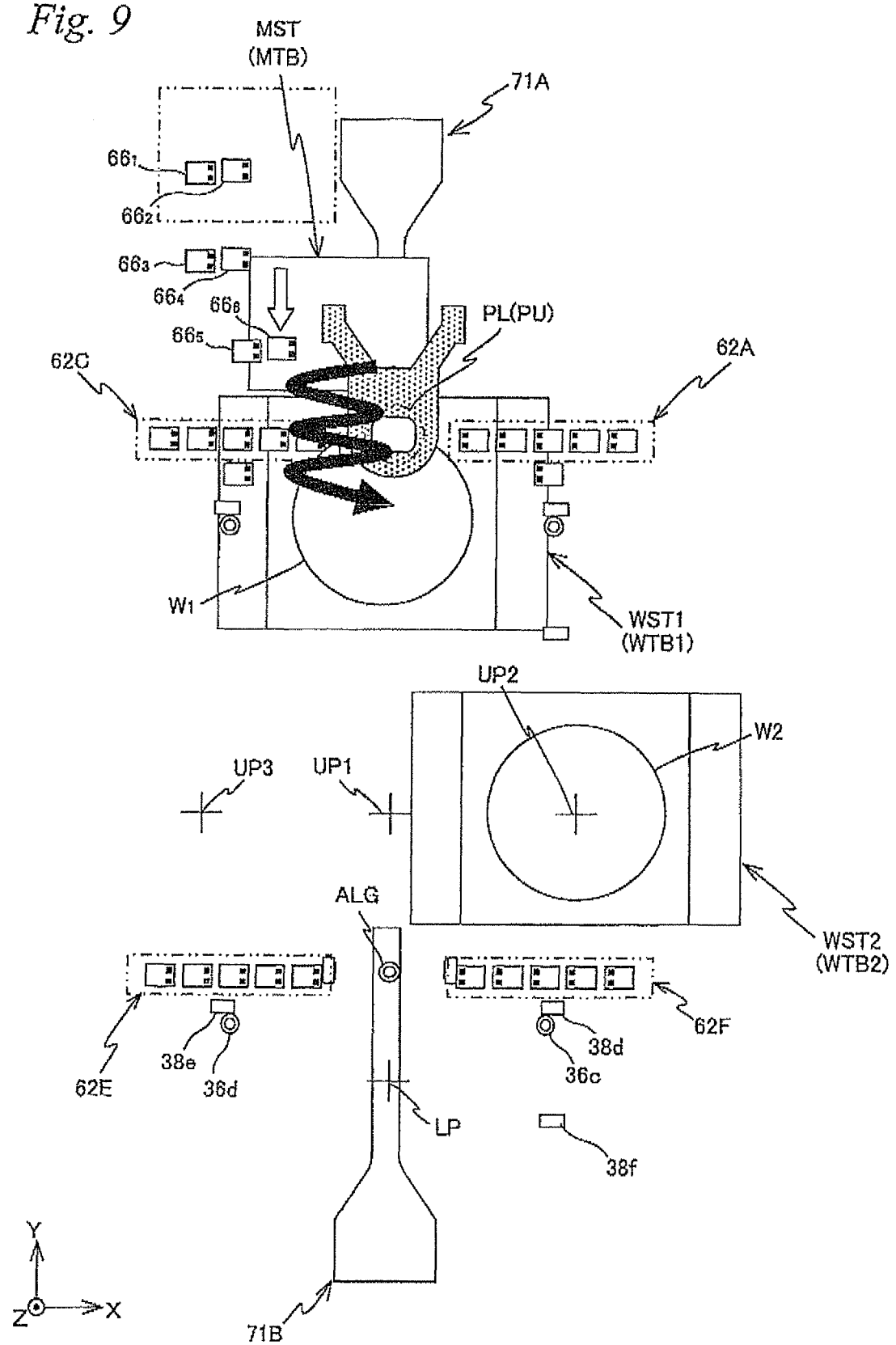
FIG. 9 is a view (No. 1) used to describe a concurrent processing operation using wafer stages WST1 and WST2 and measurement stage MST.

FIG. 9 shows a situation where wafer stage WST2 which holds a wafer before exposure (referred to as $W_2$) on which wafer alignment measurement and focus mapping to be described later have been completed waits at a predetermined standby position, and an area on the +X side half of a wafer held on wafer table WTB1 (refer to as $W_1$) is exposed while wafer stage WST1 is moved along a path shown by a black arrow in FIG. 9 by main controller 20. The exposure of the area on the +X side half of wafer $W_1$ is performed in the order of a shot area on the Y side to a shot area on the +Y side. Prior to this, exposure of the area on the −X side half of wafer $W_1$ is completed in the order of a shot area on the +Y side to the shot area on the −Y side, while being moved along a path as shown by a black arrow for wafer stage WST2 in FIG. 16. By this operation, at the point when exposure of all the shot areas of wafer $W_1$ has been completed, wafer stage WST1 returns to substantially the same position as the position before starting exposure. Incidentally, at this point in time, the position of wafer stage WST2 is controlled by main controller 20, based on the measurement values of measurement system 80D previously described.

While, in the present embodiment, the exposure order described above of the shot areas is employed, the total length of the path in which wafer stage WST moves for exposure, in the case when a wafer of the same size is exposed according to the same shot map, is not much different from a conventional liquid immersion scanner and the like, disclosed in, for example, U.S. Patent Application Publication No. 2008/0088843 and the like.

During the exposure described above, the measurement values of the first fine movement stage position measurement system 110A, namely, the measurement values of four-spindle heads 65 and 64 facing scales $39_1$ and $39_2$, respectively, or namely, position information (measurement values of the position) of wafer table WTB1 in the directions of six degrees of freedom measured by the first top side encoder system 80A previously described, and the position information (measurement values of the position) of wafer table WTB1 in the directions of six degrees of freedom measured by the first back side encoder system 70A are supplied to main controller 20, and based on the measurement value having higher reliability of the supplied measurement values, servo control of the position of wafer table WTB1 is performed by main controller 20. Further, control of the position in the Z-axis direction, the θy rotation, and the θx rotation of wafer table WTB1 (focus-leveling control of wafer W) during this exposure is performed based on results of the focus mapping (which will be described later on) performed in advance.

During the exposure operation by the step-and-scan method described above, when wafer stage WST1 moves in the X-axis direction, accompanying the movement, switching of heads of the first top side encoder system 80A (succession of measurement values between a plurality of heads) is performed. As described above, main controller 20 appropriately switches the encoder to be used of the first top side encoder system 80A according to the position coordinate of wafer stage WST1, and drives wafer stage WST1.

Concurrently with the exposure of shot areas on the +X side half of the wafer described above, a wafer having undergone exposure (refer to as $W_0$) which has been carried from waiting position UL3 to the delivery position prior to the exposure, is delivered to a wafer carrier system (not shown) to be carried outside the apparatus by a carrier robot not shown.

Concurrently with the exposure of the shot areas on the +X side half of wafer $W_1$ described above, main controller 20, furthermore, drives measurement stage MST within the XY plane, from a standby position shown by an imaginary line in FIG. 9 to a scrum position shown by a solid line, based on the measurement values of the third top side encoder system 80C. Main controller 20 performs the drive of measurement stage MST by switching the four-spindle heads of the third top side encoder system 80C. By this drive, wafer stage WST1 and measurement stage MST distanced from each other during exposure move into a state where wafer table WTB1 and measurement table MTB are in contact or proximity (also called a scrum state). When moving into this contact or proximity state, measurement stage MST engages with measurement arm 71A from the side (laterally). In order to allow this engagement of the measurement stage MST with measurement arm 71A from the side, measurement table MTB of measurement stage MST is supported in a cantilevered manner via support section 62 on slider section 60.

Figure 10:
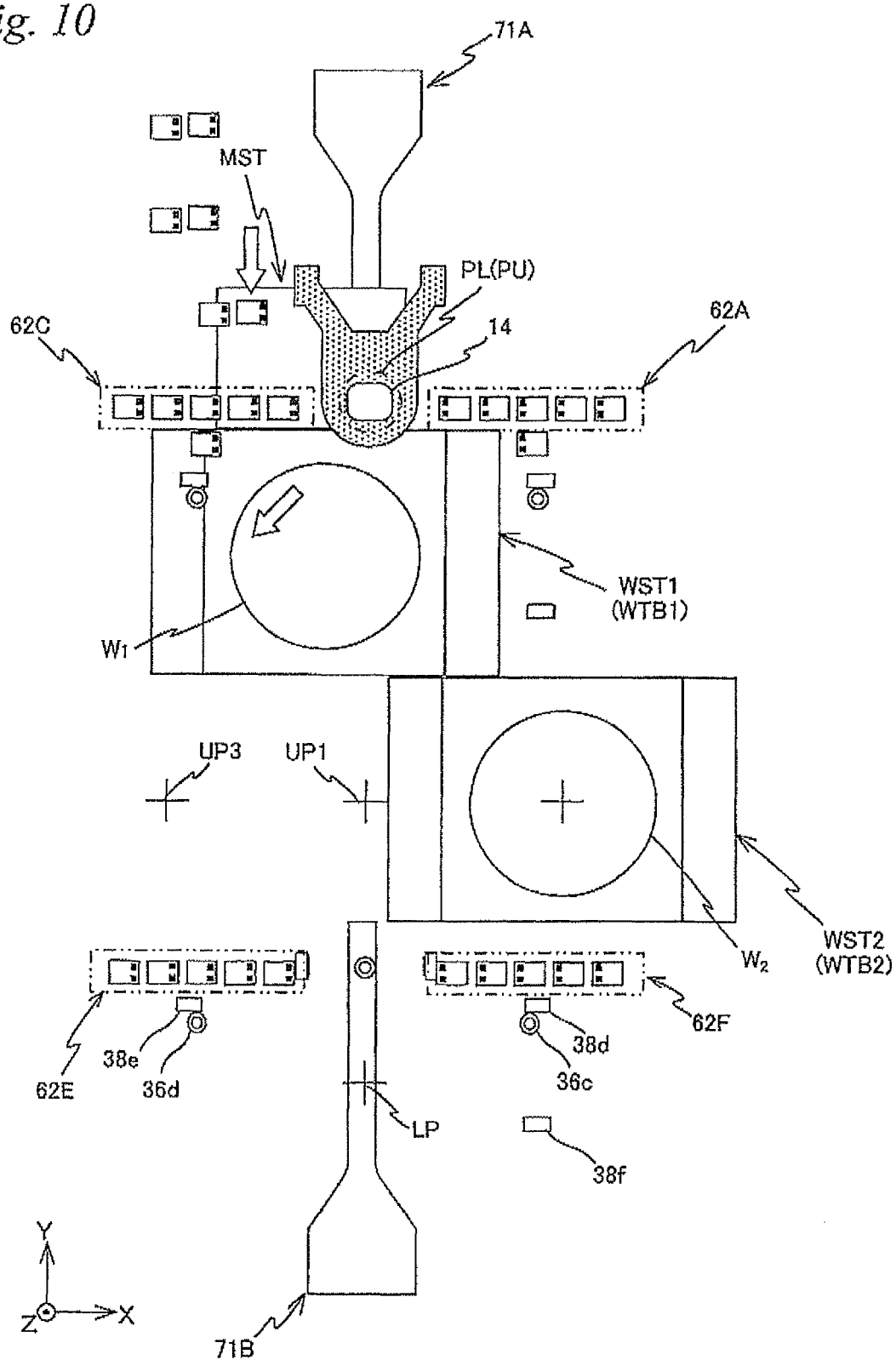
FIG. 10 is a view (No. 2) used to describe a concurrent processing operation using wafer stages WST1 and WST2 and measurement stage MST.

Then, main controller 20 moves measurement stage MST in the −Y direction and also moves wafer stage WST1 in the −Y direction as well as in the −X direction as is shown by two outlined arrows in FIG. 10, while maintaining the contact or proximity state of wafer table WTB1 and measurement table MTB described above. This moves (delivers) a liquid immersion area 14 (liquid Lq) formed below projection unit PU from wafer table WTB1 onto measurement table MTB, and liquid immersion area 14 (liquid Lq) is held by projection optical system PL and measurement table MTB. Further, the reason for moving wafer stage WST1 also in the −X direction in this operation, is that the next operation, namely, an exchanging operation of wafer stage WST1 and wafer stage WST2, can be started within a short time after the exposure has been completed.

At the stage when delivery of liquid immersion area 14 (liquid Lq) from wafer table WTB1 onto measurement table MTB described above has been completed, main controller 20 can control the position of measurement table MTB via measurement table driving system 52C (refer to FIG. 6), based on measurement values of the first back side encoder system 70A which uses grating RG provided on the rear surface of measurement table MTB. Accordingly, main controller 20 can perform measurement operations related to exposure that are necessary, while controlling the position in the directions of six degrees of freedom of measurement table MTB.

After moving into the contact or proximity state described above, just before movement of liquid immersion area 14 (liquid Lq) from wafer table WTB1 onto measurement table MTB is completed, wafer stage WST1 moves out of the measurement range of the first fine movement stage position measurement system 110A, and position measurement of wafer table WTB1 by the first top side encoder system 80A and the first back side encoder system 70A can no longer be performed. Just before this, main controller 20 switches the position measurement system used to control the position of wafer stage WST1 (wafer table WTB1) from the first fine movement stage position measurement system 110A to measurement system 80D previously described.

Figure 11:
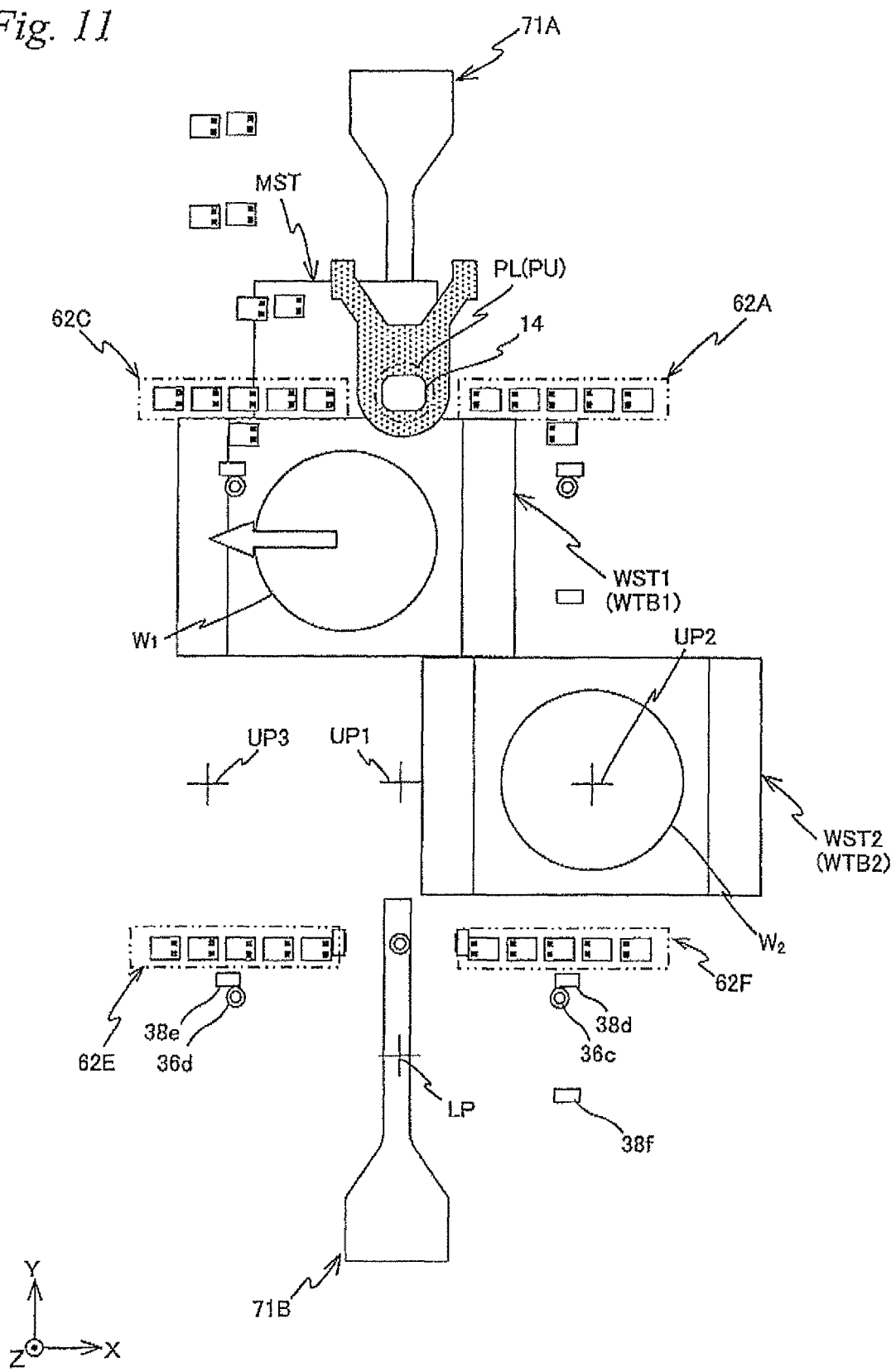
FIG. 11 is a view (No. 3) used to describe a concurrent processing operation using wafer stages WST1 and WST2 and measurement stage MST.

After that, as is shown by an outlined arrow in FIG. 11, main controller 20 drives wafer stage WST1 in the −X direction to a position where wafer stage WST1 no longer faces wafer stage WST2 (refer to FIG. 12) that is still waiting at the standby position previously described at this point in time.

Figure 12:
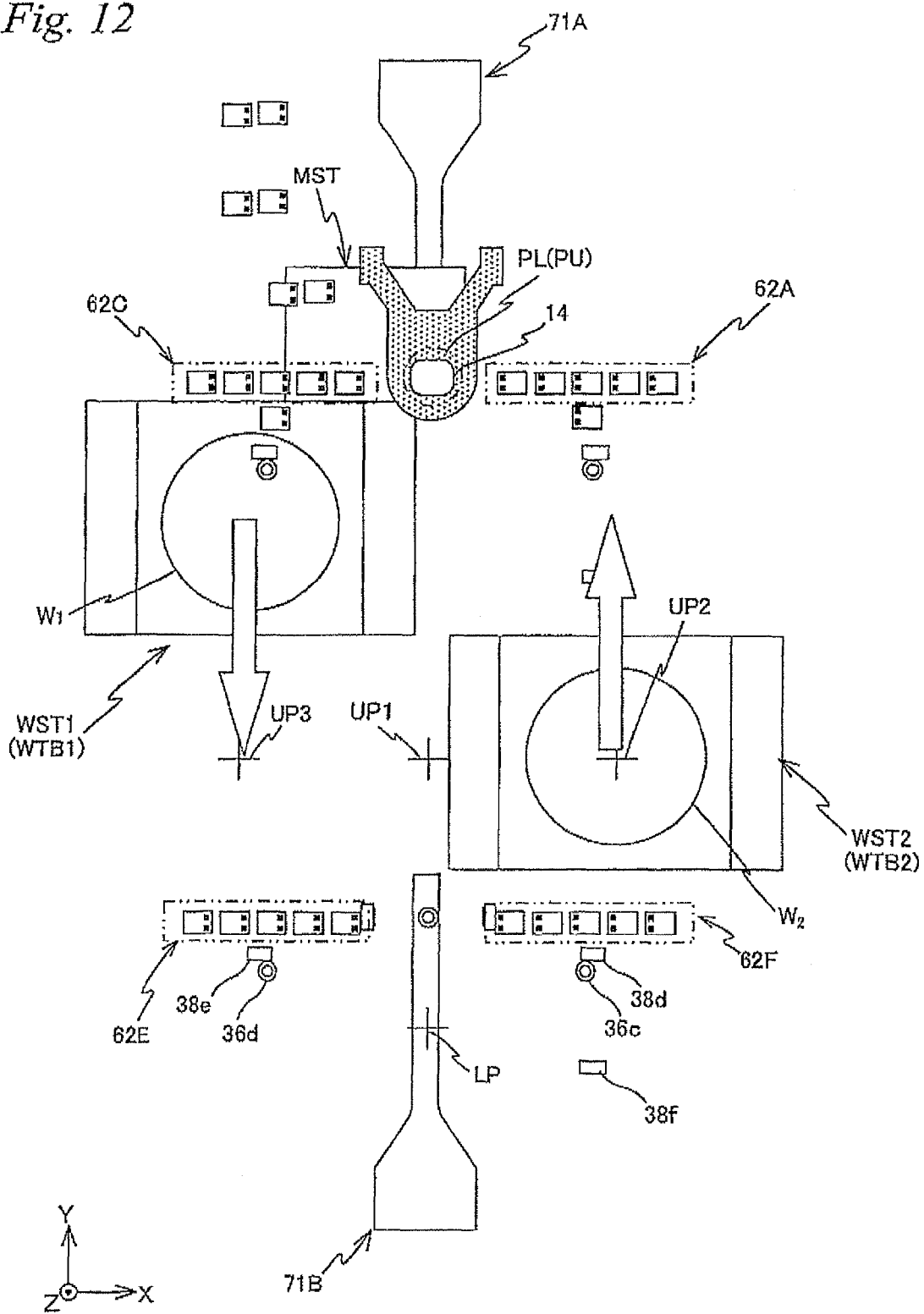
FIG. 12 is a view (No. 4) used to describe a concurrent processing operation using wafer stages WST1 and WST2 and measurement stage MST.

Next, main controller 20 drives wafer stage WST2 in the −Y direction concurrently with driving wafer stage WST1 in the −Y direction, as respectively shown by outlined arrows in FIG. 12. After the contact or proximity state previously described is released by this drive, wafer stage WST1 moves to below waiting position UP3 described previously. Concurrently with this, wafer stage WST2 moves to a position where the −X side edge of the −Y side surface of wafer table WTB2 is in contact or proximity in the Y-axis direction with/to the +X side edge of a −Y side surface of measurement table MTB which holds liquid immersion area 14 (liquid Lq) with projection optical system PL (refer to FIG. 13).

Figure 13:
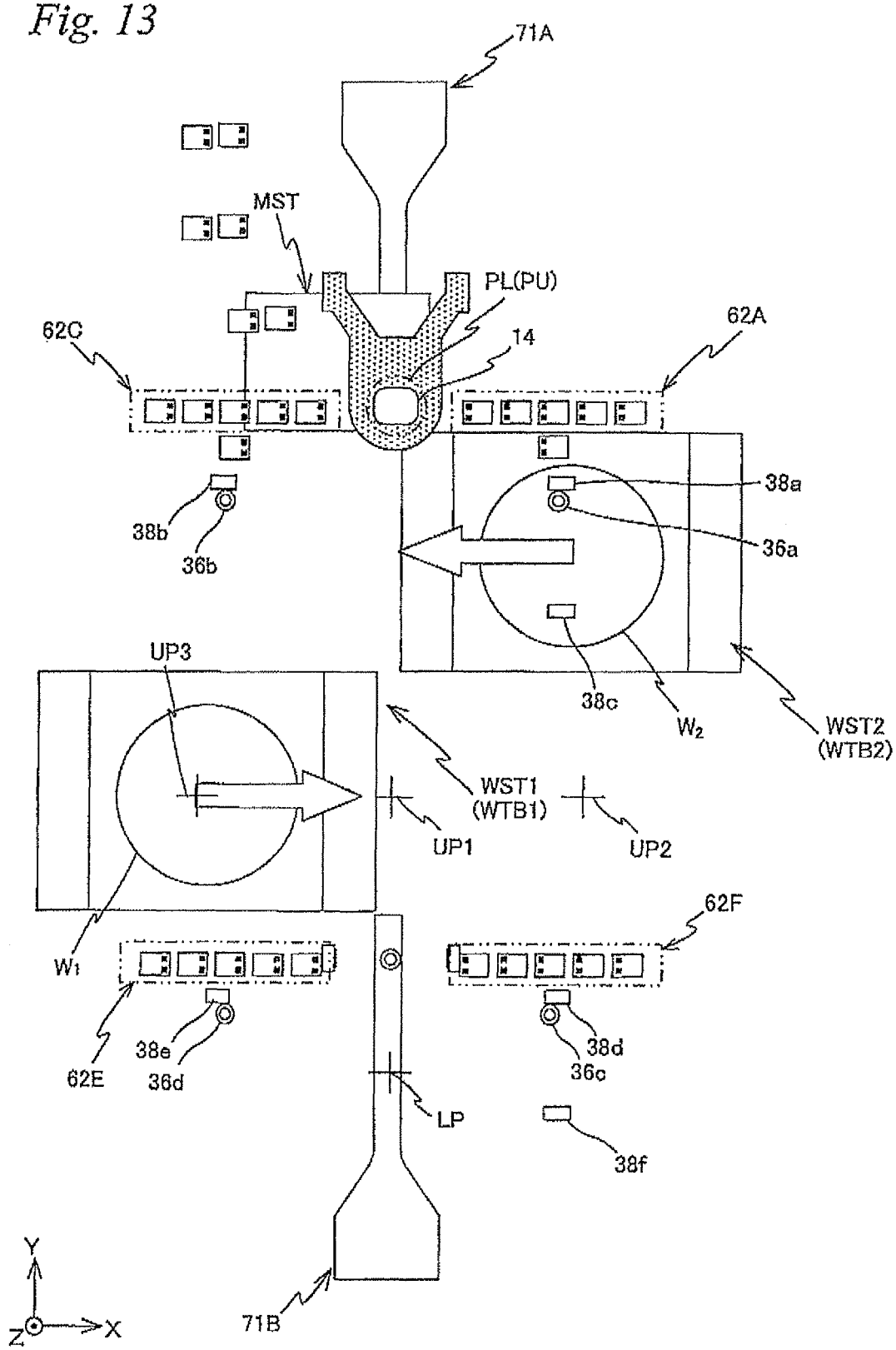
FIG. 13 is a view (No. 5) used to describe a concurrent processing operation using wafer stages WST1 and WST2 and measurement stage MST.

Next, as each shown by an outlined arrow in FIG. 13, main controller 20 drives wafer stage WST2 in the −X direction, concurrently with driving wafer stage WST1 in the +X direction. This moves wafer stage WST2 to a position where imaging sensors 36a and 36b and Z sensors 38a to 38c of exposure coordinate setting measurement system 34 simultaneously face wafer table WTB2, as well as moving wafer stage WST1 to unloading position UP1, from below waiting position UP3 (refer to FIG. 14).

Figure 14:
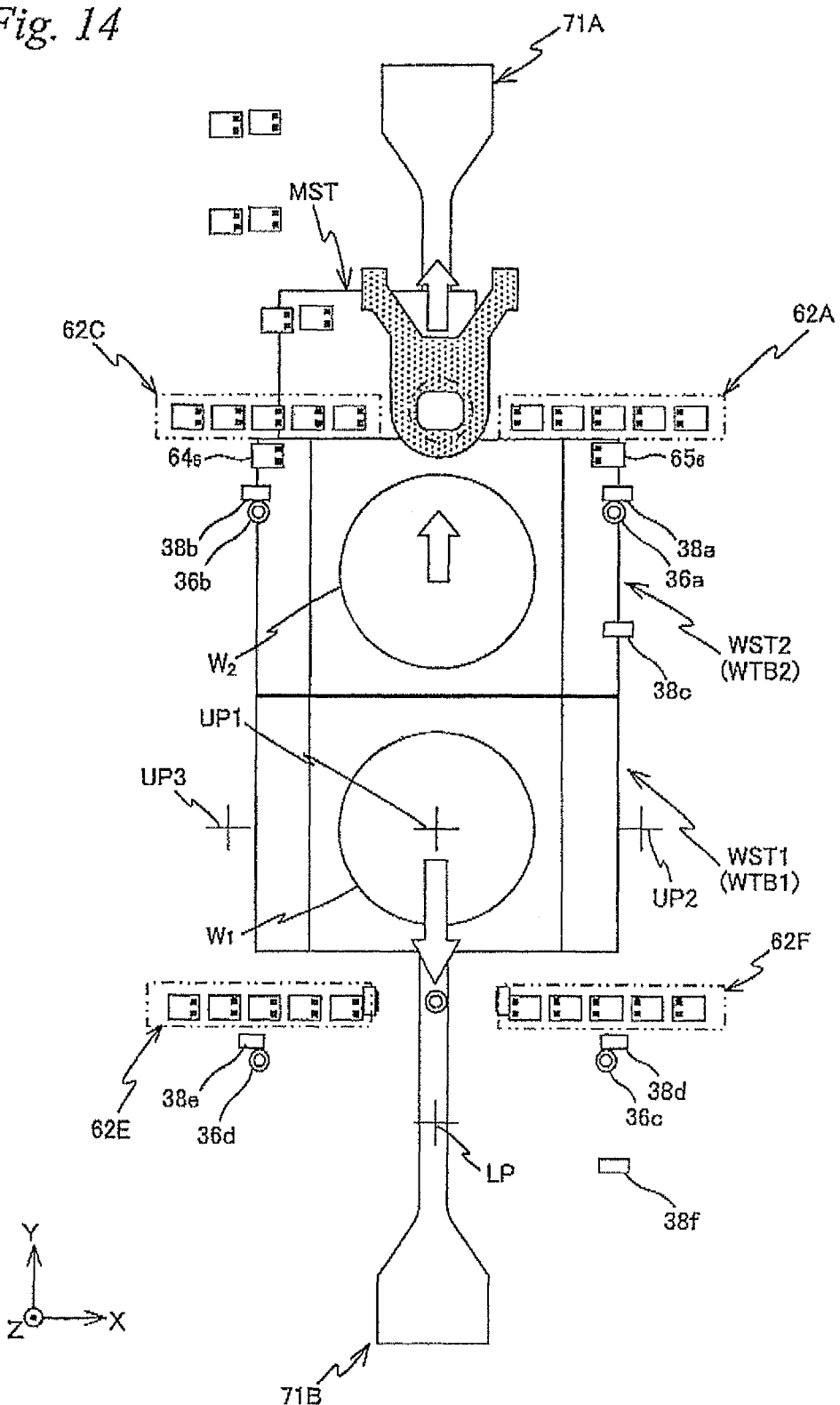
FIG. 14 is a view (No. 6) used to describe a concurrent processing operation using wafer stages WST1 and WST2 and measurement stage MST.

When wafer stage WST2 moves to the position shown in FIG. 14, main controller 20 temporarily switches the position measurement system used to control the position of wafer table WTB2 (wafer stage WST2) from measurement system 80D previously described to the third fine movement stage position measurement system 110C. That is, main controller 20 performs origin return of the third fine movement stage position measurement system 110C, by simultaneously measuring the position in the directions of six degrees of freedom of wafer table WTB2 with exposure coordinate setting measurement system 34 and the third fine movement stage position measurement system 110C, and re-setting the measurement values of a pair of encoders made up of the pair of four-spindle heads $65_6$ and $64_6$ structuring the third fine movement stage position measurement system 110C, using the measurement values (absolute positions) of exposure coordinate setting measurement system 34 (imaging sensors 36a and 36b and Z sensors 38a to 36c). Afterwards, the position of wafer table WTB2 is controlled based on the measurement values according to the third fine movement stage position measurement system 110C. Further, in a state where wafer stage WST2 is moved to the position shown in FIG. 14, wafer table WTB2 is in a contact or proximity state (scrum state) in the Y-axis direction with measurement table MTB for delivery of the liquid immersion area. That is, in the present embodiment, it is decided that origin return (reset of measurement values) of the third fine movement stage position measurement system 110C is to be performed at the scrum starting position of wafer table WTB2 with respect to measurement table MTB, and the mark previously described is provided at a predetermined position on wafer table WTB2 so that the origin return of the third fine movement stage position measurement system 110C can be performed at this scrum starting position.

In the present embodiment, in at least a part of a period after projection optical system PL and measurement table MTB begin to hold liquid immersion area 14 (liquid Lq) as previously described until the scrum of wafer table WTB2 with measurement table MTB begins, main controller 20, by using at least one of measurement members that measurement table MTB has, namely, illuminance irregularity sensor 95, aerial image measuring device 96, wavefront aberration measuring device 97 and illuminance monitor 98 that are previously described, can perform when necessary at least one measurement related to exposure in which illumination light IL is received via a light-receiving surface of each measuring device via projection optical system PL and liquid Lq, or in other words, at least one of an uneven illuminance measurement, an aerial image measurement, a wavefront aberration measurement and a dose measurement.

Meanwhile, when wafer stage WST1 reaches unloading position UP1, main controller 20 releases the suction by the wafer holder of wafer W which has been exposed, and drives the vertical movement pin (not shown) upward by a predetermined amount and lifts wafer $W_1$. The position of the vertical movement pin at this point is maintained until wafer stage WST1 reaches loading position LP, and the loading of the next wafer begins.

Then, main controller 20 lifts wafer $W_1$ using the first unloading slider by holding wafer $W_1$ from above as is previously described, and unloads wafer $W_1$ from wafer stage WST1. After that, wafer $W_1$ is maintained at the position above unloading position UP1 until wafer stage WST1 approaches loading position LP.

Next, main controller 20 drives wafer stage WST2 and measurement stage MST in the +Y direction as is shown by two outlined arrows pointing upward in FIG. 14, while maintaining the contact or proximity state of wafer table WTB2 and measurement table MTB. By this drive, liquid immersion area 14 (liquid Lq) formed below projection unit PU is moved (delivered) from measurement table MTB onto wafer table WTB2, and liquid immersion area 14 (liquid Lq) is to be held by projection optical system PL and wafer table WTB2 (refer to FIG. 15).

Figure 15:
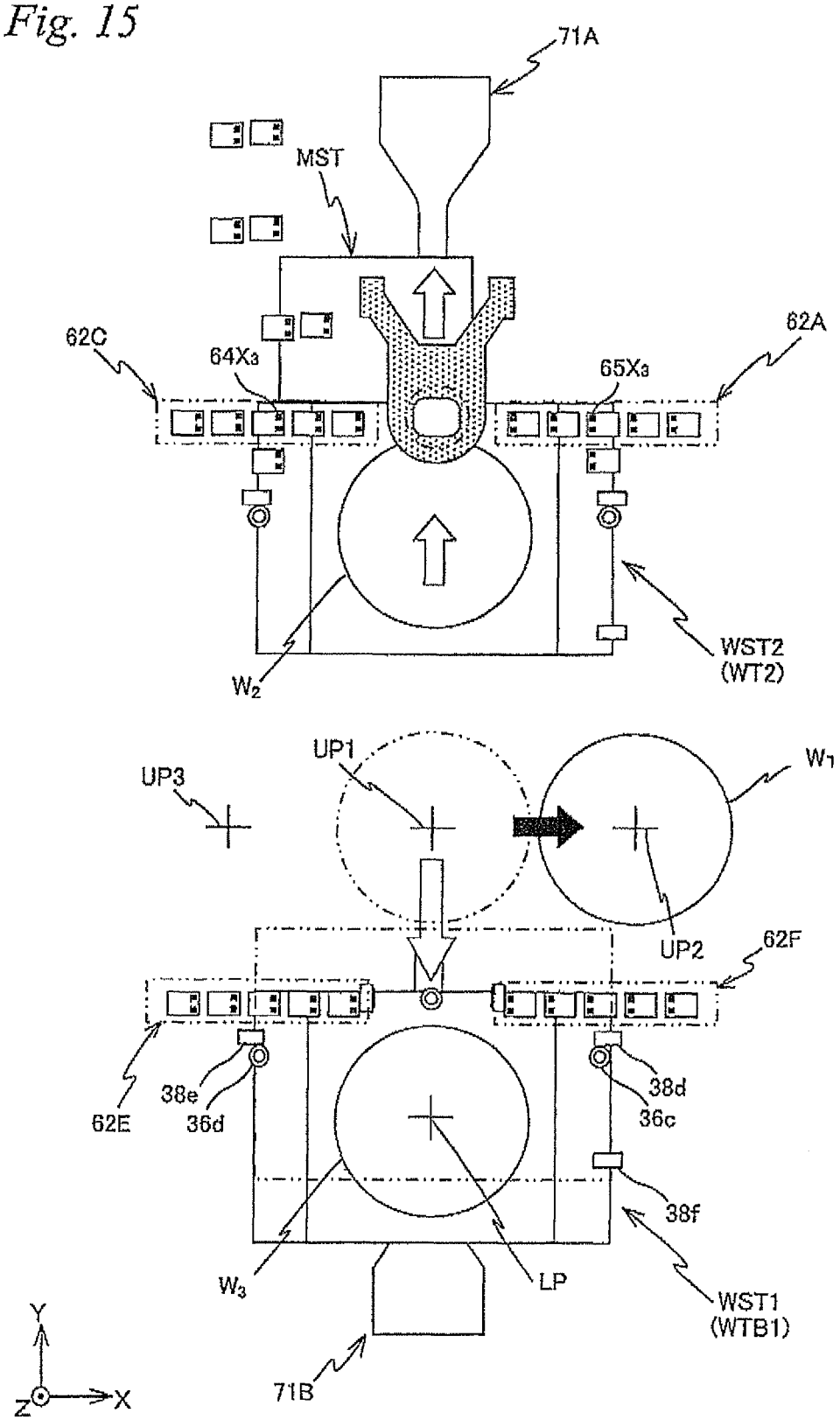
FIG. 15 is a view (No. 7) used to describe a concurrent processing operation using wafer stages WST1 and WST2 and measurement stage MST.

At the point when the delivery of liquid immersion area 14 described above has been completed, measurement arm 71A is inserted into a space of wafer stage WST2, and the rear surface (grating RG) of wafer table WTB2 faces heads 73a to 73c of measurement arm 71A, and head sections 62A and 62C face scale $39_1$ and $39_2$ (refer to FIG. 15). That is, the position of wafer table WTB2 can be measured by the third fine movement stage position measurement system 110C, as well as by the first fine movement stage position measurement system 110A. Therefore, main controller 20 re-sets the measurement values of the first back side encoder system 70A and the first top side encoder system 80A of the first fine movement stage position measurement system 110A, based on the position coordinate in the directions of six degrees of freedom of wafer table WTB2 measured by the third fine movement stage position measurement system 110C, so as to perform origin return of the first back side encoder system 70A and the first top side encoder system 80A. In the manner described above, return of the exposure-time coordinate system which controls the position of wafer table WTB2 that moves within exposure station 200 is performed. Incidentally, if the position in the directions of six degrees of freedom of wafer table WTB2 can be measured simultaneously by the first fine movement stage position measurement system 110A and exposure coordinate setting measurement system 34, the origins of the first back side encoder system 70A and the first top side encoder system 80A can be returned, according to a method similar to the origin return of the third fine movement stage position measurement system 110C previously described.

After the return of the exposure-time coordinate system described above, main controller 20 controls the position of wafer table WTB2, based on position information having higher reliability out of the position information from the first back side encoder system 70A and the position information from the first top side encoder system 80A.

Concurrently with the drive in the direction of wafer stage WST2 and measurement stage MST for the delivery of liquid immersion area 14 described above, main controller 20 drives wafer stage WST1 toward loading position LP. Halfway along this drive, position measurement of wafer stage WST1 (wafer table WTB1) by measurement system 80D can no longer be performed. Therefore, before wafer stage WST1 falls out of the measurement range by measurement system 80D, for example, at the point when wafer stage WST1 reaches the position shown by an imaginary line (two-dot chain line) in FIG. 15, main controller 20 switches the position measurement system used for the position control of wafer table WTB1 (wafer stage WST1) from measurement system 80D previously described to the second fine movement stage position measurement system 110B. That is, at the point when wafer stage WST1 has reached the position shown by the imaginary line (two-dot chain line) in FIG. 15, measurement arm 71B is inserted into a space of wafer stage WST1, and the rear surface (grating RG) of wafer table WTB1 faces heads 75a to 75c of measurement arm 71B, and head sections 62F and 62E face scales $39_1$ and $39_2$. Further, at this point in time, measurement of the absolute position in the directions of six degrees of freedom of wafer table WTB1 by measurement coordinate setting measurement system 35 is possible. Therefore, main controller 20 simultaneously measures the position in the directions of six degrees of freedom of wafer table WTB1, using measurement coordinate setting measurement system 35 and the second fine movement stage position measurement system 110B. And, similarly to the above-described manner, main controller 20 re-sets the measurement values of the second back side encoder system 70B and the second top side encoder system 80B of the second fine movement stage position measurement system 110B, based on the absolute position of wafer table WTB1, measured by measurement coordinate setting measurement system 35, so as to perform origin return of the second back side encoder system 70B and the second top side encoder system 80B. In the manner described above, return of the measurement-time coordinate system which controls the position of wafer table WTB1 that moves within measurement station 300 is performed.

Measurement coordinate setting measurement system 35 can measure the absolute position in the directions of six degrees of freedom of wafer table WTB1, and therefore, the switching from measurement system 80D to the second fine movement stage position measurement system 110B described above, namely, the return of the measurement-time coordinate system described above, can be performed within a short time.

After the return of the measurement-time coordinate system described above, main controller 20 sets the position of wafer stage WST1 to loading position LP, while controlling the position of wafer table WTB1 based on position information having higher reliability out of the position information from the second back side encoder system 70B and the position information from the second top side encoder system 80B (refer to FIG. 15).

When wafer stage WST1 is driven toward loading position LP and is moved away from unloading position UP1, wafer $W_1$ located above unloading position UP1 is moved to waiting position UP2, as typically shown by a black arrow in FIG. 15. This movement is performed by main controller 20 in the following procedure.

That is, main controller 20 moves the second unloading slider to below wafer $W_1$ which is located above unloading position UP1, and after delivering wafer $W_1$ from the first unloading slider to the second unloading slider, moves the second unloading slider holding wafer $W_1$ to waiting position UP2. The state of this wafer $W_1$ being held by the second unloading slider at a position of a predetermined height at waiting position UP2 is maintained, until a series of measurement operations to the next wafer, that is, the alignment measurement, the focus mapping and the like are completed and wafer stage WST2 is moved to a predetermined standby position.

At loading position LP, a new wafer $W_3$ (here, as an example, the wafer is to be a wafer in the middle of a lot (1 lot including 25 or 50 slices of wafers)) which has not yet undergone exposure is loaded onto wafer stage WST1 in the procedure described below. That is, wafer $W_3$ held by a loading arm not shown is delivered to the vertical movement pin which maintains a state of moving upward by a predetermined amount from the loading arm, and after the loading arm has withdrawn, by the vertical movement pin moving downward, wafer $W_3$ is mounted onto the wafer holder, and is suctioned by the vacuum chuck which is not shown. In this case, because the vertical movement pin maintains the state of moving upward by a predetermined amount, wafer loading can be performed within a short period of time than when the vertical movement pin is housed inside the wafer holder. FIG. 15 shows a state where the new wafer $W_3$ which has not yet undergone exposure is loaded on wafer table WTB1.

Meanwhile, concurrently with the moving of wafer stage WST1 to loading position LP and the loading of wafer $W_3$, wafer stage WST2 moves toward an exposure starting position of wafer $W_2$, namely, an acceleration starting position for exposure of the first shot area, as shown by two outlined arrows in FIG. 15, while maintaining the proximity or contact state of measurement table MTB and wafer table WTB2. Prior to beginning this movement to the acceleration starting position, as shown in FIG. 15, in a state where measurement plate 30 of wafer stages WST2 is at a position placed directly under projection optical system PL, main controller 20 stops both stages WST2 and MST and performs the second half processing of BCHK and the second half processing of focus calibration, as necessary.

Here, the second half processing of BCHK refers to a processing in which projection images (aerial images) of a pair of measurement marks on reticle R (or a mark plate which is not shown on reticle stage RST) projected by projection optical system PL are measured using aerial image measurement devices $45_1$ and $45_2$ previously described that include measurement plate 30. In this case, similar to the method disclosed in, for example, U.S. Patent Application Publication No. 2002/0041377 and the like, by an aerial image measurement operation of a slit scan method using the pair of aerial image measurement slit patterns SL, the aerial images of the pair of measurement marks are each measured, and the measurement results (the aerial image intensity corresponding to the XY position of wafer table WTB2) are stored in memory.

Further, the second half processing of focus calibration refers to a processing of measuring the aerial images of the measurement marks on reticle R by a slit scan method using aerial image measurement devices $45_1$ and $45_2$ while controlling the position (Z position) of measurement plate 30 (wafer table WTB2) in the optical axis direction of projection optical system PL using surface position information measured by the pair of XZ heads $65X_3$ and $64X_3$ that measure the surface position information on the ends on one side and the other side in the X-axis direction of wafer table WTB2, and measuring the best focus position of projection optical system PL based on the measurement results.

On this processing, because liquid immersion area 14 is formed in between projection optical system PL and measurement plate 30 (wafer table WTB), the measurement of the aerial images described above is performed via projection optical system PL and liquid Lg. Further, because measurement plate 30 and the like of aerial image measurement devices $45_1$ and $45_2$ are mounted on wafer stage WST2 (wafer table WTB2), and the photodetection element and the like are mounted on measurement stage MST, the measurement of the aerial images described above is performed while wafer stage WST and measurement stage MST keeping a contact or proximity state.

According to the measurement described above, measurement values of the pair of XZ heads $65X_3$ and $64X_3$ in a state where the center line of wafer table WTB2 coincides with reference axis LV (that is, surface position information on the ends on one side and the other side in the X-axis direction of wafer table WTB2) is obtained. Such measurement values correspond to the best focus position of projection optical system PL.

After the second half processing of BCHK and the second half processing of focus calibration described above have been performed, main controller 20 calculates the baseline of alignment detection system ALG, based on results of the first half processing of BCHK (which will be described later on) and results of the second half processing of BCHK. Further, along with this, based on a relation between measurement values of a pair of XZ heads $68X_3$ and $67X_3$ in a state where the center line of wafer table WTB2 coincides with reference axis LV (surface position information on the ends on one side and the other side in the X-axis direction of wafer table WTB) obtained in the first half processing of focus calibration (which will be described later on) and detection results at the detection point on the surface of measurement plate 30 (surface position information) of the AF system (90a, 90b), and based on measurement values of the pair of XZ heads 65X$_3$ and 64X$_3$ in a state where the center line of wafer table WTB2 coincides with reference axis LV (that is, surface position information on the ends on one side and the other side in the X-axis direction of wafer table WTB), which corresponds to the best focus position of projection optical system PL, obtained in the second half processing of focus calibration described above, main controller 20 obtains the offset at the detection point of the AF system (90a, 90b), and adjusts the detection origin of the AF system, for example, using the optical method so that the offset becomes zero.

In this case, from the viewpoint of improving the throughput, only one of the second half processing of BCHK and the second half processing of focus calibration described above may be performed, or the operation can go on to the next processing without performing both of the processing. As a matter of course, in the case when the second half processing of BCHK is not performed, the first half processing of BCHK previously described does not have to be performed.

Figure 16:
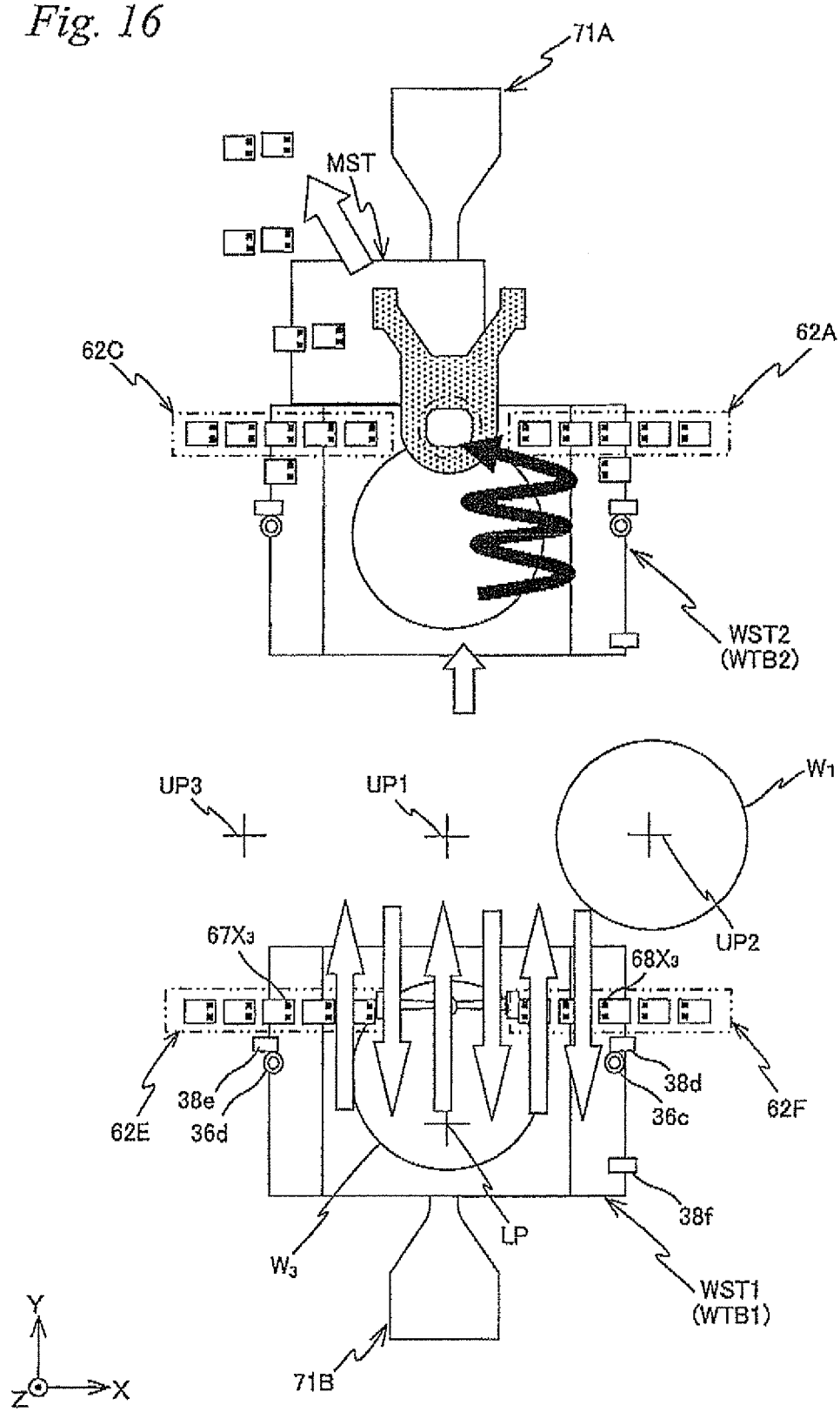
FIG. 16 is a view (No. 8) used to describe a concurrent processing operation using wafer stages WST1 and WST2 and measurement stage MST.
Figure 17:
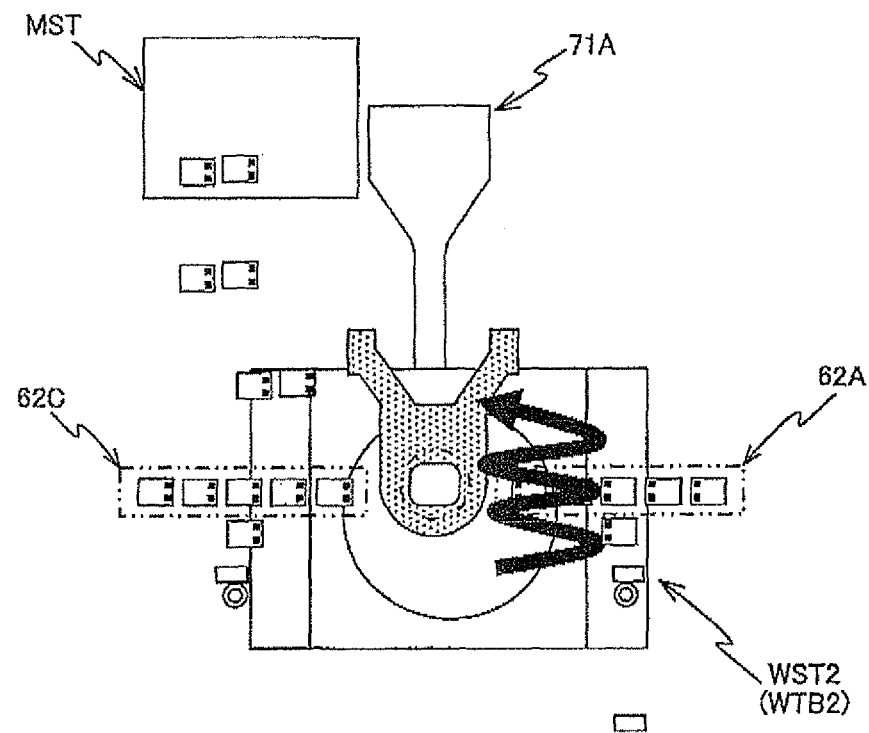
FIG. 17 is a view (No. 9) used to describe a concurrent processing operation using wafer stages WST1 and WST2 and measurement stage MST.
Figure 17:
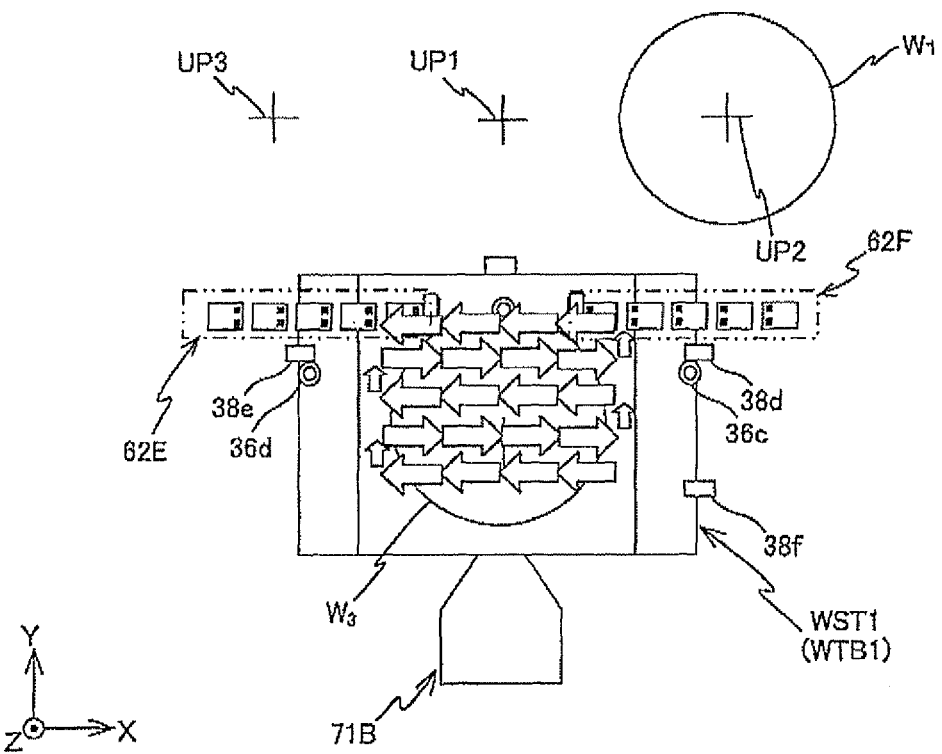

When the operation so far has been completed, main controller 20, as shown in FIG. 16, drives measurement stage MST in the −X direction and also in the +Y direction, and releases the contact or proximity state of both stages WST2 and MST.

Then, main controller 20 performs exposure by a step-and-scan method, and transfers the reticle pattern onto the new wafer W$_2$. This exposure operation is performed by main controller 20 repeating a movement between shots in which wafer stage WST is moved to a scanning starting position (acceleration starting position) for exposure of each shot area on wafer W, and scanning exposure in which the pattern formed on reticle R is transferred by a scanning exposure method to each shot area, based OD the results of wafer alignment (EGA) (the array coordinates of all the shot areas on the wafer) performed in advance, the latest baseline of alignment detection system ALG and the like. Incidentally, the exposure operation described above is performed in a state where liquid (water) Lg is held between tip lens 191 and wafer W.

Further, in the present embodiment, as an example, the first shot area which is to be exposed first is decided to be the shot area positioned at the +Y edge of the −X side half of wafer W$_2$, and therefore, first of all, wafer stage WST is moved in the +X direction and also the +Y direction, so as to be moved to the acceleration starting position.

And, while moving wafer stage WST2 along the path shown by a black arrow in FIG. 16, exposure is performed in the order from the shot area on the +Y side to the shot area on the −Y side on the −X side half of wafer W$_2$.

Concurrently with the exposure of the −X side half of wafer W$_2$, on the wafer stage WST1 side, a series of measurement operations which are described below is performed, following the loading operation of wafer W$_3$ previously described.

First of all, when wafer stage WST1 is at loading position LP, the first half processing of baseline measurement (BCHK) of alignment detection system ALG is performed. Here, the first half processing of BCHK means the processing as below. That is, main controller 20 detects (observes) fiducial mark FM located in the center of measurement plate 30 described previously using alignment detection system ALG, and associates the detection results of alignment detection system ALG with the measurement values of the fine movement stage position measurement system 110B at the time of detection and stores the associated information in memory. In the present embodiment, the first half processing of BCHK may be performed at least partially concurrently with the loading operation of wafer W described previously.

Following the first half processing of BCHK, when wafer stage WST1 is at loading position LP, the first half processing of focus calibration is performed.

That is, while main controller 20 detects surface position information (Z position information of scales 39$_1$ and 39$_2$) at the edge on one side and the other side in the X-axis direction of wafer table WTB1 detected by the pair of XZ heads 68X$_3$ and 67X$_3$ of the second top side encoder system 80B, main controller 20 detects surface position information of the surface of measurement plate 30 previously described, using the AF system (90a, 90b), with a reference plane obtained from such information serving as a reference. From this detection, a relation is obtained between measurement values (the surface position information at the edge on one side and the other side in the X-axis direction of wafer table WTB1) of the pair of XZ heads 68X$_3$ and 67X$_3$ in a state where the center line of wafer table WTB1 coincides with reference axis LV previously described, and the detection results (surface position information) at the detection point on the surface of measurement plate 30 of the AF system (90a, 90b).

Next, main controller 20 begins the focus mapping using four-spindle heads 67 and 68 of the second top side encoder system 80B and the AF system (90a, 90b).

Now, the focus mapping performed in exposure apparatus 100 related to the present embodiment will be described. On this focus mapping, main controller 20 controls the position within the XY plane of wafer table WTB1, based on measurement values of the two four-spindle heads 67 and 68 of the second top side encoder system 80B that face scales 39$_1$ and 39$_2$, respectively.

And, in this state, main controller 20 repeats a high speed scanning of wafer stage WST1 alternately in the −Y direction and the +Y direction with a step movement in the X-axis direction in between as shown by outlined arrows in FIG. 16, takes in position information in the X-axis, the Y-axis and the Z-axis directions of both ends in the X-axis direction (the pair of the second water-repellent plates 28b) of the wafer table WTB1 surface (plate 28 surface) measured by each of the two four-spindle heads 67 and 68 during the high speed scanning, and position information (surface position information) in the Z-axis direction of the wafer W surface detected at the detection point detected by the AF system (90a, 90b), at a predetermined sampling interval, and associates such taken-in information with each other and then sequentially stores the information in a memory which is not shown.

Then, main controller 20 completes the sampling described above, and then converts the surface position information on the detection point of the AF system (90a, 90b) into data which uses as a reference the position information in the Z-axis direction measured by each of the two four-spindle heads 67 and 68 simultaneously taken in.

To describe this further in detail, surface position information at a predetermined point (corresponding to a point on substantially the same X-axis as the detection point of the AF system (90a, 90b): hereinafter, referring to this point as a left measurement point) on an area near the −X side edge of plate 28 (the second water repellent plate 28b where scale 39$_2$ is formed) is obtained, based on measurement values of the Z position by one of the four-spindle heads, four-spindle head 67. Further, surface position information at a predetermined point (corresponding to a point on substantially the same X-axis as the detection point of the AF system (90*a*, 90*b*): hereinafter, referring to this point as a right measurement point) on an area near the +X side edge of plate 2B (the second water repellent plate 28*b* where scale 39$_1$ is formed) is obtained, based on measurement values of the Z position by the other four-spindle head 68. Then, main controller 20 converts the surface position information at the detection point of the AF system (90*a*, 90*b*) into surface position data which uses a straight line formed by connecting the surface position of the left measurement point and the surface position of the right measurement point (hereinafter referred to as a table surface reference line) as a reference. Main controller 20 performs such a conversion on all of the information taken in at the time of sampling.

Now, in exposure apparatus 100 related to the present embodiment, concurrently with the measurement by the second top side encoder system BOB described above, measurement of position information of wafer table WTB1 (fine movement stage WFS) in the X-axis direction, the X-axis direction, the Z-axis direction and the θy direction (and the θz direction) by the second back side encoder system 70B can be performed. Therefore, at the same timing as when the position information in the X-axis, the Y-axis and the Z-axis directions of both ends in the X-axis direction of the wafer table WTB1 surface (plate 28 surface) measured by each of the two four-spindle heads 67 and 68, and the position information (surface position information) in the Z-axis direction of the wafer W surface detected at the detection point detected by the AF system (90*a*, 90*b*) are taken in, main controller 20 also takes in measurement values of the position in each of the directions described above (X, Y, Z, θy (and θz)) by the second back side encoder system 70B. And, main controller 20 obtains a relation between data (Z, θy) of the table surface reference line that can be obtained from the measurement information of the second top side encoder system 80B, and measurement information (Z, θy) of the second back side encoder system 70B, which are simultaneously taken in. This allows the surface position data using the table surface reference line described above as a reference to be converted into surface position data using a reference line corresponding to the table surface reference line described above which is determined by the Z position and the θy rotation of wafer table WTB obtained by a rear surface measurement (hereinafter, referred to as a rear surface measurement reference line, for the sake of convenience).

By acquiring the conversion data described above in advance in the manner described above, for example, on exposure and the like, wafer table WTB1 (or WTB2) surface (a point on the second water-repellent plate 28*b* where scale 39$_2$ is formed, and a point on the second water-repellent plate 28*b* where scale 39$_1$ is formed) is measured by XZ heads 64X and 65X previously described, and a Z position and a tilt with respect to the XY plane (mainly θy rotation) of wafer table WTB1 (or WTB2) are calculated. By using this Z position and the tilt with respect to the XY plane of wafer table WTB1 (or WTB2) that have been calculated and the surface position data (surface position data using the table surface reference line as a reference) previously described, surface position control of wafer W becomes possible, without actually having to acquire the surface position information of the wafer W surface. Accordingly, because the AF system can be placed at a position away from projection optical system PL without any problems, the focus mapping of the present embodiment can be suitably applied, even in the exposure apparatus having a small working distance (a distance between projection optical system PL and wafer W at the time of exposure).

After the focus mapping described above has been completed, wafer alignment is performed, for example, by an EGA method. To be more specific, main controller 20 step-drives wafer stage WST1 in the XY two-dimensional directions as shown by outlined arrows in FIG. 17 while performing servo-control on the position of wafer table WTB, based on the measurement values of the second fine movement stage position measurement system 110B, and at each stepping position, detects an alignment mark arranged in each shot area on the wafer using alignment detection system ALG, and associates the detection results of alignment detection system ALG with the measurement values of the second fine movement stage position measurement system 110B at the time of detection and stores the associated information in memory which is not shown.

Then, main controller 20 performs statistical calculation by the EGA method disclosed in, for example, U.S. Pat. No. 4,780,617 using measurement values of the second fine movement stage position measurement system 110B that correspond to the detection results of the plurality of alignment marks obtained in the manner described above, and calculates EGA parameters (X offset, Y offset, orthogonal degree, wafer rotation, wafer X scaling, wafer Y scaling and the like), and obtains array coordinates of all the shot areas of wafer W$_2$ based on the calculation results. Then, main controller 20 converts the array coordinates into coordinates which uses a position of fiducial mark FM as a reference. At this point in time, the exposure of the area on the −X side half of wafer W$_2$ is still being continued.

Incidentally, while, in the description above, the wafer alignment is performed after the focus mapping has been completed, this is not intended to be limiting, and the focus mapping can be performed after the wafer alignment has been completed, or the focus mapping and the wafer alignment can be performed at least partially concurrent.

Figure 18:
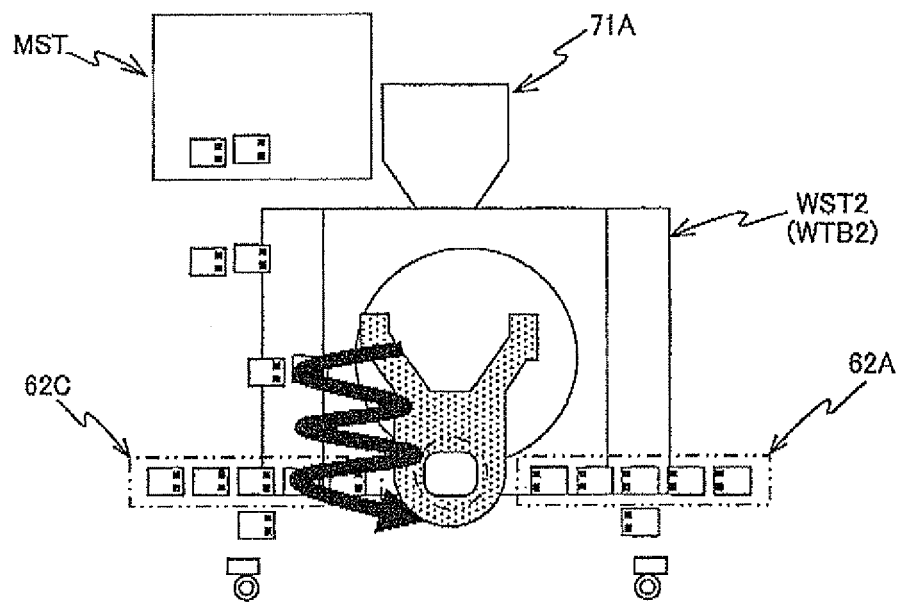
FIG. 18 is a view (No. 10) used to describe a concurrent processing operation using wafer stages WST1 and WST2 and measurement stage MST.
Figure 18:
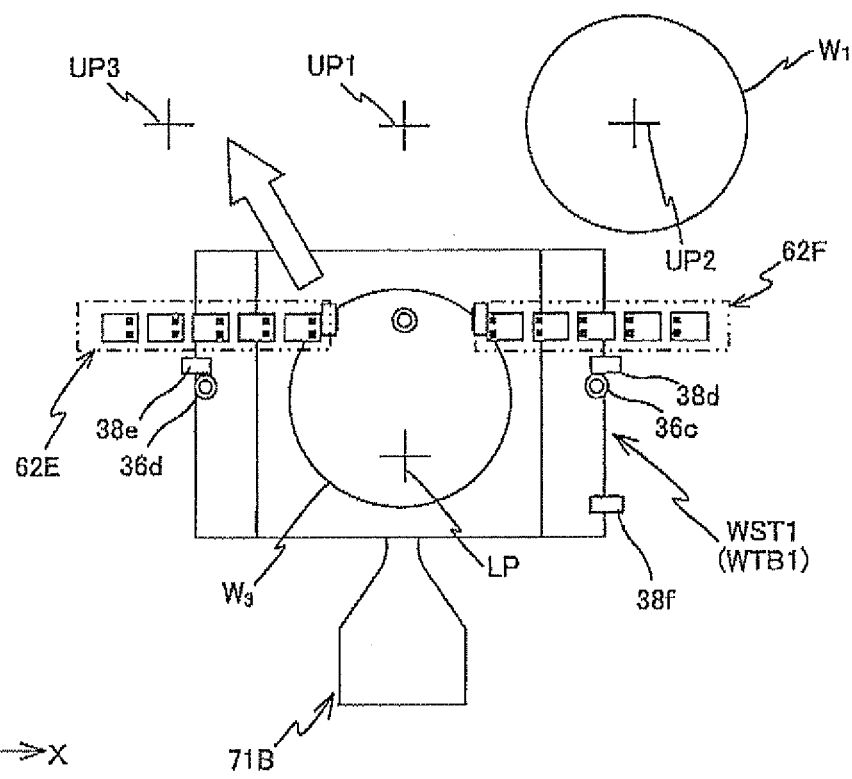
Figure 19:
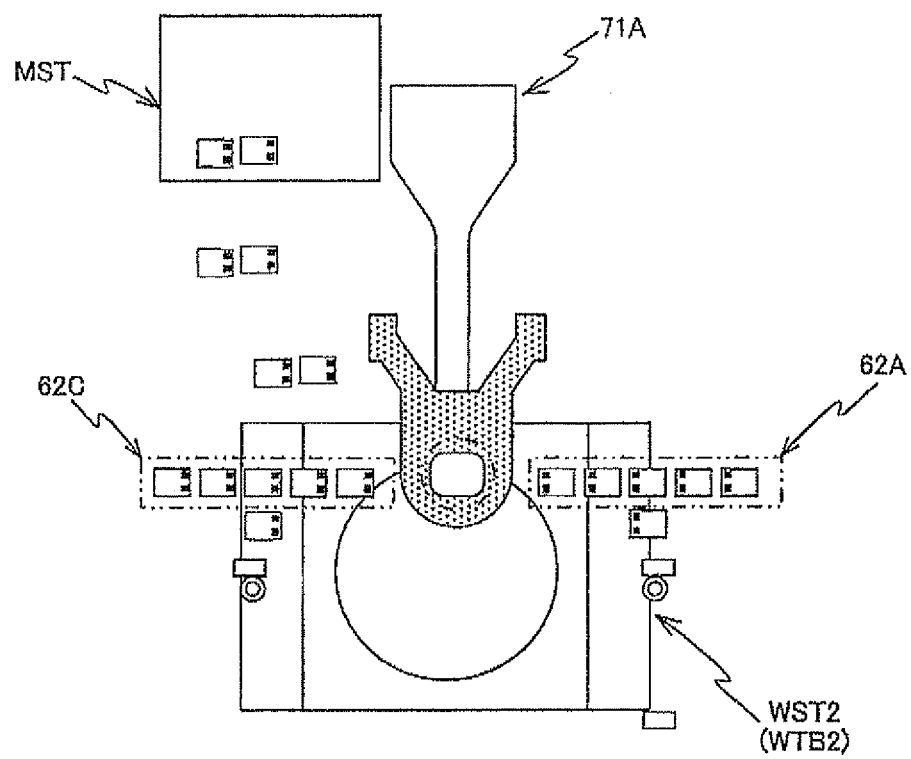
FIG. 19 is a view (No. 11) used to describe a concurrent processing operation using wafer stages WST1 and WST2 and measurement stage MST.
Figure 19:
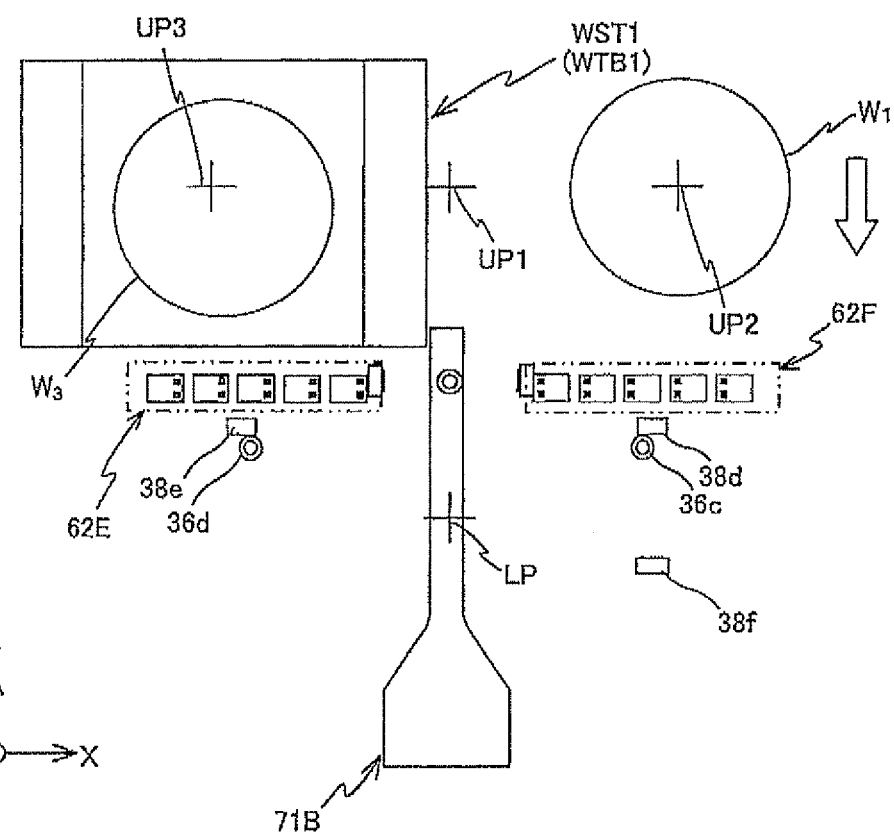

Then, when the series of measurement operations are completed, main controller 20, as shown by an outlined arrow in FIG. 18, drives wafer stage WST1 holding wafer W$_3$ in the −X direction and the +Y direction toward a standby position that is symmetric to the standby position of wafer stage WST2 shown in FIG. 9 with respect to reference axis LV. FIG. 19 shows a state where wafer stage WST1 moves to the standby position and is waiting at the position. This standby position is substantially directly under the waiting position UP3 of the wafer described previously, and on the way of moving to the standby position, the measurement system that measures the position of wafer stage WST1 is switched from the second fine movement stage position measurement system 110B to measurement system 80D.

Concurrently with moving wafer stage WST1 to the standby position described above and the waiting at the standby position thereafter, main controller 20 performs exposure of the area on the +X side half of wafer W$_2$ held on wafer table WTB2 while moving wafer stage WST2 along a path shown by a black arrow in each of FIGS. 18 and 19.

Figure 20:
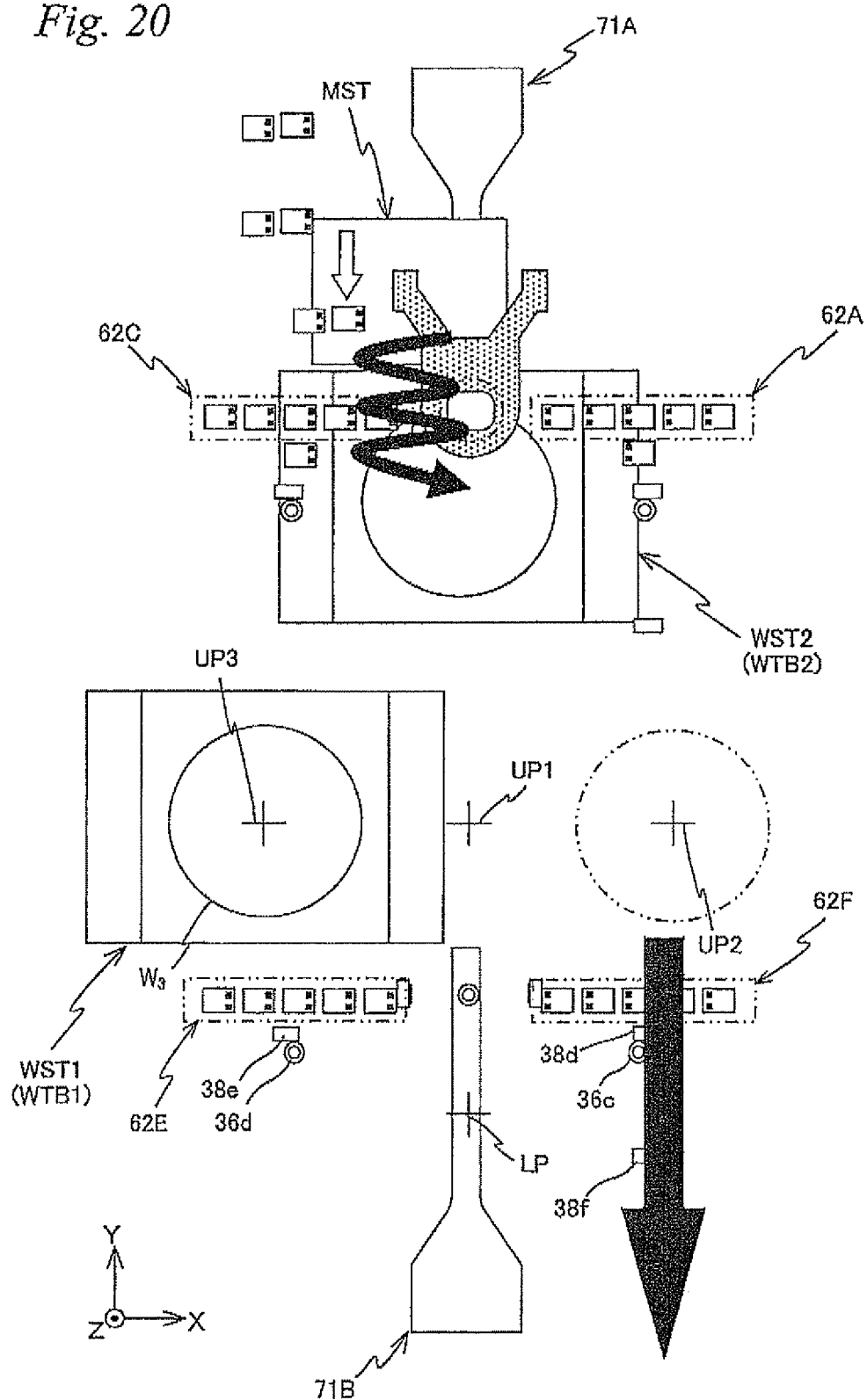
FIG. 20 is a view (No. 12) used to describe a concurrent processing operation using wafer stages WST1 and WST2 and measurement stage MST.

When wafer stage WST1 is moved to the standby position, main controller 20 carries wafer W$_1$ to the delivery position to the wafer carrier system by driving the wafer in the −Y direction as shown by a black arrow in FIG. 20, after driving downward, by a predetermined amount, the second unloading slider that holds wafer W$_1$ that has undergone exposure above waiting position UP2.

As is obvious when comparing FIGS. 20 and 9, while wafer stage WST1 and wafer stage WST2 are switched and the standby position of wafer stage WST1 is set to a position symmetric about reference axis LV to the standby position of wafer stage WST2 in the state shown in FIG. 20, the progress of the processing of the two wafers W held on the two wafer stages WST1 and WST2 is the same.

After that, an operation similar to the described above is repeated by main controller 20, while alternately using wafer stages WST1 and WST2.

However, on this repetition, when the exposure of water W held by wafer stage WST2 is completed, wafer stage WST2 is driven in the −Y direction to be replaced with wafer stage WST1, after being driven in the +X direction. In this case, wafer stage WST1 is driven in the +Y direction to be replaced with wafer stage WST2.

Then, after the replacement, wafer stage WST2 is moved to unloading position UP1, and then the exposed wafer that has been unloaded from wafer stage WST2 is made to wait at waiting position UP3 on the −X side of unloading position UP1. Then, at the point when the loading of a new wafer onto wafer stage WST2 and the series of measurement operations described previously are completed, and wafer stage WST2 is moved to the standby position directly under waiting position UP2, the exposed wafer that has been waiting at waiting position UP3 is carried along the path in the −Y direction to the delivery position to the wafer carrier system.

As described in detail so far, according to exposure apparatus 100 related to the present embodiment, for example, in the case when one of the wafer stages, wafer stage WST1 (or WST2) is at exposure station 200, and the other of the wafer stages, wafer stage WST2 (or WST1) is at measurement station 300, it becomes possible to perform the series of measurement previously described on wafer W held by wafer table WTB2 (or WTB1) in measurement station 300, concurrently with exposing wafer W held by wafer table WTB1 (or WTB2) using illumination light IL via projection optical system PL and liquid Lq in exposure station 200. Further, when exposure to wafer W held by wafer table WTB1 (or WTB2) is completed, delivery of liquid Lq (liquid immersion area 14) directly below projection optical system PL is performed between wafer table WTB1 (or WTB2) and measurement table MTB, and the liquid is held by projection optical system PL and measurement table MTB. It becomes possible to perform this delivery of liquid Lq immediately after exposure to wafer W held by wafer table WTB1 (or WTB2) has been completed. This eliminates the need of delivering liquid Lq supplied to directly below projection optical system PL from one of wafer tables WTB1 or WTB2 to the other. This also eliminates the need of moving wafer table WTB1 (or WTB2) a long way around, for example, as in the case when liquid Lq supplied to directly below projection optical system PL is delivered from one of wafer tables WTB1 or WTB2 to the other, when wafer table WTB1 (or WTB2) is returned to the measurement station 300 side for wafer exchange and the like. Further, according to exposure apparatus 100 related to the present embodiment, in a state where liquid Lq is held between projection optical system PL and measurement table MTB, main controller 20 drives wafer stages WST1 and WST2 via coarse movement stage driving systems 51A and 51B so as to replace, in the Y-axis direction, the position of wafer stage WST1 (or WST2) that includes wafer table WTB1 (or WTB2) holding wafer W that has undergone exposure and the position of wafer stage WST2 (or WST1) that includes wafer table WTB2 (or WTB1) holding wafer W that has undergone the series of measurement described previously. In this case, in order to replace the positions in the Y-axis direction, main controller 20 concurrently drives wafer stage WST1 including wafer table WTB1 and wafer stage WST2 including wafer table WTB2 along the respective movement paths that include paths in reverse directions to each other and parallel to the Y-axis direction (refer to FIG. 12). In the present embodiment, such movement paths that include paths in directions reverse to each other and parallel to the Y-axis direction are employed, and before and after wafer stages WST1 and WST2 pass through the movement paths, main controller 20 moves wafer stages WST1 and WST2 from one of exposure station 200 and measurement station 300 to the other, using coarse movement stage driving systems 51A and 51B, respectively, so that in replacement of one of arm members $71_1$ and $71_2$ (that is, heads 73a to 73c and 75a to 75c) placed in the space of coarse movement stage WCS, the other of arm members $71_1$ and $71_2$ that is, heads 73a to 73c and 75a to 75c) is placed (refer to, for example, FIGS. 9 and 18). In this case, main controller 20 controls the drive of wafer stage WST1 or WST2 by coarse movement stage driving system 51A or 51B based on the position information of wafer stage WST1 or WST2 measured by measurement system 80B, so that wafer stage WST1 or WST2 moves from an area (a middle area) in between exposure station 200 and measurement station 300 to exposure station 200 (or measurement station 300). Further, wafer stage WST1 and wafer stage WST2 are moved from one of exposure station 200 and measurement station 300 to the other through the movement paths different from each other within the middle area described previously, and in the present embodiment, the positions of the different movement paths are different in the X direction, that is, the different movement paths are set apart on one edge side and the other edge side in the X direction on base board 12. In the present embodiment, because the tube carrier is connected to wafer stage WST1 from the −X direction and connected to wafer stage WST2 from the +X direction, the movement path of wafer stage WST1 is set on the −X side of projection optical system PL in the X direction and the movement path of wafer stage WST2 is set on the +X side of projection optical system PL in the X direction.

Further, main controller 20 can perform at least one of an uneven illuminance measurement, an aerial image measurement, a wavefront aberration measurement and a dose measurement, using at least one of the measurement members that measurement table MTB has, namely, illuminance irregularity sensor 95, aerial image measuring device 96, wavefront aberration measuring device 97, and illuminance monitor 98 that are previously described, in a part of a period after the exposure of wafer W held by one of wafer stages WST1 or WST2 has been completed until the exposure of wafer W held by the other of wafer stages WST1 or WST2 begins, including, for example, the time described above of replacing the position in the Y-axis direction of one of wafer stages WST1 or WST2 holding wafer W which has been exposed and the position in the Y-axis direction of the other of wafer stages WST1 or WST2 holding wafer W on which the series of measurements has been performed. This makes it possible to perform measurement related to exposure when necessary, without reducing the throughput.

In the present embodiment, the movement paths of wafer stages WST1 and WST2 further include paths in which wafer stages WST1 and wST2 are driven in directions reverse to each other in the X-axis direction (refer to FIG. 13).

Accordingly, the throughput can be improved, and the apparatus can also be downsized.

According to exposure apparatus 100 related to the present embodiment, the first fine movement stage position measurement system 110A, which measures the position of wafer table WTB1 (or WTB2), i.e. fine movement stage WFS, held movable in the directions of six degrees of freedom by coarse movement stage WCS when wafer stage WST1 (or WST2) is at exposure station 200, is equipped with the first back side encoder system 70A which irradiates a measurement beam from below on grating RG provided on the rear surface (surface on the −Z side) of wafer table WTB1 (or WTB2), receives the light (reflected and diffracted light) of the measurement beam from grating RG, and measures the position information of wafer table WTB1 (or WTB2) in the directions of six degrees of freedom, when wafer table WTB1 (or WTB2) moves in a predetermined range within exposure station 200 (a range within exposure station 200 that includes at least a range where wafer table WTB1 (or WTB2) moves for exposure of wafer W held by wafer table WTB1 (or WTB2)), and is also equipped with the first top side encoder system 80A which has head sections 62A and 62C provided at main frame BD, and irradiates a measurement beam on the pair of scales $39_1$ and $39_2$ (two-dimensional gratings) provided on wafer table WTB1 (or WTB2) from head sections 62A and 62C, receives the light (reflected and diffracted light) of the measurement beam from scales $39_1$ and $39_2$ (two-dimensional gratings), and can measure the position information of wafer table WTB1 (or WTB2) in the directions of six degrees of freedom, concurrently with the measurement of the position information by the first back side encoder system 70A, when wafer table WTB1 (or WTB2) moves in the predetermined range described above within exposure station 200. And, when wafer table WTB1 (or WTB2) moves in the predetermined range described above within exposure station 200, such as, for example, at the time of exposure, main controller 20 drives wafer table WTB1 (or WTB2) based on the position information having higher reliability, out of the position information according to the first back side encoder system 70A and the position information according to the first top side encoder system 80A.

Further, according to exposure apparatus 100 related to the present embodiment, the second fine movement stage position measurement system 110B, which measures the position of wafer table WTB1 (or WTB2), i.e. fine movement stage WFS, held movable in the directions of six degrees of freedom by coarse movement stage WCS when wafer stage WST1 (or WST2) is at measurement station 300, is equipped with the second back side encoder system 70B which irradiates a measurement beam from below on grating RG provided on the rear surface (surface on the −Z side) of wafer table WTB1 (or WTB2), receives light from grating RG (reflection diffraction light) of the measurement beam, and measures the position information of wafer table WTB1 (or WTB2) in the directions of six degrees of freedom, when wafer table WTB1 (or WTB2) moves in a predetermined range within measurement station 300 (a range within measurement station 300 including at least a range where wafer table WTB1 (or WTB2) moves for the series of measurement processing previously described, such as, for example, a range in measurement station 300 corresponding to the predetermined range previously described in exposure station 200), and is also equipped with the second top side encoder system 80B which has head sections 62F and 62E provided at main frame BD, and irradiates a measurement beam on the pair of scales $39_1$ and $39_2$ (two-dimensional gratings) on wafer table WTB1 (or WTB2) from head sections 62F and 62E, receives light (reflection diffraction light) from scales $39_1$ and $39_2$ (two-dimensional gratings) of the measurement beam, and can measure the position information of wafer table WTB1 (or WTB2) in the directions of six degrees of freedom concurrently with the measurement of the position information by the second back side encoder system 70B, when wafer table WTB1 (or WTB2) moves in the predetermined range described above in measurement station 300. And, when wafer table WTB1 (or WTB2) moves in the predetermined range described above within measurement station 300, such as, for example, at the time of alignment, main controller 20 servo-drives wafer table WTB1 (or WTB2) based on the position information having higher reliability, out of the position information according to the second back side encoder system 70B and the position information according to the second top side encoder system 80B.

Further, because unloading position LP1 is set between the exposure position and the alignment position, to be more specific, at the position to which wafer stage WST1 or WST2 that holds wafer W that has been exposed is driven along the movement path in the −Y direction and then driven in the X-axis direction, the wafer which has been exposed can be unloaded from wafer table WTB1 (or WTB2) in a short time after exposure has been completed, and then wafer table WTB1 (or WTB2) can return to loading position LP. Further, after exposure has been completed, wafer table WTB1 (or WTB2) after having delivered liquid immersion area 14 (liquid Lq) to measurement table MTB, returns to unloading position LP1 and then to loading position LP, without coming into contact with the liquid. Accordingly, the movement of wafer table WTB1 (or WTB2) at this point in time can be performed at a high speed and with high acceleration. Furthermore, because loading position LP is set at the position where the first half processing of BCHK of alignment detection system ALG is performed, the series of measurement processing including the first half processing of BCHK of alignment detection system ALG can be started at least partially concurrent with the loading of a wafer onto wafer table WTB1 (or WTB2), or immediately after the loading. Further, because this is measurement processing is performed without wafer table WTB1 (or WTB2) being in contact with the liquid, the processing can be performed while moving wafer table WTB1 (or WTB2) at a high speed and with high acceleration.

Furthermore, because, as the order of exposure of the plurality of shot areas on wafer W, the shot areas are exposed in the order from the −Y side to the +Y side on the +X side half (or the −X side half) after the shot areas have been exposed in the order from the +Y side to the −Y side on the −X side half (or the +X side half), wafer table WTB1 (or WTB2) is located at a position closest to unloading position LP1 at the point when the exposure has been completed. Accordingly, after the exposure has been completed, wafer table. WTB1 (or WTB2) can be moved to unloading position LP1 in the shortest time.

As is obvious from the description so far, according to exposure apparatus 100 related to the present embodiment, exposure with high resolution is performed, with good overlay accuracy, by liquid immersion exposure to wafer W in a step-and-scan method, based on the highly precise results of the alignment and the focus mapping. Further, even if wafer W subject to exposure, for example, is a 450 mm wafer or the like, a high throughput can be maintained. To be specific, in exposure apparatus 100, it is possible to achieve exposure processing to a 450 mm wafer, with equal or higher throughput to/than the exposure processing to a 300 mm wafer using a liquid immersion scanner as disclosed in U.S. Patent Application Publication No. 2008/0088843 and the like previously described.

Incidentally, in the embodiment described above, as an example of controlling the position of wafer table WTB1 (WTB2) in exposure station 200, by using together the first back side encoder system 70A and the first top side encoder system 80A, and using measurement information having higher reliability out of measurement information of theses encoder systems, the measurement information by the first top side encoder system 80A is used for the θx, the θy and the θz directions, and the measurement information by the first back side encoder system 70A is used for the remaining directions, i.e. the X-axis, the Y-axis and the Z-axis directions, but this is merely an example.

For example, in an exposure apparatus to cope with a 450 mm wafer, because the length of measurement arm 71A (arm member $71_1$), with a cantilevered supported structure, of the first back side encoder system 70A will become 500 mm or more in view of the size of the wafer table, the influence of background vibration (vibration of body) becomes large, for example, in a band of around 100 Hz to 400 Hz. In contrast, regarding the first top side encoder system 80A, influence by vibration of the body is small, and it can be considered that measurement deception is small except for the extremely low frequency band. Therefore, focusing on these points, out of the measurement information of the first back side encoder system 70A and measurement information of the first top side encoder system 80A, the measurement information having higher reliability can be selectively used in the frequency band of the output signals. In this case, for example, the output of the first back side encoder system 70A and the output of the first top side encoder system 80A can be selectively used (switched) by using a low pass filter and a high pass filter that have the same cutoff frequency, or not limited to this and for example, without using the filters, a hybrid position signal that is obtained by weighting the output signal of the top side encoder system and the output signal of the back side encoder system and adding both can be used. Further, the top side encoder system and the back side encoder system can be used separately or used together depending on other factors than the vibration.

Besides this, in the case when it is obvious that reliability is higher for measurement information (position information) according to the first back side encoder system 70A or the first top side encoder system 80A as for predetermined operations which involve movement of wafer table WTB1 or WTB2, such position information having higher reliability can be used for position control of wafer table WTB1 or WTB2 during such operations. For example, in the first fine movement stage position measurement system 110A, only the first back side encoder system 70A may be used, for example, during scanning exposure.

In any case, according to the present embodiment, because position measurement of wafer table WTB1 or WTB2 is possible concurrently by the first back side encoder system 70A and the first top side encoder system 80A, various usages, such as using only one encoder system, or using both of the systems or the like, become possible depending on the good and bad points of these encoder systems.

Further, in the embodiment described above, a method similar to the one described above can be employed in the second fine movement stage position measurement system 110B, for the method of selecting position information having higher reliability from measurement information (position information) according to the second back side encoder system 70B and the second top side encoder system 80B.

Further, while, in the embodiment described above, the first fine movement stage position measurement system 110A is equipped with the first top side encoder system 80A in addition to the first back side encoder system 70A, this is not intended to be limiting, and the measurement system to measure the position of wafer table WTB1 or WTB2 in exposure station 200 can be only the first back side encoder system 70A, or instead of the first top side encoder system 80A, another encoder system having a different structure or an interferometer system or the like can be used in combination with the first back side encoder system 70A. In the case of using only the first back side encoder system 70A, it is desirable to perform calibration necessary for securing a long-term stability in the θx, the θy and the θz directions or the directions of six degrees of freedom of the coordinate system of back side encoder system 70A.

Further, while, in the embodiment described above, the second fine movement stage position measurement system 110B is equipped with the second back side encoder system 70B and the second top side encoder system 80B, this is not intended to be limiting, and the measurement system to measure the position of wafer table WTB1 or WTB2 in measurement station 300 can be only the second back side encoder system 70B, or instead of the second top side encoder system 80B, another encoder system having a different structure or an interferometer system or the like may be used in combination with the second back side encoder system 70B. In the case of using only the second back side encoder system 70B, it is desirable to perform calibration necessary for securing a long-term stability in the θx, the θy and the θz directions or the directions of six degrees of freedom of the coordinate system of back side encoder system 70B.

Further, while, in the embodiment described above, exposure coordinate setting measurement system 34 and measurement coordinate setting measurement system 35 are each equipped with the Z sensors and the pair of imaging sensors that detect the position of the marks on the wafer table in the X and the Y two-dimensional directions, this is not intended to be limiting, and for example, instead of the imaging sensors, an absolute encoder which can measure the absolute position of the wafer table in the XY two-dimensional directions can be provided.

Further, while, in the embodiment described above, unloading position UP1 is set in between exposure station 200 and measurement station 300, this is not intended to be limiting, and the unloading position may be set in the vicinity of loading position LP, as in an exposure apparatus related to a modified example to be described next.

MODIFIED EXAMPLE

Figure 21:
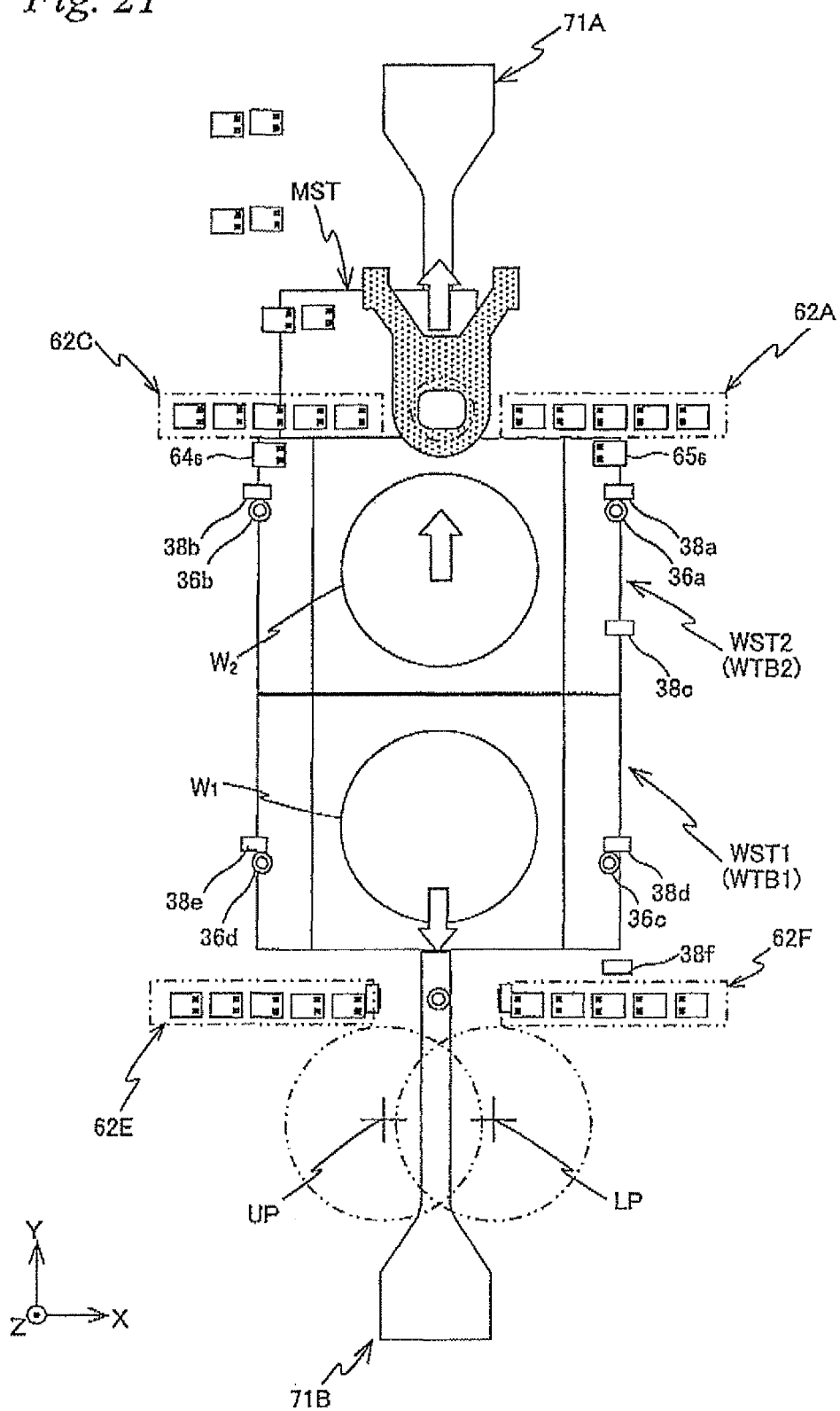
FIG. 21 is a view (No. 1) used to describe a structure of an exposure apparatus related to a modified example, and also used to describe a concurrent processing operation using wafer stages WST1 and WST2 and measurement stage MST.

FIG. 21 shows a state of a moment during concurrent processing operations of the exposure apparatus related to a modified example. FIG. 21 corresponds to a state of FIG. 14 related to the embodiment described previously. As can seen from FIG. 21, in the exposure apparatus related to this modified example, unloading position UP and loading position LP are both set in the vicinity of the measurement arm. To be more specific, when assuming loading position LP of the exposure apparatus related to the embodiment described previously as a reference, loading position LP is set at a position a predetermined distance shifted to the +X side, and unloading position UP is set at a position a predetermined distance shifted to the −X side. And, waiting positions for the wafer such as waiting positions UP2 and UP3 described previously are not provided. Further, in the exposure apparatus related to the modified example, measurement coordinate setting measurement system 35 (imaging sensors 36*c* and 36*d* and Z sensors 38*d* to 38*f*) is placed on the +Y side of head sections 62F and 62E. The structures of the other parts and the like are similar to those of exposure apparatus 100 related to the embodiment described previously.

Now, of a series of concurrent processing operations using wafer stages WST1 and WST2 and measurement stage MST in the exposure apparatus related to this modified example, a part of operations including a wafer exchange operation will be described, based on FIGS. 21 to 24.

The concurrent processing using wafer stages WST1 and WST2 and measurement stage MST is performed in the procedure similar to that of the embodiment described previously, and when wafer stage WST2 moves to the position shown in FIG. 21, main controller 20 switches a position measurement system used in position control of wafer table WTB2 (wafer stage WST2) temporarily to the third fine movement stage position measurement system 110C from measurement system 80D, similarly to the above-described manner. Afterwards, control of the position of wafer table WTB2 is performed based on the measurement values according to the third fine movement stage position measurement system 110C. Further, in a state where wafer stage WST2 has moved to the position shown in FIG. 21, wafer table WTB2 is in a state in contact with or proximity to measurement table MTB in the Y-axis direction (scrum state), for delivery of the liquid immersion area.

Next, main controller 20 drives wafer stage WST2 and measurement stage MST in the +Y direction as is shown by two outlined arrows pointing upward in FIG. 21, while maintaining the contact or proximity state of wafer table WTB2 and measurement table MTB. By this drive, liquid immersion area 14 (liquid Lq) formed below projection unit PU is moved (delivered) from measurement table MTB onto wafer table WTB2, and liquid immersion area 14 (liquid Lq) is to be held by projection optical system PL and wafer table WTB2 (refer to FIG. 23).

Figure 23:
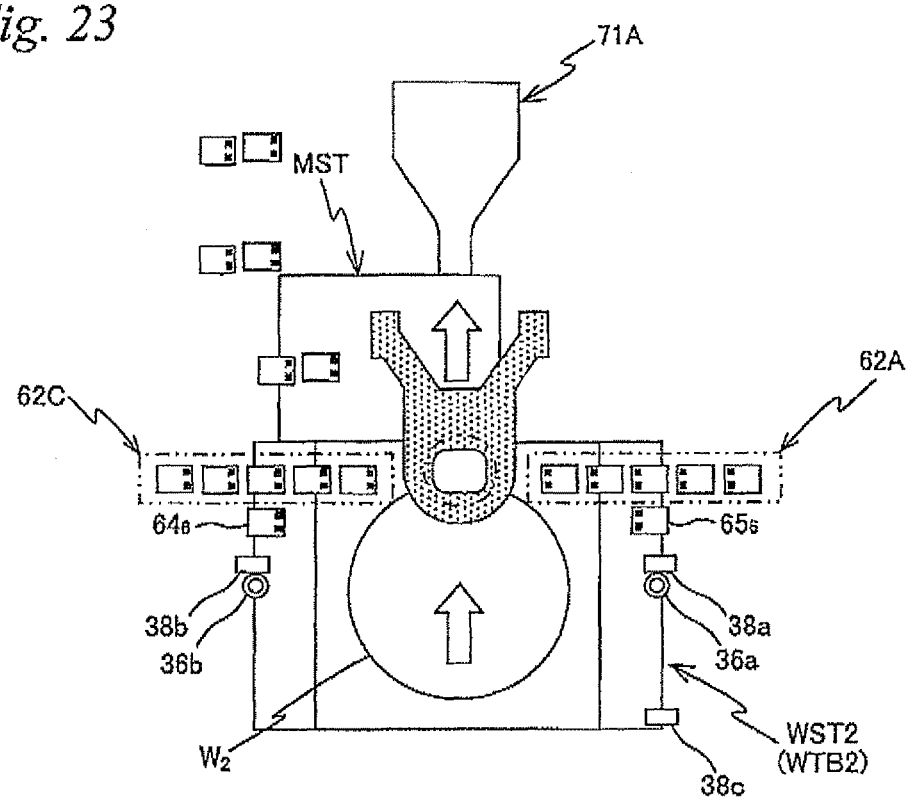
FIG. 23 is a view (No. 3) used to describe a concurrent processing operation using wafer stages WST1 and WST2 and measurement stage MST performed in the exposure apparatus related to the modified example.
Figure 23:
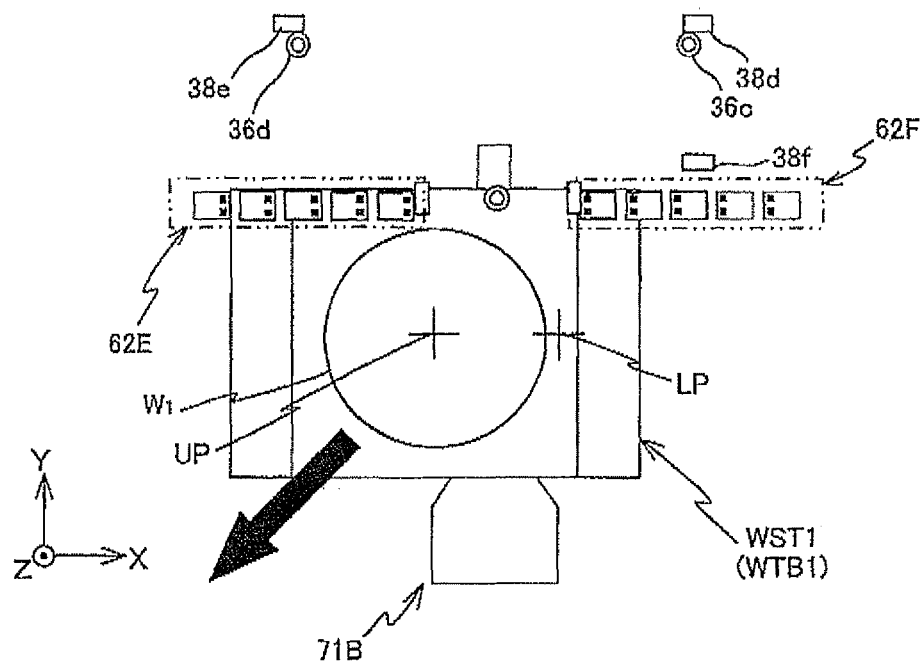

At the point when the delivery of liquid immersion area 14 described above has been completed, measurement arm 71A is inserted into a space of wafer stage WST2, and the rear surface (grating RG) of wafer table WTB2 faces heads 73*a* to 73*c* of measurement arm 71A, and head sections 62A and 62C face scale $39_1$ and $39_2$ (refer to FIG. 23). That is, the position of wafer table WTB2 can be measured by the third fine movement stage position measurement system 110C, as well as by the first fine movement stage position measurement system 110A. Therefore, similarly to the above-described manner, main controller 20 performs origin return of the first back side encoder system 70A and the first top side encoder system 80A based on the position coordinates in the directions of six degrees of freedom of wafer table WTB2 measured by the third fine movement stage position measurement system 110C. In the manner described above, return of the exposure-time coordinate system which controls the position of wafer table WTB2 that moves within exposure station 200 is performed.

After the return of the exposure-time coordinate system described above, main controller 20 controls the position of wafer table WTB2, based on the position information having higher reliability out of the position information of the first back side encoder system 70A and the position information of the first top side encoder system 80A.

Concurrently with the drive in the +Y direction of wafer stage WST2 and measurement stage MST for the delivery of liquid immersion area 14 described above, main controller 20 drives wafer stage WST1 toward unloading position UP (and loading position LP), as shown by an outlined arrow pointing downward in FIG. 21. Halfway along this drive, position measurement of wafer stage WST1 (wafer table WTB1) by measurement system 80D can no longer be performed. Therefore, before wafer stage WST1 falls out of the measurement range by measurement system 80D, for example, at the point when wafer stage WST1 reaches the position shown in FIG. 22, main controller 20 switches the position measurement system used for position control of wafer table WTB1 (wafer stage WST1) from measurement system 80D previously described to the second fine movement stage position measurement system 110B. That is, at the point when wafer stage WST1 has reached the position shown in FIG. 22, measurement arm 71B is inserted into a space of wafer stage WST1, and the rear surface (grating RG) of wafer table WTB1 faces heads 75*a* to 75*c* of measurement arm 71B, and head sections 62F and 62E face scales $39_1$ and $39_2$. Further, at this point in time, measurement of the absolute position in the directions of six degrees of freedom of wafer table WTB1 by measurement coordinate setting measurement system 35 is possible. Therefore, main controller 20 simultaneously measures the position in the directions of six degrees of freedom of wafer table WTB1, using measurement coordinate setting measurement system 35 and the second fine movement stage position measurement system 110B. And, similarly to the previously-described manner, main controller 20 re-sets the measurement values of the second back side encoder system 70B and the second top side encoder system 80B of the second fine movement stage position measurement system 110B, based on the absolute position of wafer table WTB1 measured by measurement coordinate setting measurement system 35, so as to perform origin return of the second back side encoder system 70B and the second top side encoder system 80B. In the manner described above, return of the measurement-time coordinate system which controls the position of wafer table WTB1 that moves within measurement station 300 is performed.

Measurement coordinate setting measurement system 35 can measure the absolute position in the directions of six degrees of freedom of wafer table WTB1, and therefore, the switching from measurement system 80D to the second fine movement stage position measurement system 110B described above, namely, the return of the measurement-time coordinate system described above, can be performed within a short time.

After the return of the measurement-time coordinate system described above, main controller 20 drives wafer stage WST1 in the −Y direction and also in the −X direction as shown by an outlined arrow in FIG. 22, and sets the position of wafer stage WST1 at unloading position UP, while controlling the position of wafer table WTB1 based on the position information having higher reliability out of the position information from the second back side encoder system 70B and the position information from the second top side encoder system 80B (refer to FIG. 23).

At unloading position LP, wafer $W_1$ which has been exposed is unloaded from wafer stage WST1 in the procedure described below. That is, after suction of wafer $W_1$ by a vacuum chuck which is not shown is released, by the vertical movement pin moving upward, wafer $W_1$ is lifted from the wafer holder. Then, the unloading arm made up of a robot arm and the like which is not shown is inserted between wafer $W_1$ and the holder, and by the unloading arm moving upward by a predetermined amount, wafer $W_1$ is delivered from the vertical movement pin to the unloading arm. Then, the unloading arm carries out the wafer to a delivery position to an external carrier system, as is shown by the black arrow in FIG. 23. In this case, the vertical movement pin maintains a state of moving upward by a predetermined amount in preparation for loading the next wafer.

Figure 24:
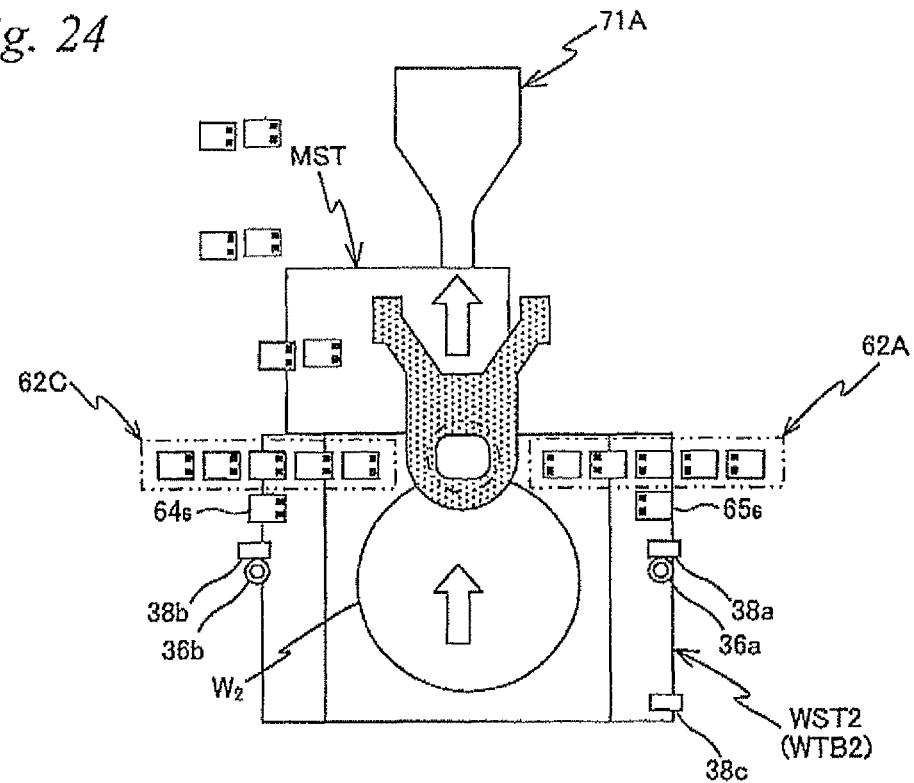
FIG. 24 is a view (No. 4) used to describe a concurrent processing operation using wafer stages WST1 and WST2 and measurement stage MST performed in the exposure apparatus related to the modified example.
Figure 24:
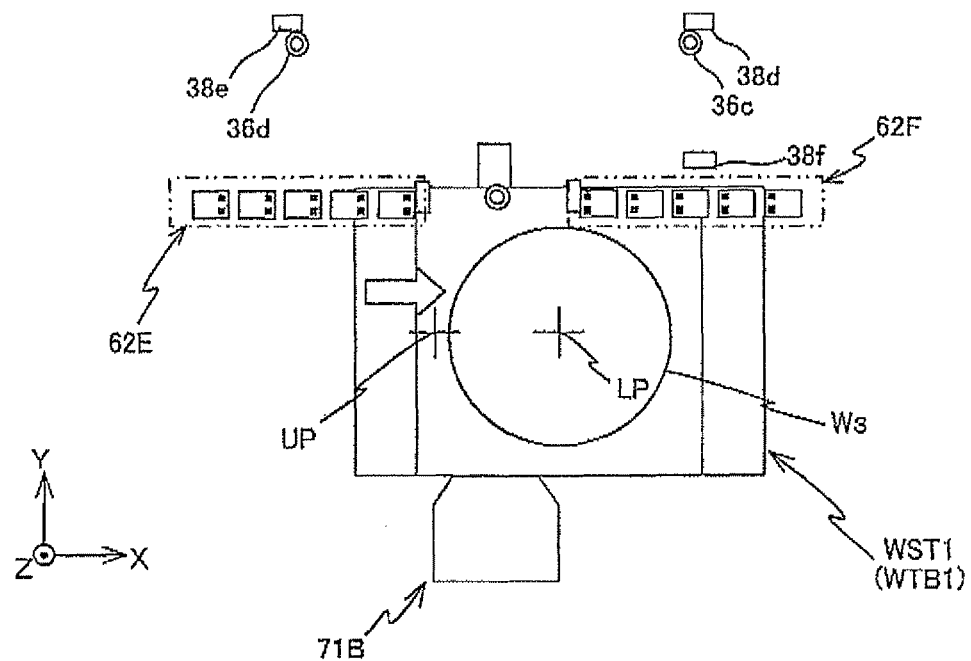

Next, main controller 20 drives wafer stage WST1 in the +X direction by a predetermined amount as is shown by an outlined arrow in FIG. 24, and sets the position of wafer stage WST1 to loading position LP. At loading position LP, a new wafer $W_3$ before exposure (here, as an example, the wafer is to be a wafer in the middle of a lot (1 lot including 25 or 50 slices of wafers)) is loaded onto wafer table WTB1 similarly to the previously-described manner. FIG. 24 shows a state where the new wafer $W_3$ before exposure is loaded on wafer table WTB1.

Meanwhile, concurrently with the moving of wafer stage WST1 to unloading position UP, the unloading of wafer $W_1$, the moving of wafer stage WST1 to loading position LP, and the loading of wafer $W_3$ wafer stage WST2 moves toward an exposure starting position of wafer $W_2$, namely, an acceleration starting position for exposure of the first shot area, as shown by two outlined arrows each in FIGS. 23 and 24, while maintaining the contact or proximity state of measurement table MTB and wafer table WTB2. Prior to beginning this movement to the acceleration starting position, as shown in FIG. 23, in a state where measurement plate 30 of wafer stage WST2 is at a position placed directly under projection optical system PL, main controller 20 stops both stages WST2 and MST as necessary, and performs the second halt processing of BCHK and the second half processing of focus calibration.

When the operations described so far are completed, main controller 20 drives measurement stage MST in the −X direction and the +Y direction, and after releasing the contact or proximity state of both stages WST2 and MST, begins exposure of wafer $W_2$ similar to the previously-described exposure.

Concurrently with the exposure of wafer $W_2$ described above, main controller 20 performs a series of measurement processing. That is, main controller 20 drives wafer stage WST1 where wafer $W_3$ is loaded by a predetermined amount in the −X direction, and sets the position of wafer stage WST1 at a position where fiducial mark FM on measurement plate 30 is positioned in the field (detection area) of alignment detections system ALG. Then, after performing the first half processing of baseline measurement (BCHK) of alignment detection system ALG, main controller 20 performs the first half processing of focus calibration. After that, similarly to the embodiment described above, main controller 20 performs the focus mapping and the wafer alignment based on the EGA method.

Although the detailed description is omitted, the concurrent processing operations using wafer stages WST1 and WST2 similar to those in the embodiment described previously are performed subsequently by main controller 20.

In the exposure apparatus related to the modified example described so far, although two wafer stages WST1 and WST2 are used, waiting positions UP2 and UP3 do not have to be provided and also the unloading system of the wafer can be structured by a single robot arm. Accordingly, especially, the structure of the unloading system of the wafer can be simplified. Incidentally, in the exposure apparatus related to the modified example, the unloading position and the loading position can be set at the same position, and in this case, it is preferable that the unloading position which also serves as the loading position is set at a position where fiducial mark FM on measurement plate 30 is positioned in the field (detection area) of alignment detection system ALG.

Further, in the embodiment and the modified example described above (hereinafter, referred to as the embodiment described above), a measurement system that measures position information of coarse movement stage WCS equipped in each of wafer stages WST1 and WST2, and/or a measurement system that measures position information of slider section 60 and support section 62 of measurement stage MST, for example, an interferometer system and the like can be provided separately. In this case, a measurement system which measures relative position information between coarse movement stage WCS and fine movement stage WFS, and/or a measurement system which measures relative position information between slider section 60 and support section 62 of measurement stage MST and measurement table MTB can be provided.

Further, while, in the embodiment described above, the position information of wafer stage WST1 or WST2 in the area (the middle area) in between exposure station 200 and measurement station 300 is measured by measurement system SOD (refer to FIG. 6) having a plurality of Hall elements, this is not intended to be limiting, and measurement system 80D can be structured by an interferometer system or an encoder system. Or, separately from measurement system 80D, for example, similar to top side encoder systems 80A and 80B, or the third fine movement stage position measurement system 110C and the like, an encoder system for middle area position measurement can be provided that has a plurality of heads provided outside wafer stage WST1 or WST2 and measures position information of wafer stage WST1 or WST2 by irradiating a measurement beam on each of scales $39_1$ and $39_2$ on wafer table WTB1 or WTB2 via the plurality of heads, when wafer stage WST1 or WST2 is located in the middle area. The plurality of heads of this encoder system are placed so as to cover the movement paths of wafer stages WST1 and WST2 in the middle area described previously. In this case, in order to move wafer stage WST1 or WST2 from the middle area to exposure station 200 or to measurement station 300, main controller 20 can control the drive of wafer stage WST1 or WST2 by coarse movement stage driving system 51A or 51B, based on the position information of wafer stage WST1 or WST2 measured by measurement system 80D and the position information of wafer stage WST1 or WST2 measured by the encoder system for middle area position measurement described above.

Incidentally, while, in the embodiment described above, the case has been described where the first and the second back side encoder systems 70A and 70B are equipped with measurement arms 71A and 71B having arm members $71_1$ and $71_2$, respectively, in each of which only at least a part of the optical system of an encoder head is incorporated, this is not intended to be limiting, and for example, as long as a measurement beam can be irradiated from a section facing grating RG, for example, a light source or a photodetector and the like can be incorporated at the tip of the arm member. In this case, the optical fiber previously described does not have to be arranged inside of the arm member. Furthermore, the arm member can have any outer and sectional shape, or a damping member that suppresses vibration of a specific vibration frequency can be provided at its free end. Further, in the first and the second back side encoder systems 70A and 70B, the inside of arm members $71_1$ and $71_2$ do not necessarily have to be used even in the case when the light source and/or a detector are/is not provided in arm members $71_1$ and $71_2$.

Further, while, in the embodiment described above, the case has been described as an example where the first and the second back side encoder systems 70A and 70B are each equipped with a three-dimensional head, an XZ head and a YZ head, it is a matter of course that the combination and placement of the heads are not limited to this. Further, the first and the second back side encoder systems 70A and 70B can each employ a head section (optical system) that is equipped with a Z head separately from an X head and/or a Y head.

In the embodiment described above, because grating RG is placed on the lower surface (rear surface) of fine movement stage WFS, fine movement stage WFS can be structured hollow to reduce its weight, and piping, wiring and the like can also be placed inside. That is because the measurement beam irradiated from the encoder head does not proceed inside fine movement stage WFS, and therefore fine movement stage WFS does not have to be a solid member through which light can be transmitted. However, this is not intended to be limiting, and in the case when fine movement stage WFS is a solid member through which light can be transmitted, the grating can be placed on the upper surface of the fine movement stage, that is, the surface facing the wafer, or the grating can be formed on the wafer holder which holds the wafer. In the latter case, even if the wafer holder expands during the exposure, or the loading position with respect to the fine movement stage deviates, such situation can be followed, and the position of the wafer holder (wafer) can be measured.

Further, the structures of the first to the third top side encoder systems 80A to 80C in the embodiment described above are not limited to the ones described in the embodiment above. For example, at least a part of the first to the third top side encoder systems 80A to 80C can employ an encoder system which has a structure, as disclosed in, for example, U.S. Patent Application Publication No. 2006/0227309 and the like, in which a plurality of encoder head sections (each encoder head section can be structured, for example, similar to the four-spindle head previously described) are provided on wafer table WTB, and facing these heads, a grating section (for example, a two-dimensional grating or a one-dimensional grating section placed two-dimensionally) can be placed external to wafer table WTB. In this case, the plurality of encoder head sections may be placed at four corners of wafer table WTB, or a pair of encoder head sections may be placed external to wafer table WTB, with wafer table WTB in between, on two diagonal lines intersecting at the center of wafer table WTB (the center of the wafer holder). Further, as the grating section, it is also possible that four grating plates on each of which a two-dimensional grating is formed are attached to one fixed member (such as a plate) and the fixed member is supported in a suspended manner by main frame BD using a support member including a flexure so that the four grating plates are placed in the periphery of projection optical system PL (or nozzle unit 32).

Incidentally, in the embodiment described above, in each of the back side encoder systems, the structure and the like of the head section are not limited to the above-described ones but arbitrary structure and the like may be employed. Further, in each of the top side encoder systems, arbitrary placement and number of the heads may be employed.

Incidentally, it is also possible that the placement (position) of the heads of the third top side encoder system 80C is changed or at least one head is added, thereby allowing position information of measurement stage MST to be measured by the third top side encoder system 80C during the scrum operation described previously.

Incidentally, while, in the embodiment described above, fine movement stage WFS is drivable in all of the directions of six degrees of freedom, this is not intended to be limiting, and fine movement stage WFS only has to be movable in at least within a two-dimensional plane parallel to the XY-plane. Further, fine movement stage driving systems 52A and 52B are not limited to the moving magnet type systems described above, and can also be moving coil type systems. Furthermore, fine movement stage WFS can be supported in contact by coarse movement stage WCS. Accordingly, the fine movement stage driving system which drives fine movement stage WFS with respect to coarse movement stage WCS, for example, can be a combination of a rotary motor and a ball spring (or a feed screw).

Incidentally, in the embodiment described above, all the measurement operations using a plurality of measurement members (sensors) of measurement stage MST need not be performed during replacement from one of wafer stage WST1 and wafer stage WST2 to the other, and for example, some of the plurality of measurements can be preformed during the replacement from wafer stage WST1 to wafer stage WST2 and the remaining measurements can be performed during the replacement from wafer stage WST2 to wafer stage WST1.

Further, in the embodiment described above, measurement stage MST does not necessarily have to have the various types of measurement members (sensors) described previously, and the measurement stage can be used only for maintaining the liquid immersion area under projection optical system PL instead of the wafer stage. In this case, at least a part of the various types of measurement members (sensors) can be provided at the wafer stage.

Further, in the embodiment described above, a device (also called a chuck unit) can be provided that is used to support in a non-contact manner a wafer before exposure above the loading position prior to loading the wafer onto wafer table WTB1 or WTB2, and to load the wafer onto wafer table WTB1 or WTB2. The chuck unit can be equipped with, for example, a Bernoulli chuck (or also called a float chuck), as a support member that supports the wafer from above in a non-contact manner. The chuck unit (Bernoulli chuck) may have, for example, only a carrying function, or in addition to the carrying function, may have at least one of a temperature adjusting function, a prealignment function and a bending correction function (flattening function), and the structure of the chuck unit (Bernoulli chuck) can be determined depending on the types and number of the functions to be added to the chuck unit (Bernoulli chuck), and as the structure to achieve four functions including the carrying function, the chuck unit (Bernoulli chuck) can have any structure as long as each of the functions can be achieved. Incidentally, not limited to the chuck which utilizes the Bernoulli effect like the Bernoulli chuck, a chuck that can support the wafer in a non-contact manner can be used.

Further, while, in the embodiment described above, the case has been described where the exposure apparatus employs the structure where wafer stage WST1 and wafer stage WST2 each equipped with fine movement stage WFS and coarse movement stage WCS that supports fine movement stage WFS are moved back and forth between measurement station 300 and exposure station 200, this is not intended to be limiting, and it is also possible that the structure in which the two fine movement stages can be exchanged between the two coarse movement stages is added and the two fine movement stages are alternately made to move back and forth between measurement station 300 and exposure station 200. Or, three or more fine movement stages can be used. It becomes possible to concurrently perform the exposure processing to a wafer on one of the fine movement stages WFS and the above-described measurement processing using the other of fine movement stages WFS. In this case, it is also possible that one of the two coarse movement stages is movable only in exposure station 200 and the other of the two coarse movement stages is movable only in measurement station 300.

Incidentally, while, in the embodiment described above, the liquid immersion type exposure apparatus is described, the exposure apparatus is not limited to this, and can also be a dry type exposure apparatus which performs exposure of wafer W not via liquid (water). In such a case as well, for example, in the period after exposure of wafer W held by one wafer stage (WST1 or WST2) has been completed and the one wafer, stage moves away from below projection optical system PL until exposure of wafer W held by the other wafer stage (WST2 or WST1) begins, main controller 20 can perform a measurement related to exposure in which illumination light IL via projection optical system PL is received via the light-receiving plane of each measuring device, using the measurement member that measurement table MTB has (that is, at least one of illuminance irregularity sensor 95, aerial image measuring device 96, wavefront aberration measuring device 97, and illuminance monitor 98 previously described), that is, main controller 20 can perform at least one of an uneven illuminance measurement, an aerial image measurement, a wavefront aberration measurement and a dose measurement. This allows the measurement related to exposure to be performed as necessary, without reducing the throughput.

Incidentally, while, in the embodiment described above, the case has been described where the exposure apparatus is a scanning stepper, this is not intended to be limiting, and the embodiment described above can also be applied to a static type exposure apparatus such as a stepper. Further, the embodiment described above can also be applied to a reduction projection exposure apparatus which employs a step-and-stitch method where a shot area and a shot area are synthesized.

Further, the projection optical system in the exposure apparatus of the embodiment described above is not limited to a reduction system and can also be an equal magnifying or a magnifying system, and projection optical system PL is not limited to the refractive system, and can also be a reflection system or a catadioptric system, and the projection image can be either an inverted image or an upright image.

Further, illumination light IL is not limited to the ArF excimer laser beam (wavelength 193 nm), and can also be an ultraviolet light such as a KrF excimer laser beam (wavelength 248 nm), or a vacuum-ultraviolet light such as an $F_2$ laser beam (wavelength 157 nm). For example, as disclosed in U.S. Pat. No. 7,023,610, as the vacuum-ultraviolet light, a harmonic wave can also be used which is a single-wavelength laser beam in the infrared or visible range emitted by a DFB semiconductor laser or a fiber laser that is amplified by a fiber amplifier doped with, for example, erbium (or both erbium and ytterbium), and whose wavelength is converted into a vacuum-ultraviolet light using a nonlinear optical crystal.

Further, in the embodiment described above, it is a matter of course that illumination light IL of the exposure apparatus is not limited to light having a wavelength of 100 nm or over, and light having a wavelength less than 100 nm can also be used. For example, the embodiment described above can be applied to an EUV (Extreme Ultraviolet) exposure apparatus that uses an EUV light in a soft X-ray range (for example, a wavelength range of 5 to 15 nm). In addition, the embodiment descried above can also be applied to an exposure apparatus that uses charged particle beams such as an electron beam or an ion beam.

Further, while, in the embodiment described above, a light transmissive type mask (reticle) in which a predetermined light-shielding pattern (or a phase pattern or a light-attenuation pattern) is formed on a light-transmitting substrate is used, instead of this reticle, as disclosed in, for example, U.S. Pat. No. 6,778,257, an electron mask (which is also called a variable shaped mask, an active mask or an image generator, and includes, for example, a DMD (Digital Micro-mirror Device) that is a type of a non-emission type image display element (spatial light modulator) or the like) where a light-transmitting pattern, a reflection pattern, or an emission pattern is formed according to electronic data of the pattern that is to be exposed can also be used. In the case of using such a variable shaped mask, because the stage where the wafer or the glass plate and the like is mounted is scanned with respect to the variable shaped mask, by measuring the position of this stage using the first and the second fine movement stage position measurement systems 110A and 110B previously described, an effect equal to the embodiment described above can be obtained.

Further, as disclosed in, for example, PCT International Publication No. 2001/035168, the embodiment described above can also be applied to an exposure apparatus (lithography system) which forms a line-and-space pattern on wafer W by forming an interference fringe on wafer W.

Furthermore, as disclosed in, for example, U.S. Pat. No. 6,611,316, the embodiment described above can also be applied to an exposure apparatus that synthesizes two reticle patterns on a wafer via a projection optical system, and by performing scanning exposure once, performs double exposure of one shot area on the wafer almost simultaneously.

Incidentally, in the embodiment described above, the object where the pattern is to be formed (the object subject to exposure on which an energy beam is irradiated) is not limited to a wafer, and may be another object such as a glass plate, a ceramic substrate, a film member, or a mask blank and the like.

The usage of the exposure apparatus is not limited to the exposure apparatus used for producing semiconductor devices, and for example, the exposure apparatus can also be widely applied to an exposure apparatus for liquid crystal displays used to transfer a liquid crystal display device pattern on a square shaped glass plate, or an exposure apparatus used to manufacture an organic EL, a thin film magnetic head, an imaging device (such as a CCD), a micromachine, a DNA chip and the like. Further, the embodiment described above can also be applied not only to an exposure apparatus for producing microdevices such as semiconductor devices, but also to an exposure apparatus which transfers a circuit pattern on a glass substrate or a silicon wafer, in order to manufacture a reticle or a mask used in a light exposure apparatus, an EUV exposure apparatus, an X-ray exposure apparatus, and an electron beam exposure apparatus and the like.

Electronic devices such as semiconductor devices are manufactured through the following steps; a step where the function/performance design of the device is performed, a step where a reticle based on the design step is manufactured, a step where a wafer is manufactured from silicon materials, a lithography step where the pattern of a mask (reticle) is transferred onto the wafer by the exposure apparatus (pattern formation apparatus) related to the embodiment previously described and an exposure method corresponding thereto, a development step where the wafer that has been exposed is developed, an etching step where an exposed member of an area other than the area where the resist remains is removed by etching, a resist removing step where the resist that is no longer necessary when etching has been completed is removed, a device assembly step (including a dicing process, a bonding process, and a package process), an inspection step and the like. In this case, in the lithography step, because the device pattern is formed on the wafer by executing the exposure method previously described using the exposure apparatus in the embodiment described above, a highly integrated device can be produced with good productivity.

Further, the exposure apparatus (pattern forming apparatus) in the embodiment described above is manufactured by assembling various subsystems, which include the respective constituents that are recited in the claims of the present application, so as to keep predetermined mechanical accuracy, electrical accuracy and optical accuracy. In order to secure these various kinds of accuracy, before and after the assembly, adjustment to achieve the optical accuracy for various optical systems, adjustment to achieve the mechanical accuracy for various mechanical systems, and adjustment to achieve the electrical accuracy for various electric systems are performed. A process of assembling various subsystems into the exposure apparatus includes mechanical connection, wiring connection of electric circuits, piping connection of pressure circuits, and the like among various types of subsystems. Needless to say, an assembly process of individual subsystem is performed before the process of assembling the various subsystems into the exposure apparatus. When the process of assembling the various subsystems into the exposure apparatus is completed, a total adjustment is performed and various kinds of accuracy as the entire exposure apparatus are secured. Incidentally, the making of the exposure apparatus is preferably performed in a clean room where the temperature, the degree of cleanliness and the like are controlled.

Incidentally, the disclosures of all the publications, the PCT International Publications, the U.S. Patent Application Publications and the U.S. patents that are cited in the description so far related to exposure apparatuses and the like are each incorporated herein by reference.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. An exposure apparatus that exposes an object by an energy beam via an optical system, the apparatus comprising:
   a first moving member and a second moving member that each hold the object and are movable independently from each other in an area within a predetermined plane, and each have a first grating provided at a position under a surface where the object is mounted, the area including an exposure station where exposure of the object by the energy beam is performed and a measurement station which is placed away from the exposure station in a first direction parallel to the predetermined plane and where a predetermined measurement on the object is performed;
   a first measurement system that is provided at the exposure station, has a first measurement member with the first direction serving as a longitudinal direction, and by irradiating from below a first measurement beam from the first measurement member onto the first grating of a moving member located at the exposure station, of the first and the second moving members, obtains first position information of the moving member located at the exposure station;
   a second measurement system that is provided at the measurement station, has a second measurement member with the first direction serving as a longitudinal direction, and by irradiating from below a second measurement beam from the second measurement member onto the first grating of a moving member located at the measurement station, of the first and the second moving members, obtains second position information of the moving member located at the measurement station;
   a third moving member that is movable independently from the first and the second moving members within the predetermined plane and includes a light-receiving plane that receives the energy beam via the optical system, and that is provided with an optical member, the optical member being at least a part of a measurement device that performs a measurement related to exposure based on a light-receiving result of the energy beam received via the light-receiving plane;
   a drive system that individually drives the first, the second and the third moving members; and
   a position measurement system that obtains positional information of at least one moving member of the first and the second moving members in order to use the positional information in reset of at least one of the first measurement system and the second measurement system, the position measurement system being different from the first and the second measurement systems,
   wherein the third moving member has a shape that is engageable with the first measurement member from a direction intersecting the first direction.

2. The exposure apparatus according to claim 1, wherein the third moving member has at least a portion capable of facing the first measurement member and has a two-dimensional grating provided at the facing portion.

3. The exposure apparatus according to claim 1, further comprising:
   a liquid immersion device that supplies a liquid to directly under the optical system, wherein
   the third moving member receives or delivers the liquid supplied to directly under the optical system by the liquid immersion device from/to the first or the second moving member located at a position directly under the optical system or near the position.

4. The exposure apparatus according to claim 1, further comprising:
   a controller that drives the first moving member and the second moving member via the drive system so that one of the first and the second moving members that holds the object that has been exposed and the other of the first and the second moving members that holds the object on which the predetermined measurement has been completed are replaced in position in the first direction, in a state where the third moving member is located under the optical system.

5. The exposure apparatus according to claim 4, wherein the first moving member structures a part of a first movable body that has a space inside and moves in the predetermined plane, and the second moving member structures a part of a second movable body that has a space inside and moves in the predetermined plane.

6. The exposure apparatus according to claim 5, wherein the first movable body includes a first movable member having a space inside and movable at least in the predetermined plane, and the first moving member supported relatively movable by the first movable member, and the second movable body includes a second movable member having a space inside and movable at least in the predetermined plane, and the second moving member supported relatively movable by the second movable member.

7. The exposure apparatus according to claim 4, wherein the first measurement member has a first measurement arm, in a cantilevered supported state, that is inserted into the space from one side of the first direction, irradiates the first grating with the first measurement beam from below and receives a light of the first measurement beam from the first grating, and the second measurement member has a second measurement arm, in a cantilevered supported state, that is inserted into the space from the other side of the first direction, irradiates the first grating with the second measurement beam from below and receives a light of the second measurement beam from the first grating.

8. The exposure apparatus according to claim 7, wherein the third moving member is engageable with the first measurement member in a state that the first measurement member is inserted into the space of the one of first movable member and the second movable member.

9. The exposure apparatus according to claim 4, wherein the controller concurrently drives the first moving member and the second moving member along respective movement paths including paths in directions parallel to the first direction and reverse to each other so that the positions of the first moving member and the second moving members are replaced in the first direction.

10. The exposure apparatus according to claim 9, wherein the movement paths of the first and the second moving members further include paths in which the first and the second moving members are driven in reverse directions to each other in a second direction orthogonal to the first direction within the predetermined plane.

11. The exposure apparatus according to claim 9, further comprising:
a third measurement system that obtains third position information of the first and the second moving members located in a middle area in between the exposure station and the measurement station, wherein
the controller drives the first and the second moving members along the movement paths based on the third position information obtained by the third measurement system.

12. The exposure apparatus according to claim 4, wherein the position measurement system includes a first coordinate return measurement system that is provided for origin return of the first measurement system and measures an absolute coordinate of at least one moving member of the first and second moving members that has moved from the measurement station side to the exposure station side.

13. The exposure apparatus according to claim 4, wherein an unloading position used to unload the object from the first and the second moving members that holds the object that has been exposed is set on the movement paths of the first and the second moving members after the replacement in position in the first direction.

14. The exposure apparatus according to claim 4, further comprising:
a fourth measurement system that, when one moving member of the first moving member and the second moving member moves in the exposure station, obtains fourth position information of the one moving member concurrently with measurement of the first position information by the first measurement system, wherein
the controller drives the one moving member in the exposure station based on position information having higher reliability out of the first position information and the fourth position information.

15. The exposure apparatus according to claim 4, further comprising:
a mark detection system placed at the measurement station, that detects a mark on the moving member or on the object loaded on the moving member.

16. The exposure apparatus according to claim 15, wherein
the position measurement system includes a second coordinate return measurement system that is provided for origin return of the second measurement system and measures an absolute coordinate of the moving member that has moved from the exposure station side to the measurement station side.

17. A device manufacturing method, comprising:
exposing an object using the exposure apparatus according to claim 1; and
developing the object that has been exposed.

18. An exposure apparatus that exposes a substrate via an optical system, the apparatus comprising:
a first stage and a second stage, each of which has a holding member that has a mounting area of the substrate provided on an upper surface side and a first grating member provided on a lower surface side, and a main section that supports the holding member so that a space is formed under the first grating member;
a third stage different from the first and the second stages, that is placed at an exposure station where exposure of the substrate is performed;
a detection system placed at a measurement station different from the exposure station, that obtains position information of the substrate by irradiating the substrate with a detection beam;
a drive system that moves the first, the second and the third stages, and also moves each of the first and the second stages from one of the exposure station and the measurement station to the other;
a first measurement system that has a first head section provided at the exposure station and a second head section provided at the measurement station, and that irradiates the first grating member with a first measurement beam from below via the first head section that is placed in the space by one of the first and the second stages placed at the exposure station being positioned facing the optical system and obtains position information of the one of the stages, and also irradiates the first grating member with a first measurement beam from below via the second head section that is placed in the space by the other of the first and the second stages placed at the measurement station being positioned facing the detection system and obtains position information of the other of the stages;

a controller that controls driving of the first and the second stages by the drive system, based on the position information obtained by the first measurement system, in order to move each of the first and the second stages in the exposure station and in the measurement station; and a position measurement system that obtains positional information of at least one stage of the first and the second stages for reset of the first measurement system, the position measurement system being different from the detection system and the first measurement system, wherein the controller performs the reset and causes each of the first and the second stages to move from one of the exposure station and the measurement station to the other using the drive system so that instead of one of the first and the second head sections placed in the space, the other of the first and the second head sections is placed in the space, and the position measurement system obtains the positional information of one stage of the first and the second stages that has moved either (i) from the measurement station to the exposure station, or (ii) from the exposure station to the measurement station.

19. An exposure method of exposing a substrate via an optical system, the method comprising:

positioning one of a first stage and a second stage to face the optical system in an exposure station, each of the first stage and the second stage having a holding member that has a mounting area of the substrate provided on an upper surface side and a first grating member provided on a lower surface side, and a main section that supports the holding member so that a space is formed under the first grating member, and in the exposure station a third stage different from the first and the second stages being placed and exposure of the substrate being performed via the optical system;

obtaining position information of the one of the stages by a first measurement system that irradiates the first grating member with a first measurement beam from below via a first head section placed in the space of the one of the stages positioned facing the optical system, in order to move the one of the stages in the exposure station;

obtaining position information of the other of the stages by the first measurement system that irradiates the first grating member with a first measurement beam from below via a second head section placed in the space of the other of the stages positioned facing a detection system that obtains position information of the substrate by irradiating the substrate with a detection beam, in order to move the other of the stages in a measurement station which is different from the exposure station and where the detection system is placed;

moving the other of the stages to cause the first head section to proceed inside the space, following movement of the one of the stages to withdraw the first head section from inside the space, so that instead of the one of the stages, the other of the stages that is moved from the measurement station to the exposure station is positioned facing the optical system; and after at least one stage of the first and the second stages has moved from the measurement station to the exposure station, obtaining positional information of the at least one stage with a position measurement system, and using the positional information in reset of the first measurement system, the position measurement system being different from the first measurement system and the detection system, wherein the position measurement system obtains the positional information of one stage of the first and the second stages that has moved either (i) from the measurement station to the exposure station, or (ii) from the exposure station to the measurement station.

20. A manufacturing method of an exposure apparatus that exposes a substrate via an optical system, the method comprising:

providing a first stage and a second stage, each of which has a holding member that has a mounting area of the substrate provided on an upper surface side and a first grating member provided on a lower surface side, and a main section that supports the holding member so that a space is formed under the first grating member;

providing a third stage different from the first and the second stages, that is placed at an exposure station where exposure of the substrate is performed;

providing a detection system placed at a measurement station different from the exposure station, that obtains position information of the substrate by irradiating the substrate with a detection beam;

providing a drive system that moves the first, the second and the third stages, and also moves each of the first and the second stages from one of the exposure station and the measurement station to the other;

providing a first measurement system that has a first head section provided at the exposure station and a second head section provided at the measurement station, and that irradiates the first grating member with a first measurement beam from below via the first head section that is placed in the space by one of the first and the second stages placed at the exposure station being positioned facing the optical system and obtains position information of the one of the stages, and also irradiates the first grating member with a first measurement beam from below via the second head section that is placed in the space by the other of the first and the second stages placed at the measurement station being positioned facing the detection system and obtains position information of the other of the stages;

providing a controller that controls driving of the first and the second stages by the drive system based on the position information obtained by the first measurement system, in order to move each of the first and the second stages in the exposure station and in the measurement station, the controller causing each of the first and the second stages to move from one of the exposure station and the measurement station to the other using the drive system so that instead of one of the first and the second head sections placed in the space, the other of the first and the second head sections is placed in the space; and providing a position measurement system that obtains positional information of at least one stage of the first and the second stages for reset of the first measurement system, the position measurement system being different from the detection system and the first measurement system, wherein the position measurement system obtains the positional information of one stage of the first and the second stages that has moved either (i) from the measurement station to the exposure station, or (ii) from the exposure station to the measurement station.

\* \* \* \* \*